(12) United States Patent
Kawahara

(10) Patent No.: US 12,356,739 B2
(45) Date of Patent: Jul. 8, 2025

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Yuki Kawahara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/381,019

(22) Filed: Oct. 17, 2023

(65) Prior Publication Data
US 2024/0047486 A1 Feb. 8, 2024

Related U.S. Application Data

(63) Continuation of application No. 17/438,864, filed as application No. PCT/JP2020/011455 on Mar. 16, 2020, now Pat. No. 11,855,105.

(30) Foreign Application Priority Data

Mar. 29, 2019 (JP) .................................. 2019-067588

(51) Int. Cl.
| | |
|---|---|
| H10F 39/00 | (2025.01) |
| H04N 25/77 | (2023.01) |

(Continued)

(52) U.S. Cl.
CPC .......... *H10F 39/802* (2025.01); *H04N 25/77* (2023.01); *H04N 25/78* (2023.01); *H10F 39/024* (2025.01);

(Continued)

(58) Field of Classification Search
CPC ........... H01L 27/14603; H01L 27/1461; H01L 27/14623; H01L 27/14685; H01L 27/1463;

(Continued)

(56) References Cited

U.S. PATENT DOCUMENTS

| | | |
|---|---|---|
| 10,204,950 B1 | 2/2019 | Yamashita |
| 2011/0241148 A1 | 10/2011 | Hiyama et al. |

(Continued)

FOREIGN PATENT DOCUMENTS

| | | |
|---|---|---|
| CN | 104821324 | 8/2015 |
| JP | 2012-178457 | 9/2012 |

(Continued)

OTHER PUBLICATIONS

International Search Report and Written Opinion for International (PCT) Patent Application No. PCT/JP2020/011455, dated Apr. 28, 2020, 7 pages.

(Continued)

*Primary Examiner* — Padma Haliyur
(74) *Attorney, Agent, or Firm* — Sheridan Ross PC

(57) ABSTRACT

To stably generate avalanche amplification while suppressing a reduction in resolution. A solid-state imaging device according to an embodiment includes a photoelectric conversion region in an element region defined by a trench in a semiconductor substrate, a first semiconductor region surrounding the photoelectric conversion region, a first contact that contacts the first semiconductor region at a bottom of the trench, a second semiconductor region contacting the first semiconductor region and having a first conductivity type the same as the first semiconductor region, a third semiconductor region that contacts the second semiconductor region, between the second semiconductor region and a first surface, and having a second conductivity type, and a (Continued)

second contact on the first surface and contacting the third semiconductor region, wherein a height of the first contact from the first surface is different from a height of the third semiconductor region from the first surface.

20 Claims, 33 Drawing Sheets

(51) Int. Cl.
H04N 25/78 (2023.01)
H10F 30/225 (2025.01)
H10F 39/12 (2025.01)
(52) U.S. Cl.
CPC ..... *H10F 39/8033* (2025.01); *H10F 39/8057* (2025.01); *H10F 30/225* (2025.01); *H10F 39/199* (2025.01); *H10F 39/807* (2025.01); *H10F 39/809* (2025.01)
(58) Field of Classification Search
CPC ........... H01L 27/14634; H01L 27/1464; H01L 31/107; H01L 27/14636; H01L 27/14638; H01L 31/03529; H01L 27/14627; H01L 27/14645; H01L 27/14689; H01L 27/14612; H04N 25/75; H04N 25/77; H04N 25/134; H04N 25/76; H04N 25/79; H04N 25/773; H04N 25/78; Y02E 10/50
See application file for complete search history.

(56) References Cited

U.S. PATENT DOCUMENTS

| | | |
|---|---|---|
| 2012/0217602 A1 | 8/2012 | Enomoto |
| 2015/0228684 A1 | 8/2015 | Yamashita |
| 2016/0035929 A1 | 2/2016 | Teva |
| 2017/0062501 A1 | 3/2017 | Velichko et al. |
| 2018/0090526 A1 | 3/2018 | Mandai et al. |
| 2019/0006399 A1 | 1/2019 | Otake et al. |
| 2019/0019820 A1 | 1/2019 | Takizawa et al. |
| 2019/0043901 A1 | 2/2019 | Honda et al. |
| 2019/0096933 A1* | 3/2019 | Kido ................. H01L 27/14641 |
| 2019/0157323 A1 | 5/2019 | Ogi et al. |
| 2019/0157325 A1* | 5/2019 | Shinohara ......... H01L 27/14643 |
| 2019/0174033 A1* | 6/2019 | Masuda ................. H04N 25/76 |
| 2019/0181177 A1 | 6/2019 | Kobayashi et al. |
| 2019/0252425 A1* | 8/2019 | Ogawa ............. H01L 27/14603 |
| 2019/0252442 A1 | 8/2019 | Tanaka et al. |
| 2019/0297282 A1 | 9/2019 | Tsutsui |
| 2020/0185448 A1 | 6/2020 | Lee et al. |
| 2021/0335874 A1* | 10/2021 | Hatano ............. H01L 27/14621 |
| 2022/0157867 A1 | 5/2022 | Kawahara |

FOREIGN PATENT DOCUMENTS

| | | | |
|---|---|---|---|
| JP | 2015-041746 | 3/2015 | |
| JP | 2018-088488 | 6/2018 | |
| JP | 2018-201005 | 12/2018 | |
| JP | 2018-206837 | 12/2018 | |
| JP | 2019-033136 | 2/2019 | |
| WO | WO-2017169754 A1 * | 10/2017 | ....... H01L 27/14605 |
| WO | WO 2017/187957 | 11/2017 | |
| WO | WO 2018/174090 | 9/2018 | |
| WO | WO 2018/212175 | 11/2018 | |

OTHER PUBLICATIONS

Notice of Allowance for U.S. Appl. No. 17/438,864, dated Aug. 17, 2023, 11 pages.

* cited by examiner

SOLID-STATE IMAGING DEVICE AND ELECTRONIC DEVICE

CROSS REFERENCE TO RELATED APPLICATIONS

This application is a continuation of U.S. patent application Ser. No. 17/438,864, filed Sep. 13, 2021, which is a national stage application under 35 U.S.C. 371 and claims the benefit of PCT Application No. PCT/JP2020/011455, having an international filing date of Mar. 16, 2020, which designated the United States, which PCT application claimed the benefit of Japanese Patent Application No. 2019-067588, filed Mar. 29, 2019, the entire disclosures of each of which are incorporated herein by reference.

FIELD

The present disclosure relates to a solid-state imaging device and an electronic device.

BACKGROUND

In recent years, a single photon avalanche diode (SPAD) has been developed that amplifies a charge generated by photoelectric conversion by avalanche multiplication (also referred to as avalanche amplification) and outputs the amplified charge as an electric signal. The avalanche amplification is a phenomenon in which electrons accelerated by an electric field collide with lattice atoms in an impurity diffusion region of a PN junction to cut bonds of the lattice atoms, and newly generated electrons further collide with other lattice atoms to cut bonds thereof, multiplying a current by repeating the above.

Such a SPAD is applicable to a distance measuring device that measures a distance to an object on the basis of a time required to return light emitted from a light emitting unit and reflected by the object, a solid-state imaging device that converts a light amount of incident light into an electric signal, or the like.

In order to discharge a large current generated by the avalanche amplification from a SPAD pixel, it is desirable to form a contact that is a low resistance ohmic contact. For a method of forming the contact that is the low resistance ohmic contact in the impurity diffusion region formed in a semiconductor substrate, it is generally known to form a high-concentration impurity region in a contact region.

CITATION LIST

Patent Literature

Patent Literature 1: JP 2015-41746 A

SUMMARY

Technical Problem

Here, it is necessary to apply a high voltage to the PN junction in the reverse-bias direction to obtain a field strength large enough to generate the avalanche amplification, but a small distance from the PN junction region to the contact causes a strong electric field between the PN junction region and the contact, generating a tunneling effect. There is a problem that the generation of such a tunneling effect immediately generates recombined pairs of electrons and holes generated by the photoelectric conversion due to the tunneling current, and thus, the avalanche amplification cannot be generated.

Furthermore, in order to avoid the occurrence of the tunneling effect, a method of increasing a distance between two contacts is conceivable, but the method causes a problem of increase in pixel size and decrease in resolution.

Therefore, the present disclosure proposes a solid-state imaging device and an electronic device that are configured to stably generate the avalanche amplification while suppressing the decrease in resolution.

Solution to Problem

To solve the above-described problem, a solid-state imaging device according to one aspect of the present disclosure comprises: a first semiconductor substrate that includes a grid-shaped first trench provided in a first surface, and a second trench provided along a bottom of the first trench; and a plurality of photoelectric conversion elements that is provided in the first semiconductor substrate, wherein each of the photoelectric conversion elements includes: a photoelectric conversion region that is provided in an element region defined by the first trench and the second trench in the first semiconductor substrate, and is configured to photoelectrically convert incident light to generate charges; a first semiconductor region that surrounds the photoelectric conversion region in the element region; a first contact that makes contact with the first semiconductor region at the bottom of the first trench; a first electrode that makes contact with the first contact in the first trench; a second semiconductor region that is provided in a region of the element region making contact with the first semiconductor region, and has a first conductivity type same as the first semiconductor region; a third semiconductor region that is a region making contact with the second semiconductor region in the element region, is provided between the second semiconductor region and the first surface, and has a second conductivity type opposite to that of the first conductivity type; a second contact that is provided on the first surface so as to make contact with the third semiconductor region; and a second electrode that makes contact with the second contact, and a height of the first contact from the first surface is different from a height of the third semiconductor region from the first surface.

DESCRIPTION OF EMBODIMENTS

Figure 1:
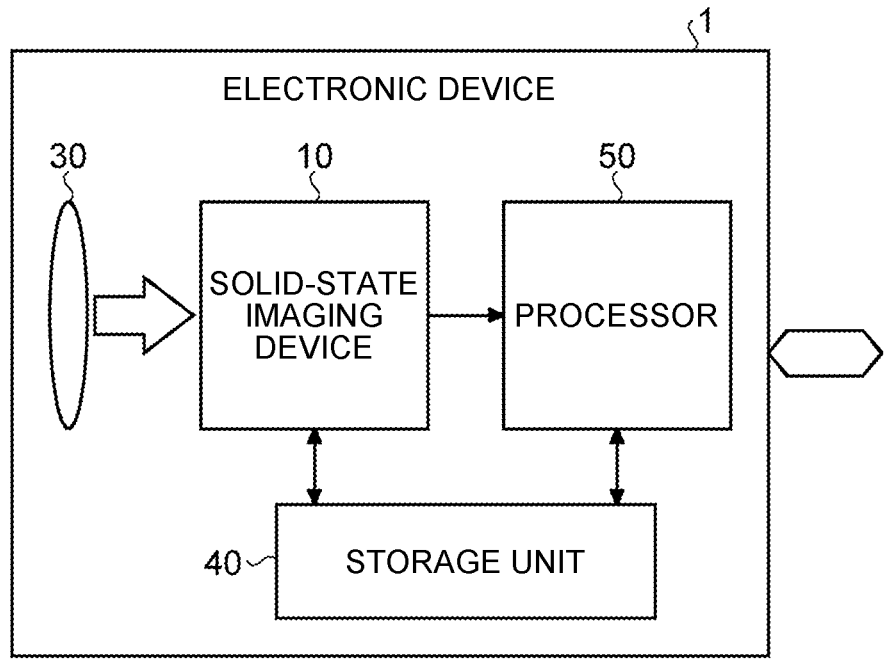
FIG. 1 is a block diagram illustrating an example of a schematic configuration of an electronic device loaded with a solid-state imaging device according to a first embodiment.

Embodiments of the present disclosure will be described below in detail with reference to the drawings. Note that in the following embodiments, the same portions are denoted by the same reference symbols, and a repetitive description thereof will be omitted.

Furthermore, the present disclosure will be described according to the following items.

1. First Embodiment
1.1 Electronic device
1.2 Solid-state imaging device
1.3 SPAD pixel
1.4 Example of schematic operation of SPAD pixel
1.5 Layout example of color filters
1.6 Example of stacked structure of solid-state imaging device
1.7 Example of cross-sectional structure of SPAD pixel 1.8 Positional relationship between anode contact and cathode contact and/or N+type semiconductor region
1.9 Manufacturing method
1.10 Functions and effects
1.11 Modifications
1.11.1 First modification
1.11.2 Second modification
1.11.3 Third modification
1.11.4 Fourth modification
1.11.5 Fifth modification
2. Second Embodiment
3. Third Embodiment
4. Fourth Embodiment
5. Fifth Embodiment
6. Sixth Embodiment
7. Seventh Embodiment
8. Eighth Embodiment
9. Example of application to electronic device
10. Example of application to mobile object
11. Example of application to endoscopic surgical system

1. First Embodiment

First, a solid-state imaging device and an electronic device according to a first embodiment will be described in detail with reference to the drawings.

1.1 Electronic Device

FIG. 1 is a block diagram illustrating an example of a schematic configuration of the electronic device loaded with the solid-state imaging device according to the first embodiment. As illustrated in FIG. 1, an electronic device 1 includes, for example, an imaging lens 30, a solid-state imaging device 10, a storage unit 40, and a processor 50.

The imaging lens 30 is an example of an optical system that focuses incident light to form an image on a light-receiving surface of the solid-state imaging device 10. The light-receiving surface may be a surface on which photoelectric conversion elements are arranged in the solid-state imaging device 10. The solid-state imaging device 10 photoelectrically converts the incident light to generate image data. Furthermore, the solid-state imaging device 10 performs predetermined signal processing such as noise removal or white balance adjustment on the generated image data.

The storage unit 40 includes, for example, a flash memory, a dynamic random access memory (DRAM), a static random access memory (SRAM), or the like and records the image data or the like input from the solid-state imaging device 10.

The processor 50 is configured using, for example, a central processing unit (CPU) or the like, and may include an application processor configured to execute an operating system, various application software, or the like, a graphics processing unit (GPU), a baseband processor, or the like. The processor 50 executes various processing as necessary on the image data input from the solid-state imaging device 10 or the image data and the like read from the storage unit 40, displays the image data to the user, or transmits the image data to the outside via a predetermined network.

1.2 Solid-State Imaging Device

Figure 2:
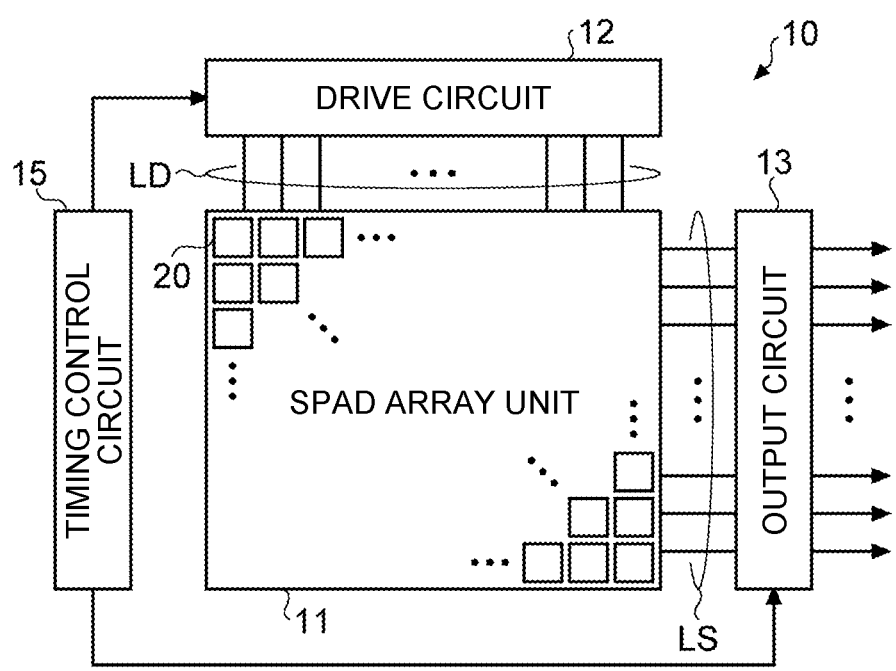
FIG. 2 is a block diagram illustrating an example of a schematic configuration of an image sensor according to the first embodiment.

FIG. 2 is a block diagram illustrating an example of a schematic configuration of the solid-state imaging device (hereinafter, simply referred to as an image sensor) of complementary metal-oxide-semiconductor (CMOS) type according to the first embodiment. Here, the image sensor of CMOS type is an image sensor made by applying or partially using a CMOS process. Note that, in the present embodiment, the image sensor 10 of so-called back-illuminated type that has a light incident surface being a surface on a side opposite to an element formation surface of a semiconductor substrate is exemplified, but the present embodiment is not limited to the back-illuminated type, and a so-called front-illuminated type that has the element formation surface as the light incident surface may be adopted.

As illustrated in FIG. 2, the image sensor 10 includes a SPAD array unit 11, a timing control circuit 15, a drive circuit 12, and an output circuit 13.

The SPAD array unit 11 includes a plurality of SPAD pixels 20 arranged in a matrix. To the plurality of SPAD pixels 20, a pixel drive line LD (vertical direction in the drawing) is connected in each column, and an output signal line LS (horizontal direction in the drawing) is connected in each row. One end of the pixel drive line LD is connected to an output end of the drive circuit 12 corresponding to each column, and one end of the output signal line LS is connected to an input end of the output circuit 13 corresponding to each row.

The drive circuit 12 includes a shift register, an address decoder, or the like, and drives all of the SPAD pixels 20 of the SPAD array unit 11 simultaneously or the SPAD pixels 20 in columns or the like. Therefore, the drive circuit 12 includes at least a circuit configured to apply a quenching voltage V_QCH which is described later to each SPAD pixel 20 in a selected column in the SPAD array unit 11 and a circuit configured to apply a selection control voltage V_SEL which is described later to each SPAD pixel 20 in the selected column. Then, the drive circuit 12 applies the selection control voltage V_SEL to the pixel drive line LD corresponding to a column to be read, and the SPAD pixels 20 used to detect incidence of photons are selected in columns.

A signal (referred to as a detection signal) V_OUT output from each SPAD pixel 20 in a column selectively scanned by the drive circuit 12 is input to the output circuit 13 through each of the output signal lines LS. The output circuit 13 outputs as a pixel signal the detection signal V_OUT input from each SPAD pixel 20 to the storage unit 40 or processor 50 on the outside.

The timing control circuit 15 includes a timing generator or the like configured to generate various timing signals, and controls the drive circuit 12 and the output circuit 13 on the basis of the various timing signals generated by the timing generator.

1.3 SPAD Pixel

Figure 3:
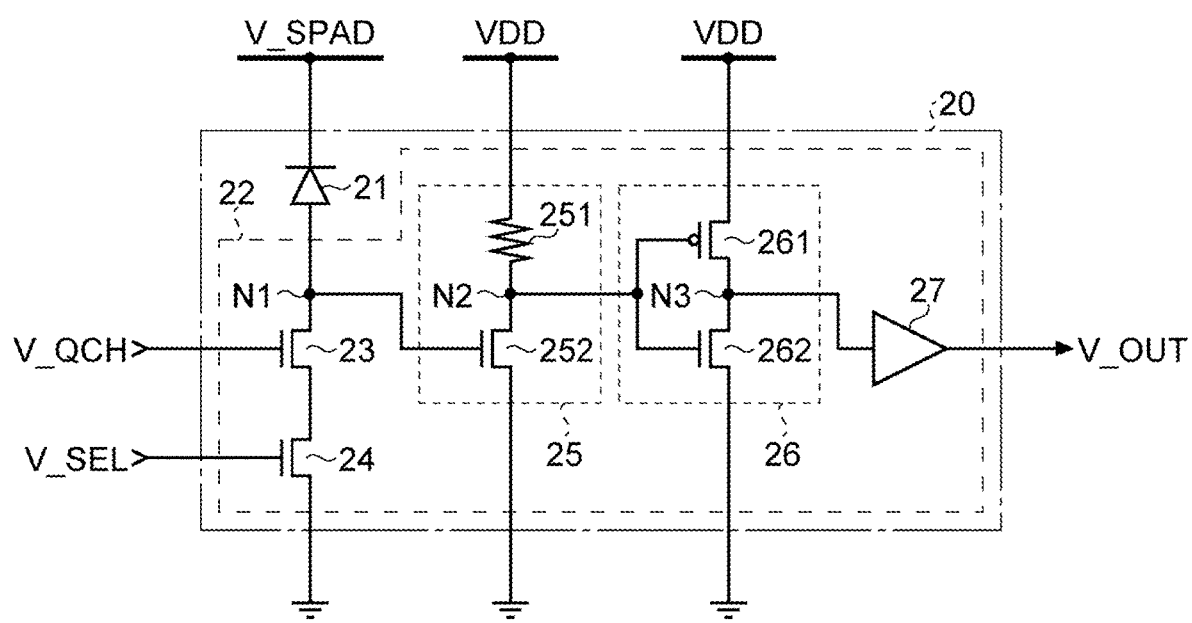
FIG. 3 is a circuit diagram illustrating an example of a schematic configuration of a SPAD pixel according to the first embodiment.

FIG. 3 is a circuit diagram illustrating an example of a schematic configuration of the SPAD pixel according to the first embodiment. As illustrated in FIG. 3, the SPAD pixel 20 includes a photodiode 21 as a light receiving element and a readout circuit 22 configured to detect incidence of a photon on the photodiode 21. In the photodiode 21, incidence of the photon during application of a reverse bias voltage V_SPAD equal to or larger than a breakdown voltage between an anode and a cathode of the photodiode 21 generates an avalanche current.

The readout circuit 22 includes a quenching resistor 23, a digital converter 25, an inverter 26, a buffer 27, and a select transistor 24. The quenching resistor 23 includes, for example, an N–type metal oxide semiconductor field effect transistor (MOSFET, hereinafter referred to as an NMOS transistor), and the NMOS transistor has a drain that is connected to the anode of the photodiode 21, and a source that is grounded via the select transistor 24. In addition, the NMOS transistor constituting the quenching resistor 23 has a gate to which the quenching voltage V_QCH set in advance for causing the NMOS transistor to act as quenching resistance is applied from the drive circuit 12 via the pixel drive line LD.

In the present embodiment, the photodiode 21 employs a SPAD. The SPAD is an avalanche photodiode that operates in Geiger mode when reverse bias voltage equal to or larger than the breakdown voltage is applied between an anode and a cathode of the SPAD, and is thereby operable to detect incidence of a single photon.

The digital converter 25 includes a resistor 251 and an NMOS transistor 252. The NMOS transistor 252 has a drain that is connected to power supply voltage VDD via the resistor 251, and a source that is grounded. In addition, the NMOS transistor 252 has a gate to which the voltage of a connection point N1 between the anode of the photodiode 21 and the quenching resistor 23 is applied.

The inverter 26 includes a P-type MOSFET (hereinafter, referred to as a PMOS transistor) 261 and an NMOS transistor 262. The PMOS transistor 261 has a drain that is connected to power supply voltage VDD, and a source that is connected to a drain of the NMOS transistor 262. The drain of the NMOS transistor 262 is connected to the source of the PMOS transistor 261, and a source thereof is grounded. The voltage of a connection point N2 between the resistor 251 and the drain of the NMOS transistor 252 is applied to a gate of the PMOS transistor 261 and a gate of the NMOS transistor 262. Output of the inverter 26 is input to the buffer 27.

The buffer 27 is a circuit for impedance conversion, and impedance-converts an output signal input from the inverter 26, and outputs the converted signal as the detection signal V_OUT.

The select transistor 24 is, for example, an NMOS transistor, and has a drain that is connected to the source of the NMOS transistor constituting the quenching resistor 23, and a source that is grounded. The select transistor 24 is connected to the drive circuit 12, and changes from an off state to an on state when the selection control voltage V_SEL from the drive circuit 12 is applied to a gate of the select transistor 24 via the pixel drive line LD.

1.4 Example of Schematic Operation of SPAD Pixel

The readout circuit 22 illustrated in FIG. 3 operates, for example, as follows. In other words, first, during a period in which the selection control voltage V_SEL is applied from the drive circuit 12 to the select transistor 24 and the select transistor 24 is in the on state, the reverse bias voltage V_SPAD equal to or larger than the breakdown voltage is applied to the photodiode 21. This permits the operation of the photodiode 21.

Meanwhile, during a period in which the selection control voltage V_SEL is not applied from the drive circuit 12 to the select transistor 24 and the select transistor 24 is in the off state, the reverse bias voltage V_SPAD is not applied to the photodiode 21, and thus, the operation of the photodiode 21 is prohibited.

When the photon is incident on the photodiode 21 while the select transistor 24 is in the on state, the avalanche current is generated in the photodiode 21. Therefore, the avalanche current flows through the quenching resistor 23, and the voltage at the connection point N1 increases. When the voltage at the connection point N1 becomes larger than the on-voltage of the NMOS transistor 252, the NMOS transistor 252 is brought into an on state, and the voltage at the connection point N2 changes from the power supply voltage VDD to 0 V. When the voltage at the connection point N2 changes from the power supply voltage VDD to 0 V, the PMOS transistor 261 changes from an off state to an on state, the NMOS transistor 262 changes from an on state to an off state, and the voltage at a connection point N3 changes from 0 V to the power supply voltage VDD. Therefore, the high-level detection signal V_OUT is output from the buffer 27.

Thereafter, when the voltage at the connection point N1 continues to increase, the voltage applied between the anode and the cathode of the photodiode 21 becomes smaller than the breakdown voltage, whereby the avalanche current stops and the voltage at the connection point N1 decreases. Then, when the voltage at the connection point N1 becomes smaller than the on-voltage of an NMOS transistor 452, the NMOS transistor 452 is brought into an off state, and the output of the detection signal V_OUT from the buffer 27 is stopped (low level).

As described above, the readout circuit 22 outputs the detection signal V_OUT at high level during a period from the timing at which the photon is incident on the photodiode 21 to generate the avalanche current and the NMOS transistor 452 is brought into the on state, to the timing at which the avalanche current stops and the NMOS transistor 452 is brought into the off state. The output detection signal V_OUT is input to the output circuit 13.

1.5 Layout Example of Color Filters

Figure 4:
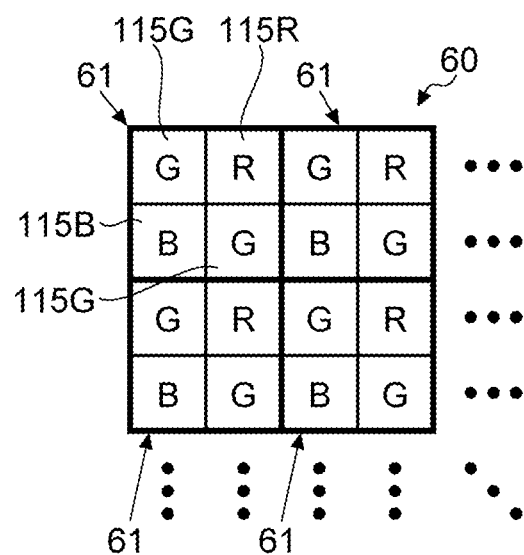
FIG. 4 is a diagram illustrating a layout example of color filters according to the first embodiment.

As described above, for the photodiode 21 of each SPAD pixel 20, a color filter selectively transmitting light of a specific wavelength is arranged. FIG. 4 is a diagram illustrating a layout example of color filters according to the first embodiment.

As illustrated in FIG. 4, a color filter array 60 has, for example, a configuration in which patterns (hereinafter, referred to as unit patterns) 61 serving as a repeating unit in color filter arrangement is arranged into a two-dimensional lattice.

Each of the unit patterns 61 includes, for example, a configuration of a so-called Bayer array including a total of four color filters of a color filter 115R that selectively transmits light having a red (R) wavelength component, two color filters 115G that selectively transmit light having a green (G) wavelength component, and a color filter 115B that selectively transmits light having a blue (B) wavelength component.

Note that in the present disclosure, the color filter array 60 is not limited to the Bayer array. For example, the unit pattern may employ various color filter arrays, such as X-Trans (registered trademark) color filter array with 3×3 pixels, a Quad Bayer array with 4×4 pixels, and a white RGB color filter array with 4×4 pixels including a color filter (hereinafter, also referred to as clear or white) having a light transmission property for a wide range of visible light in addition to RGB primary color filters.

1.6 Example of Stacked Structure of Solid-State Imaging Device

Figure 5:
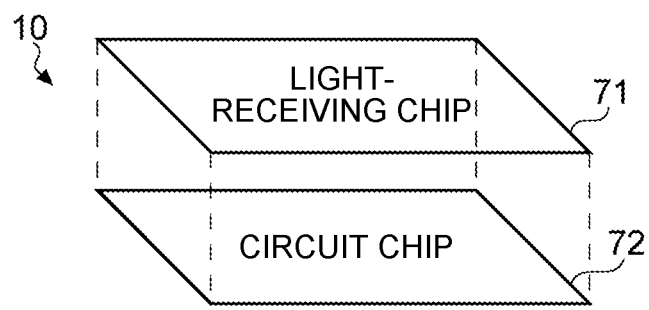
FIG. 5 is a diagram illustrating an example of a stacked structure of the image sensor according to the first embodiment.

FIG. 5 is a diagram illustrating an example of a stacked structure of the image sensor according to the first embodiment. As illustrated in FIG. 5, the image sensor 10 has a structure in which a light-receiving chip 71 and a circuit chip 72 are vertically stacked. The light-receiving chip 71 is, for example, a semiconductor chip including the SPAD array unit 11 in which the photodiodes 21 are arranged, and the circuit chip 72 is, for example, a semiconductor chip on which the readout circuits 22 illustrated in FIG. 3 are arranged. Note that on the circuit chip 72, peripheral circuits, such as the timing control circuit 15, the drive circuit 12, and the output circuit 13, may be arranged.

For bonding the light-receiving chip 71 and the circuit chip 72, for example, so-called direct bonding is available in which flattened bonding surfaces of the light-receiving chip 71 and the circuit chip 72 are bonded to each other by using an attraction force between atoms. However, the present invention is not limited thereto, and for example, so-called Cu—Cu bonding in which copper (Cu) electrode pads formed on the bonding surfaces are bonded to each other, bump bonding, or the like can be also employed.

Furthermore, the light-receiving chip 71 and the circuit chip 72 are electrically connected via a connection portion such as a through-silicon via (TSV) penetrating the semiconductor substrate. For the connection using the TSV, for example, a so-called twin TSV that uses two TSVs, that is, a TSV provided in the light-receiving chip 71 and a TSV provided between the light-receiving chip 71 and the circuit chip 72 to connect outer surfaces of the chips, a so-called shared TSV that uses a TSV penetrating from the light-receiving chip 71 to the circuit chip 72 to connect the chips, or the like can be adopted.

Note that when the Cu—Cu bonding or bump bonding is used for bonding the light-receiving chip 71 and the circuit chip 72, the chips are electrically connected via a Cu—Cu bonding portion or a bump bonding portion.

1.7 Example of Cross-Sectional Structure of SPAD Pixel

Figure 6:
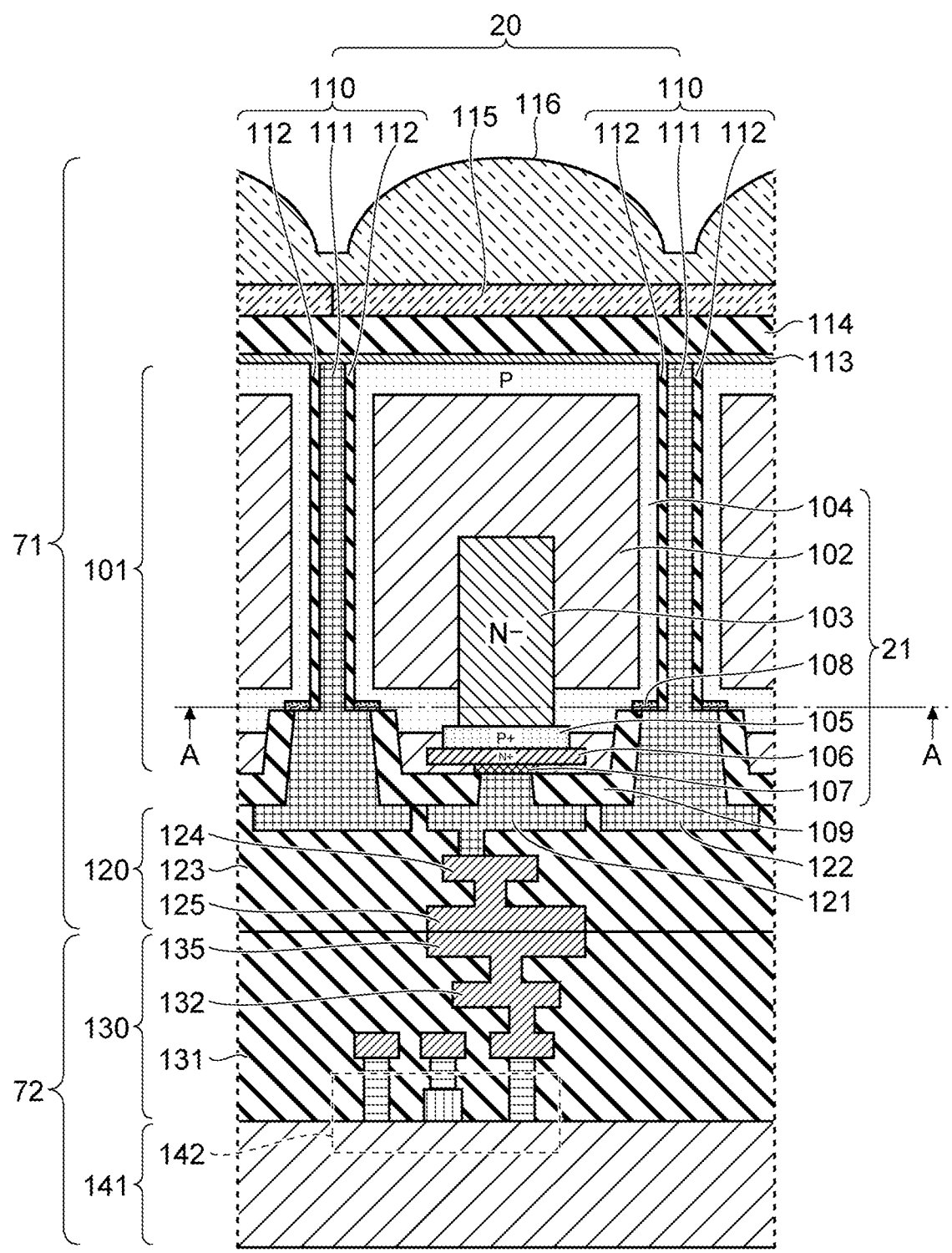
FIG. 6 is a vertical cross-sectional view illustrating an example of a cross-sectional structure as viewed from a plane perpendicular to a light incident surface of the SPAD pixel according to the first embodiment.
Figure 7:
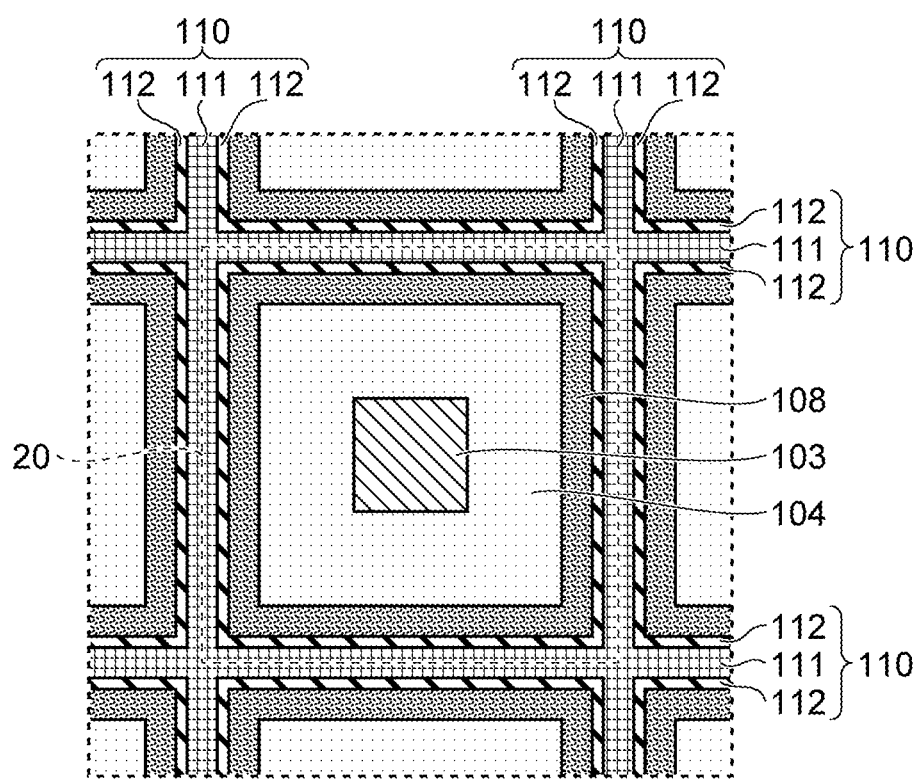
FIG. 7 is a horizontal cross-sectional view illustrating an example of a cross-sectional structure taken along the A-A plane of FIG. 6.

FIG. 6 is a vertical cross-sectional view illustrating an example of a cross-sectional structure as viewed from a plane perpendicular to a light incident surface of the SPAD pixel according to the first embodiment. FIG. 7 is a horizontal cross-sectional view illustrating an example of a cross-sectional structure taken along the A-A plane of FIG. 6. Note that FIG. 6 focuses on a cross-sectional structure of the photodiode 21.

As illustrated in FIG. 6, the photodiode 21 of the SPAD pixel 20 is provided, for example, on a semiconductor substrate 101 constituting the light-receiving chip 71. The semiconductor substrate 101 is divided into a plurality of element regions by, for example, element isolation portions 110 formed into a grid shape as viewed from the light incident surface (e.g., see FIG. 7). The photodiode 21 is provided in each element region defined by the element isolation portions 110. Note that the element isolation portions 110 may each include an anode electrode 122 and an insulating film 109 in a first trench, which are described later.

Each photodiode 21 includes a photoelectric conversion region 102, a P-type semiconductor region 104, an N-type semiconductor region 103, a P+type semiconductor region 105, an N+type semiconductor region 106, a cathode contact 107, and an anode contact 108.

The photoelectric conversion region 102 is, for example, an N-type well region or a region containing donors with low concentration, and photoelectrically converts incident light to generate electron-hole pairs (hereinafter, referred to as charge).

The P-type semiconductor region 104 is, for example, a region containing P-type acceptors, and is provided in a region surrounding the photoelectric conversion region 102 as illustrated in FIGS. 6 and 7. When the reverse bias voltage V_SPAD is applied to the anode contact 108, which is described later, the P-type semiconductor region 104 forms an electric field for guiding the charge generated in the photoelectric conversion region 102 to the N-type semiconductor region 103.

The N-type semiconductor region 103 is, for example, a region containing donors with higher concentration than the photoelectric conversion region 102. As illustrated in FIGS. 6 and 7, the N-type semiconductor region 103 is arranged in a center portion of the photoelectric conversion region 102, takes in charges generated in the photoelectric conversion region 102, and guides the charges to the P+type semiconductor region 105. Note that the N-type semiconductor region 103 is not an essential configuration, and may be omitted.

The P+type semiconductor region 105 is, for example, a region containing acceptors with higher concentration than the P-type semiconductor region 104, and partially makes contact with the P-type semiconductor region 104. In addition, the N+type semiconductor region 106 is, for example, a region containing donors with higher concentration than the N-type semiconductor region 103, and makes contact with the P+type semiconductor region 105.

The P+type semiconductor region 105 and the N+type semiconductor region 106 form a PN junction, and function as an amplification region that accelerates the charges flowing in to generate the avalanche current.

The cathode contact 107 is, for example, a region containing donors with higher concentration than the N+type semiconductor region 106, and is provided in a region making contact with the N+type semiconductor region 106.

The anode contact 108 is, for example, a region containing acceptors with higher concentration than the P+type semiconductor region 105. The anode contact 108 is provided in a region making contact with an outer periphery of the P-type semiconductor region 104. The anode contact 108 may have a width of, for example, approximately 40 nm (nanometers). Thus, the contact of the anode contact 108 with the entire outer periphery of the P-type semiconductor region 104 makes it possible to form a uniform electric field in the photoelectric conversion region 102.

Furthermore, as illustrated in FIGS. 6 and 7, the anode contact 108 is provided on bottom surfaces of trenches (hereinafter referred to as the first trenches) provided in a grid shape along the element isolation portions 110, on a surface side (lower side in the drawing) of the semiconductor substrate 101. Due to such a structure, a position where the anode contact 108 is formed is shifted in a height direction relative to a position where the cathode contact 107 and the N+type semiconductor region 106 are formed, as described later.

The surface side (lower side in the drawing) of the semiconductor substrate 101 is covered with the insulating film 109. The insulating film 109 in the first trench may have a film thickness (thickness in a substrate width direction) of, for example, approximately 150 nm, depending on voltage value of the reverse bias voltage V_SPAD applied between the anode and the cathode.

The insulating film 109 is provided with openings configured to expose the cathode contact 107 and the anode contact 108, in the surface of the semiconductor substrate 101, and a cathode electrode 121 making contact with the cathode contact 107 and the anode electrode 122 making contact with the anode contact 108 are provided in the respective openings.

The element isolation portions 110 defining each photodiode 21 are provided in trenches (hereinafter referred to as second trenches) penetrating the semiconductor substrate 101 from the surface to the back surface. The second trenches are connected to the first trenches on the surface side of the semiconductor substrate 101. Each of the second trenches have an inner diameter that is smaller than an inner diameter of the first trench and has a stepped portion that is formed due to a difference between the inner diameters, and the anode contact 108 is formed at the stepped portion.

Each element isolation portion 110 includes an insulating film 112 configured to cover inner side surfaces of the second trench and a light-shielding film 111 configured to fill the inside of the second trench. The insulating film 112 may have a film thickness (thickness in the substrate width direction) of, for example, approximately 10 nm to 20 nm, depending on voltage value of the reverse bias voltage V_SPAD applied between the anode and the cathode. Furthermore, the light-shielding film 111 may have a film thickness (thickness in the substrate width direction) of, for example, approximately 150 nm, depending on a material or the like used for the light-shielding film 111.

Here, use of a conductive material having a light-shielding property for the light-shielding film 111 and the anode electrode 122 makes it possible to form the light-shielding film 111 and the anode electrode 122 in the same process. Further use of the same conductive material as that of the light-shielding film 111 and the anode electrode 122, for the cathode electrode 121 makes it possible to form the light-shielding film 111, the anode electrode 122, and the cathode electrode 121 in the same process.

For such a conductive material having a light-shielding property, for example, tungsten (W) and the like can be used. However, the conductive material is not limited to tungsten (W) and may be variously changed as long as the conductive material having a property of reflecting or absorbing visible light or light necessary for each element, such as aluminum (Al), an aluminum alloy, or copper (Cu).

However, the light-shielding film 111 in the second trench is not limited to the conductive material, and can employ, for example, a high refractive index material having a refractive index higher than that of the semiconductor substrate 101, a low refractive index material having a refractive index lower than that of the semiconductor substrate 101, or the like.

Furthermore, the light-shielding property is not required for the material used for the cathode electrode 121, and thus, a conductive material such as copper (Cu) may be used instead of the conductive material having a light-shielding property.

Note that in the present embodiment, the element isolation portion 110 of so-called front full trench isolation (FFTI) type in which the second trenches penetrate the semiconductor substrate 101 from the surface side is exemplified, but is not limited thereto, and the element isolation portion 110 of full trench isolation (FTI) type in which the second trenches penetrate the semiconductor substrate 101 from the back surface side and/or the surface side, or the element isolation portion of deep trench isolation (DTI) type or reverse deep trench isolation (ROTI) type in which the second trenches are formed from the surface or the back surface to the middle of the semiconductor substrate 101 may be employed.

In a case where the FTI type in which the second trenches penetrate the semiconductor substrate 101 from the back surface side is used, the material of the light-shielding film 111 may be embedded in the second trench from the back surface side of the semiconductor substrate 101.

The upper portions of the cathode electrode 121 and the anode electrode 122 protrude from a surface (lower side in the drawing) of the insulating film 109. For example, a wiring layer 120 is provided on the surface (lower side in the drawing) of the insulating film 109.

The wiring layer 120 includes an interlayer dielectric 123 and wiring 124 provided in the interlayer dielectric 123. The wiring 124 makes contact with, for example, the cathode electrode 121 protruding from the surface (lower side in the drawing) of the insulating film 109. Note that although not illustrated in FIG. 6, wiring making contact with the anode electrode 122 is also provided in the wiring layer 120.

For example, a connection pad 125 made of copper (Cu) is exposed on a surface (lower side in the drawing) of the wiring layer 120. The connection pad 125 may be part of the wiring 124. In this configuration, the wiring 124 is also made of copper (Cu).

On the surface of the wiring layer 120, a wiring layer 130 in the circuit chip 72 is bonded. The wiring layer 130 includes an interlayer dielectric 131 and wiring 132 provided in the interlayer dielectric 131. The wiring 132 is electrically connected to circuit elements 142 such as the readout circuit 22 formed in a semiconductor substrate 141. Therefore, the cathode electrode 121 on the semiconductor substrate 101 is connected to the readout circuit 22 illustrated in FIG. 3 via the wiring 124, the connection pads 125 and 135, and the wiring 132.

Furthermore, for example, the connection pad 135 made of copper (Cu) is exposed on a surface (upper side in the drawing) of the wiring layer 130. Bonding (Cu—Cu bonding) of the connection pad 135 to the connection pad 125 exposed on the surface of the wiring layer 120 of the light-receiving chip 71 electrically and mechanically connects the light-receiving chip 71 and the circuit chip 72.

The connection pad 135 may be part of the wiring 132. In this configuration, the wiring 132 is also made of copper (Cu).

The back surface (upper side in the drawing) of the semiconductor substrate 101 is provided with a pinning layer 113 and a planarization film 114. Furthermore, on the planarization film 114, a color filter 115 and an on-chip lens 116 are provided for each SPAD pixel 20.

The pinning layer 113 is, for example, a fixed charge film formed of a hafnium oxide ($HfO_2$) film or an aluminum oxide ($Al_2O_3$) film containing the acceptors with a predetermined concentration. The planarization film 114 is, for example, an insulating film made of an insulating material such as a silicon oxide ($SiO_2$) or silicon nitride (SiN), and is a film for planarizing a surface on which the color filter 115 and on-chip lens 116 in an upper layer are formed.

In the structure as described above, when the reverse bias voltage V_SPAD equal to or larger than the breakdown voltage is applied between the cathode contact 107 and the anode contact 108, an electric field for guiding the charge generated in the photoelectric conversion region 102 to the N−type semiconductor region 103 is formed due to a potential difference between the P−type semiconductor region 104 and the N+type semiconductor region 106. In addition, in the PN junction region between the P+type semiconductor region 105 and the N+type semiconductor region 106, a strong electric field that accelerates entering charge and generates the avalanche current is generated. This configuration makes it possible for the photodiode 21 to operate as the avalanche photodiode.

1.8 Positional Relationship Between Anode Contact and Cathode Contact and/or N+Type Semiconductor Region Next, a positional relationship between the anode contact 108 and the cathode contact 107 and/or the N+type semiconductor region 106 in the present embodiment will be described.

As described above, in the present embodiment, the anode contact 108 is arranged at the bottom of the first trench formed on the surface side of the semiconductor substrate 101. Thus, in the present embodiment, the anode contact 108 is arranged at a position deeper than that of the cathode contact 107 and the N+type semiconductor region 106, relative to the surface (lower side in the drawing) of the semiconductor substrate 101. In other words, in the present embodiment, based on the surface (lower side in the drawing) of the semiconductor substrate 101, the position where the anode contact 108 is formed is shifted in the height direction relative to the position where the cathode contact 107 and the N+type semiconductor region 106 are formed.

In other words, the height of the anode contact 108 from the surface of the semiconductor substrate 101 is different from the height of the N+type semiconductor region 106 from the surface of the semiconductor substrate 101. Specifically, the height of the anode contact 108 from the surface of the semiconductor substrate 101 is higher than the height of the N+type semiconductor region 106 from the surface of the semiconductor substrate 101.

As described above, the position where the anode contact 108 is formed is shifted relative to the position where the cathode contact 107 and the N+type semiconductor region 106 are formed, in the height direction, and the shift makes it possible to increase the distance from the anode contact 108 to the cathode contact 107 and/or the N+type semiconductor region 106 without increasing the size of the SPAD pixel 20 in a lateral direction (direction parallel to the incident surface).

This makes it possible to suppress the occurrence of the tunneling effect without increasing the pixel size, and thus, the avalanche amplification is stably generated while suppressing a decrease in resolution.

1.9 Manufacturing Method

Next, a manufacturing method for the image sensor 10 according to the present embodiment will be described in detail with reference to the drawings. Note that, the following description focuses on a manufacturing method for the light-receiving chip 71.

FIGS. 8 to 20 are each a process cross-sectional view illustrating the manufacturing method for the solid-state imaging device according to the first embodiment.

Figure 8:
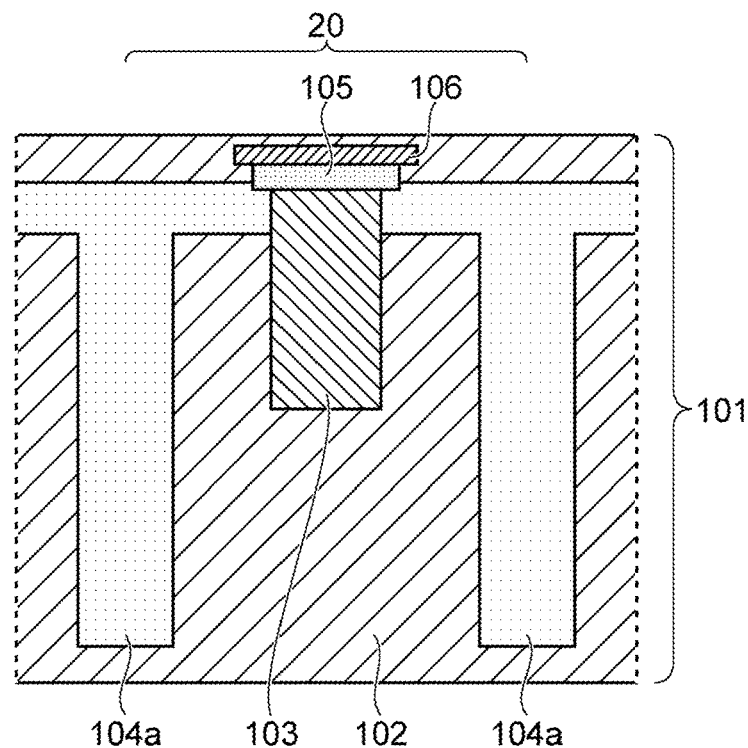
FIG. 8 is a process cross-sectional view illustrating a first manufacturing method for the solid-state imaging device according to the first embodiment.

In the present manufacturing method, firstly, ion implantation of donors and acceptors into predetermined regions of the semiconductor substrate 101 including donors having a low concentration as a whole is appropriately carried out, and the N-type semiconductor region 103, the P+type semiconductor region 105, the N+type semiconductor region 106, and part (a P-type semiconductor region 104a) of the P-type semiconductor region 104 that defines the photoelectric conversion region 102 are formed, as illustrated in FIG. 8. Note that the ion implantation may be carried out, for example, from the surface (upper side in the drawing) of the semiconductor substrate 101. Furthermore, after the ion implantation, annealing for recovery of damage caused during the ion implantation and improvement of the profile of the implanted dopant may be performed once or a plurality of times.

Figure 9:
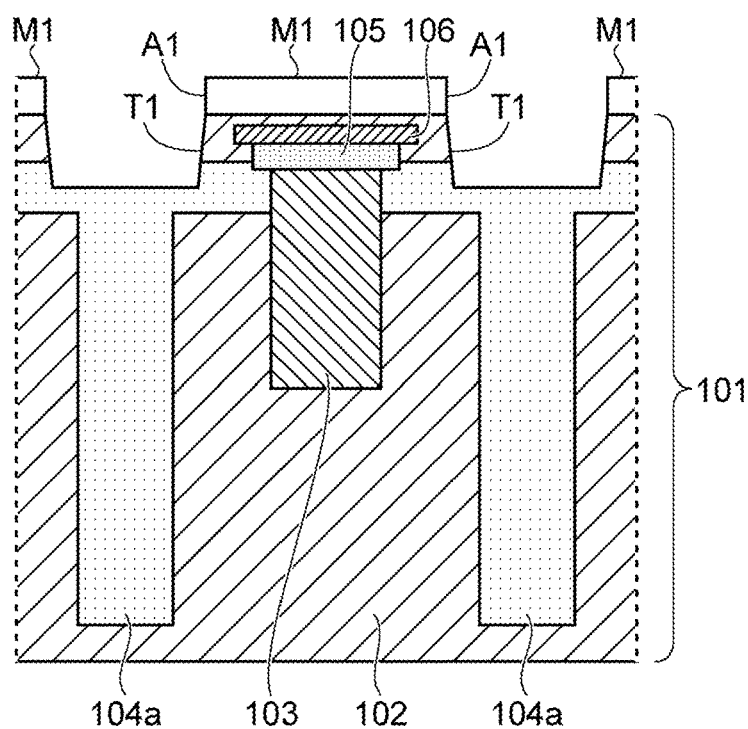
FIG. 9 is a process cross-sectional view illustrating a second manufacturing method for the solid-state imaging device according to the first embodiment.

Next, as illustrated in FIG. 9, a mask M1 having openings A1 formed in a grid shape is formed on the surface of the semiconductor substrate 101, the semiconductor substrate 101 is carved by anisotropic dry etching such as reactive ion etching (RIE) from above the mask M1, and thereby first trenches T1 in a grid shape are formed along the boundary portions of the adjacent SPAD pixels 20. Note that each of the first trenches T1 may have a depth so that the bottom surface of the trench is positioned at least at a level deeper than the lower surface of the P+type semiconductor region 105 and reaches the P-type semiconductor region 104a.

Note that it is preferable to keep distance between the anode contact 108 and the N+type semiconductor region 106 and the cathode contact 107, as the depth of the first trench T1 from the surface of the semiconductor substrate 101 increases. However, excessive depth of the first trench T1 may reduce the process accuracy and deteriorate the yield. Therefore, the depth of the first trench T1 is preferably set to have a depth within a range in which the process accuracy equal to or more than necessary process accuracy is ensured.

Figure 10:
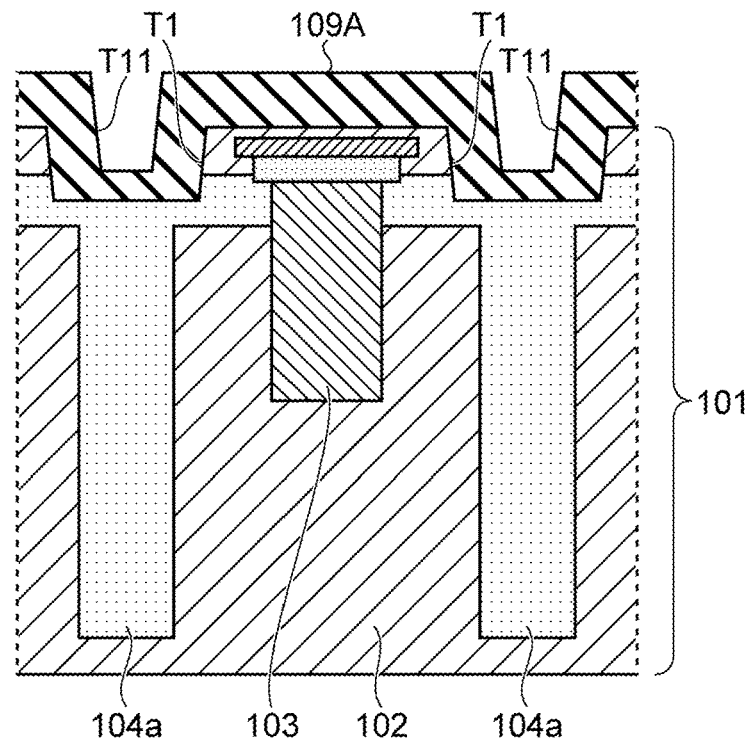
FIG. 10 is a process cross-sectional view illustrating a third manufacturing method for the solid-state imaging device according to the first embodiment.

Next, as illustrated in FIG. 10, after the mask M1 is removed, an insulating film 109A covering the surface of the semiconductor substrate 101 and inner surfaces of the first trenches T1 is formed by using a film forming technique such as sputtering or a chemical vapor deposition (CVD). Note that the insulating film 109A can employ an insulating material such as silicon oxide ($SiO_2$), silicon nitride (SiN), silicon carbide (SiC), or aluminum oxide ($Al_2O_3$). Furthermore, the insulating film 109A may have a single layer structure or a layered structure. As described above, the reverse bias voltage V_SPAD having a high voltage is applied to the anode electrode 122, and for the material of the insulating film 109A, an insulating material having high pressure resistance such as silicon oxide ($SiO_2$) is preferably employed, in view of high pressure resistance required for the insulating film 109A.

Figure 11:
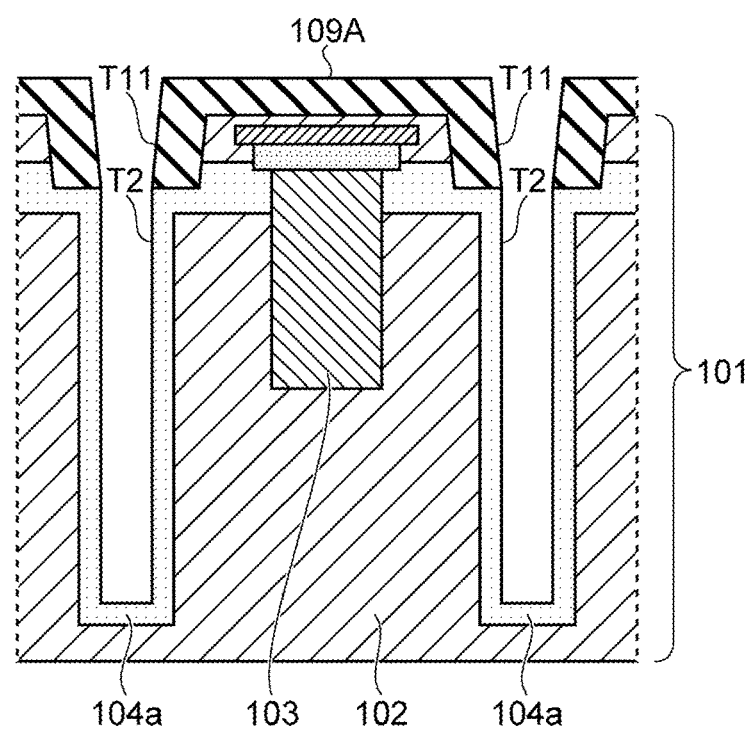
FIG. 11 is a process cross-sectional view illustrating a fourth manufacturing method for the solid-state imaging device according to the first embodiment.

Next, as illustrated in FIG. 11, the bottom surface of a trench T11 formed by a surface of the insulating film 109A in the first trench T1 is carved in a substrate thickness direction to form a second trench T2 reaching the vicinity of the back surface of the semiconductor substrate 101 from the surface side thereof. Note that for the formation of the second trenches T2, for example, anisotropic dry etching that can provide a sufficiently high selectivity with respect to the semiconductor substrate 101 can be used. This makes it possible to etch the region of grid of the semiconductor substrate 101 where the element isolation portion 110 is formed while using as the mask the insulating film 109A formed on the inner side surface of the first trench T1 and the upper surface of the semiconductor substrate 101.

Figure 12:
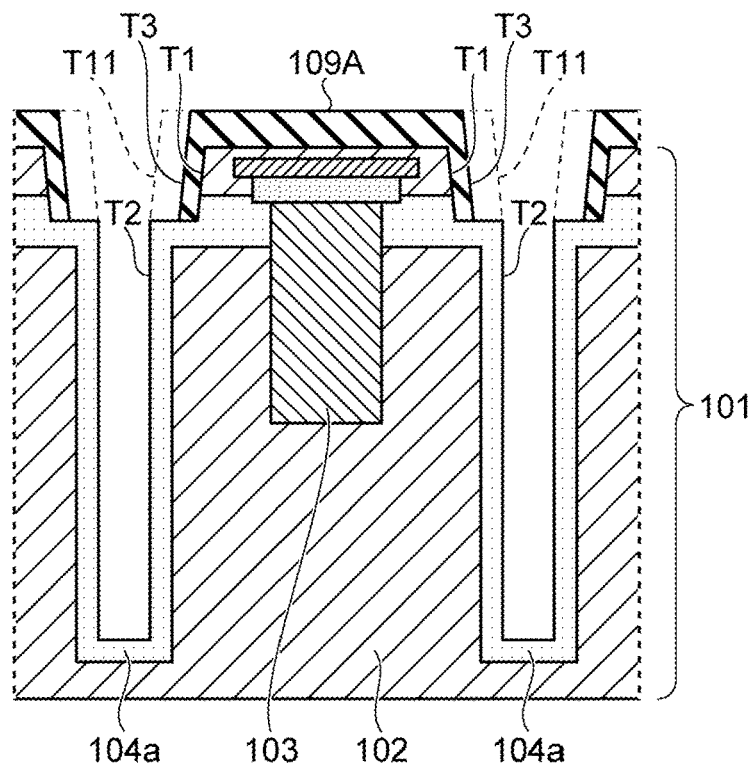
FIG. 12 is a process cross-sectional view illustrating a fifth manufacturing method for the solid-state imaging device according to the first embodiment.

Next, as illustrated in FIG. 12, the film thickness of the insulating film 109A in the first trench T1 is reduced by isotropic etching such as wet etching to expose an outer peripheral portion of the P-type semiconductor region 104a from the bottom of the first trench T1. At that time, the film thickness of the insulating film 109A on the surface of the semiconductor substrate 101 may be reduced.

Figure 13:
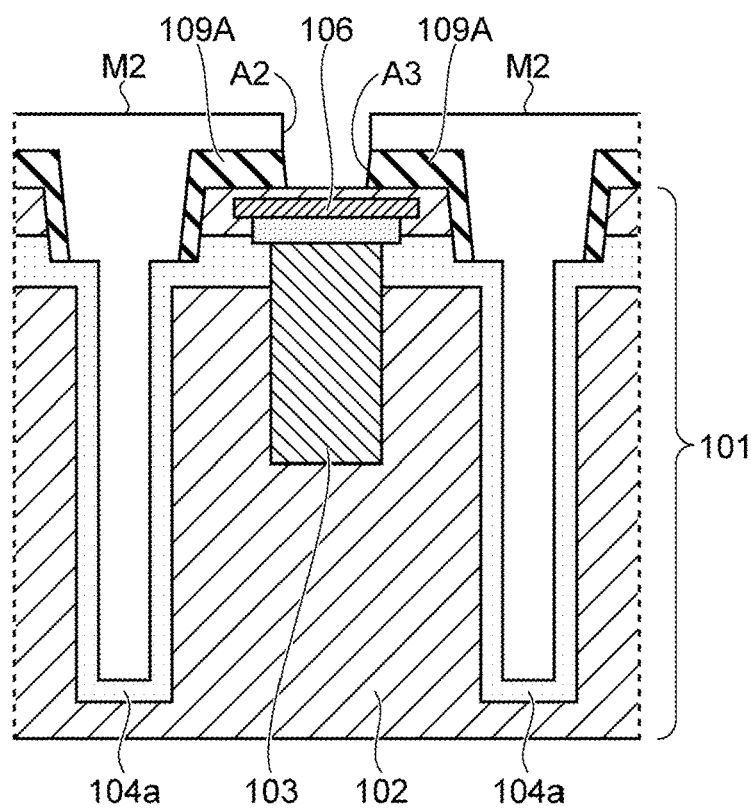
FIG. 13 is a process cross-sectional view illustrating a sixth manufacturing method for the solid-state imaging device according to the first embodiment.

Next, as illustrated in FIG. 13, a mask M2 having an opening A2 is formed on the insulating film 109A, above the N+type semiconductor region 106, and the insulating film 109A is etched from above the mask M2 by anisotropic dry etching such as RIE to form an opening A3 partially exposing the upper surface of the semiconductor substrate 101.

Figure 14:
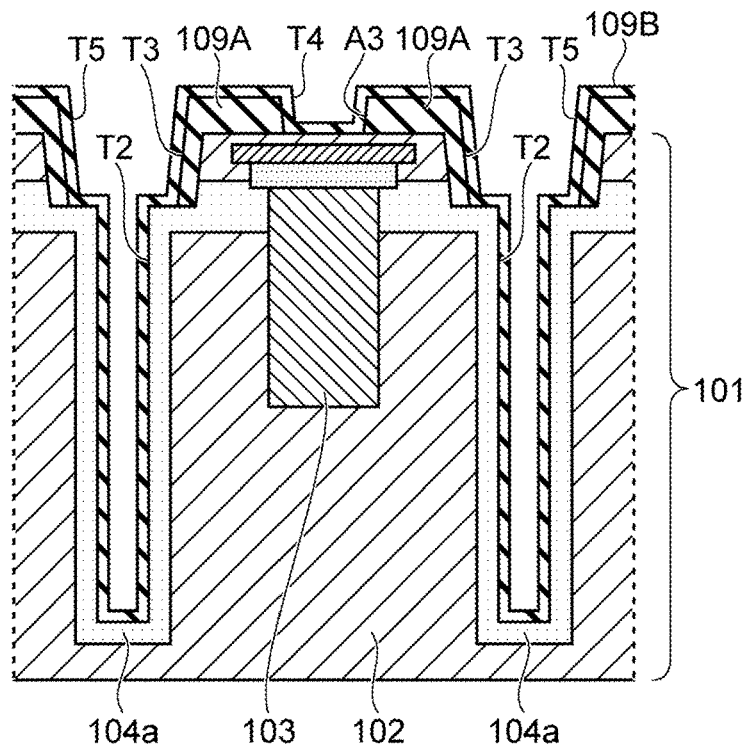
FIG. 14 is a process cross-sectional view illustrating a seventh manufacturing method for the solid-state imaging device according to the first embodiment.

Next, as illustrated in FIG. 14, after the mask M2 is removed, an insulating film 109B covering the insulating film 109A, the inner side surface and bottom surface of the opening A3, and the inner surface of each of the first trenches T1 and second trenches T2 is isotropically formed by using the film forming technique such as CVD. In the following description, the insulating film 109A and the insulating film 109B are collectively referred to as the insulating film 109. In addition, a trench formed of the surface of the insulating film 109B in the opening A3 is referred to as a trench T4, and a trench formed of the surface of the insulating film 109B in a trench T3 is referred to as a trench T5.

Note that the insulating film 109B may be omitted. The omission of the insulating film 109B makes it possible to bring the anode electrode 122 into contact with the P-type semiconductor region 104a also in the second trench T2, in addition to the anode contact 108, and a low resistance contact can be achieved. The omission of the insulating film 109B will be described later in detail in a first modification.

Meanwhile, forming of the insulating film 109B makes it possible to reduce damage to the semiconductor substrate 101 caused by the ion implantation in forming the contact which will be described later.

Figure 15:
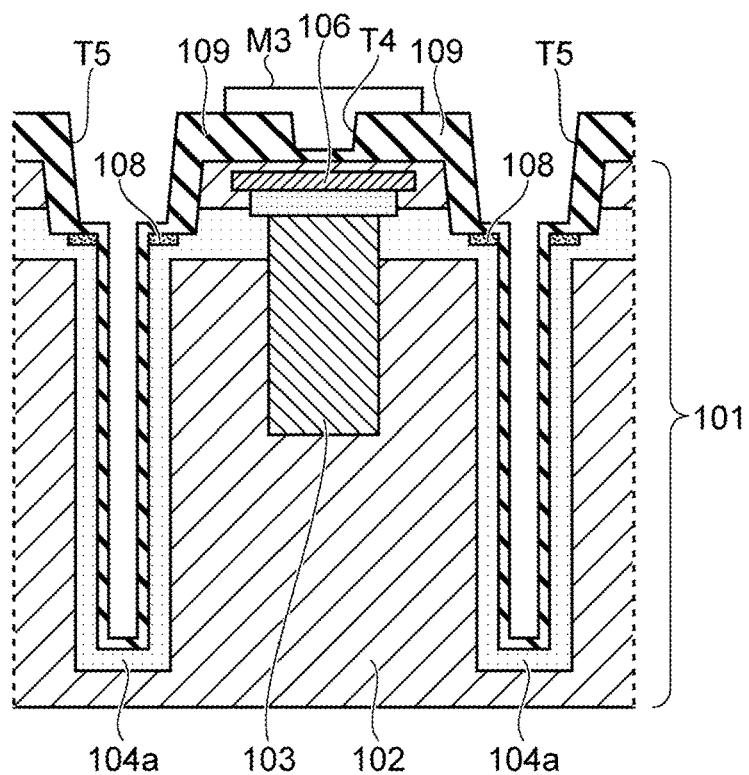
FIG. 15 is a process cross-sectional view illustrating an eighth manufacturing method for the solid-state imaging device according to the first embodiment.

Next, as illustrated in FIG. 15, a mask M3 that covers the trench T4 located above the N+type semiconductor region 106 is formed, and ion implantation of a high concentration of acceptors is performed from above the mask M3 and the insulating film 109. At this time, the mask M3 and the insulating film 109 function as the mask, and thereby the anode contact 108 containing a high concentration of acceptors is formed at the bottom of the trench T5 that is a region where the insulating film 109 has a thin film thickness, in other words, at an upper outer periphery of the P-type semiconductor region 104 (e.g., see, FIG. 7).

Figure 16:
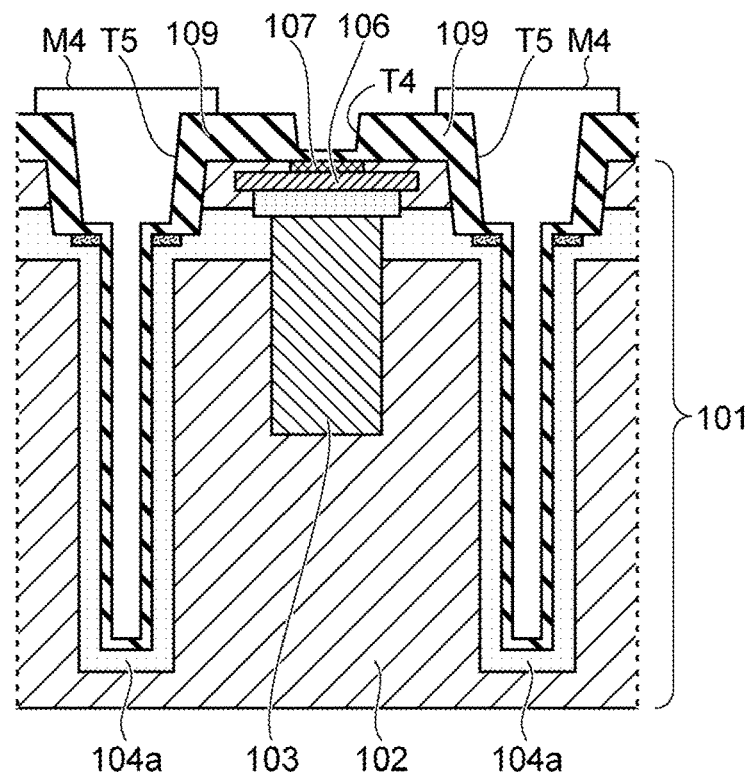
FIG. 16 is a process cross-sectional view illustrating a ninth manufacturing method for the solid-state imaging device according to the first embodiment.

Next, as illustrated in FIG. 16, after the mask M3 is removed, for example, a mask M4 that covers the trenches T5 formed in the grid shape is formed, and ion implantation of a high concentration of donors is performed from above the mask M4 and the insulating film 109. At that time, the mask M4 and the insulating film 109 function as the mask, and thereby the cathode contact 107 containing a high concentration of donors is formed at the bottom of the trench T4 that is a region where the insulating film 109 has a thin film thickness, in other words, at part of the semiconductor substrate 101 located above the N+type semiconductor region 106.

Note that formation of the anode contact 108 and the cathode contact 107 is not limited to the ion implantation, and various methods such as solid-phase diffusion and plasma doping can be used.

Figure 17:
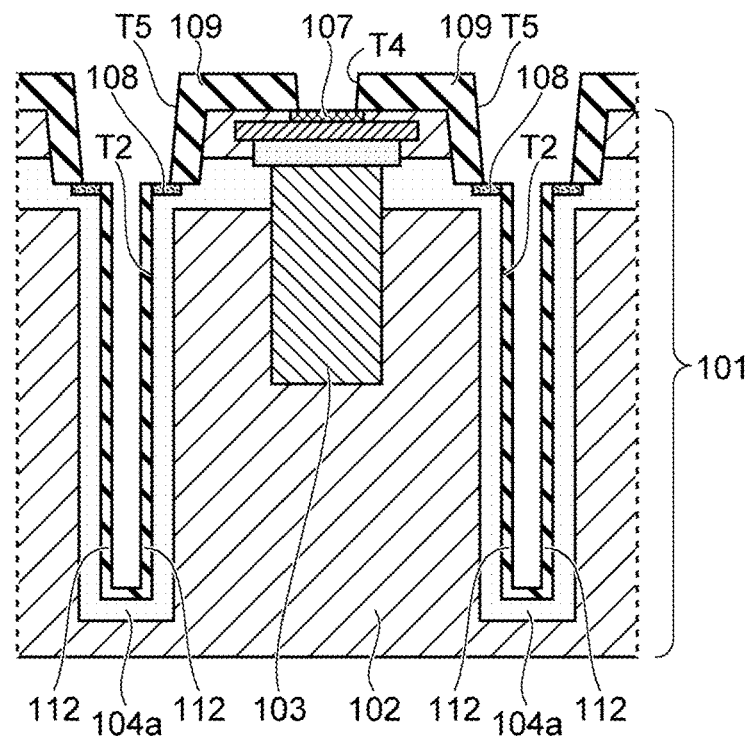
FIG. 17 is a process cross-sectional view illustrating a tenth manufacturing method for the solid-state imaging device according to the first embodiment.

Next, as illustrated in FIG. 17, after the mask M4 is removed, for example, the surface of the insulating film 109 is entirely etched back, and thereby the insulating film 109 at the bottom of the trench T4 is removed to expose the cathode contact 107 and the insulating film 109 at the bottom of each of the trenches T5 is removed to expose the anode contact 108.

At that time, a mask having a predetermined opening pattern may be formed by using photolithography or the like to limit a region where the insulating film 109 is removed to expose the anode contact 108. The etch back will be described later in detail in a second modification.

When the insulating film 109 is entirely etched back, a contact area between the anode contact 108 and the anode electrode 122 is ensured, and thereby a low-resistance contact can be formed. Furthermore, it becomes possible to bring the anode contact 108 and the anode electrode 122 into contact with each other so as to surround the outer periphery of the P-type semiconductor region 104a, and a uniform electric field is thereby formed in the photoelectric conversion region 102.

Meanwhile, when the region from which the insulating film 109 is removed is limited, a portion where the anode contact 108 and the anode electrode 122 make contact with each other can be controlled, and thus, control or the like of a distribution of the electric field formed in the photoelectric conversion region 102 is made possible.

Note that in the present embodiment, the insulating film 109 remaining in the second trench T2 after the film thickness of the insulating film 109 is reduced is used as the insulating film 112 of the element isolation portion 110.

Next, for example, a titanium (Ti)/titanium nitride (TiN) film is formed on the exposed surfaces of the cathode contact 107 and the anode contact 108, followed by annealing at approximately 500° C. to 800° C. in this state. Accordingly, silicon (Si) and titanium (Ti) react with each other on the exposed surfaces of the cathode contact 107 and the anode contact 108 to form a titanium silicide layer.

As described above, the silicidation of the surfaces (contact surfaces) of the cathode contact 107 and the anode contact 108 makes it possible to have an ohmic contact in contact between the cathode contact 107 and the cathode electrode 121 and contact between the anode contact 108 and the anode electrode 122, and thereby resistance in the contact therebetween is reduced. This makes it possible to reduce the contact area between the anode contact 108 and the anode electrode 122, whereby the pixel size can be reduced and the resolution can be increased.

Note that instead of the Ti/TiN film, a Co/TiN film may be used. Even in this case, a cobalt silicide layer is formed on the surface (contact surface) of each of the cathode contact 107 and the anode contact 108, and thereby the cathode contact 107 and the cathode electrode 121, and the anode contact 108 and the anode electrode 122 are brought into an ohmic contact with each other.

In addition, instead of the titanium silicide and the cobalt silicide, various silicides such as nickel silicide can be used to bring the cathode contact 107 and the cathode electrode 121, and the anode contact 108 and the anode electrode 122 into an ohmic contact.

Figure 18:
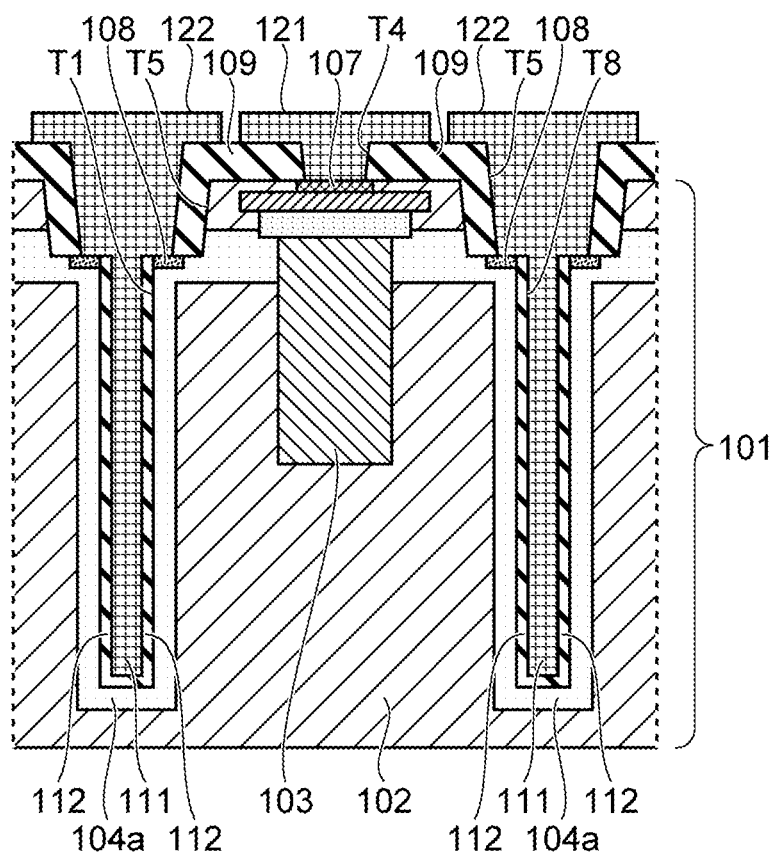
FIG. 18 is a process cross-sectional view illustrating an eleventh manufacturing method for the solid-state imaging device according to the first embodiment.

Next, as illustrated in FIG. 18, for example, a lift-off process or the like is used to form the light-shielding film 111 in each first trench T1, the cathode electrode 121 that makes contact with the cathode contact 107 in the trench T4, and further the anode electrode 122 that makes contact with the anode contact 108 in each second trench T2.

As described above, for the materials of the light-shielding film 111, cathode electrode 121, and anode electrode 122, various conductive materials having a property of reflecting or absorbing visible light or light necessary for each element, such as aluminum (Al), an aluminum alloy, or copper (Cu) can be used, in addition to tungsten (W).

When the light-shielding film 111, the cathode electrode 121, and the anode electrode 122 are formed of the same material, the light-shielding film 111, the cathode electrode 121, and the anode electrode 122 can be collectively formed. Meanwhile, when different materials are used for the light-shielding film 111, the cathode electrode 121, and the anode electrode 122, the light-shielding film 111 is formed first, and then the cathode electrode 121 and the anode electrode 122 are formed by using the lift-off process or the like.

Next, over the insulating film 109 in which the cathode electrode 121 and the anode electrodes 122 are formed, the wiring layer 120 including the wiring 124 connected to the cathode electrode 121, wiring 126 connected to the anode electrode 122, and the interlayer dielectric 123 is formed. Furthermore, the connection pads 125 and 127 made of copper (Cu) and exposed on the surface of the interlayer dielectric 123 are formed.

Figure 19:
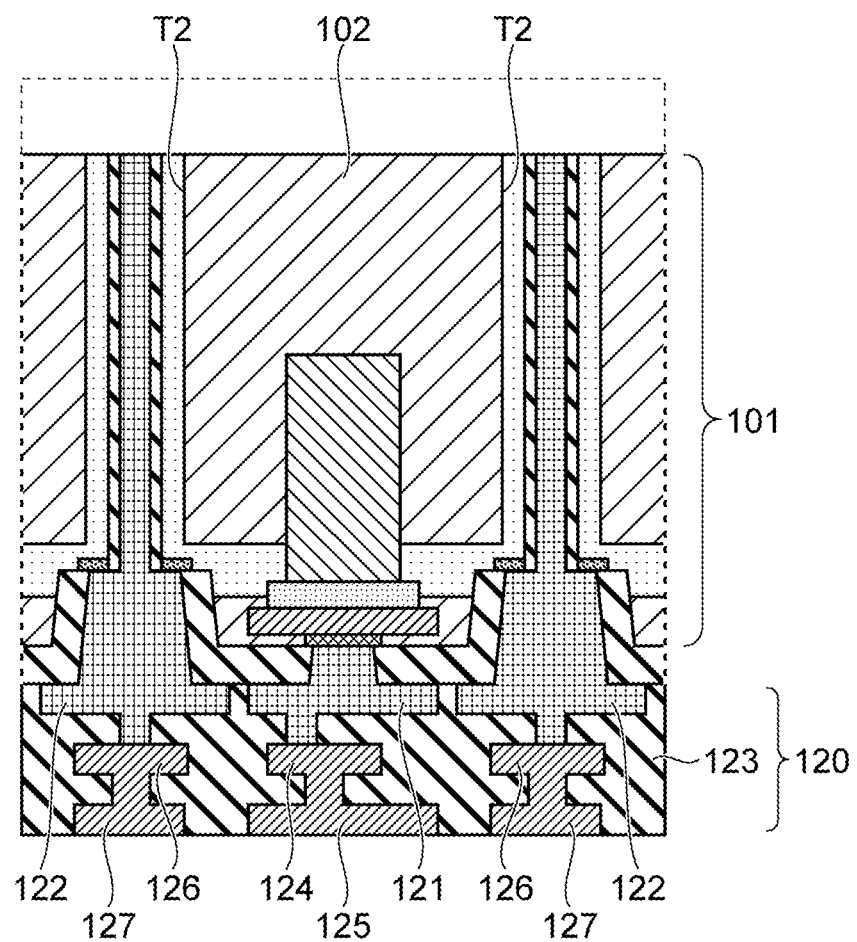
FIG. 19 is a process cross-sectional view illustrating a twelfth manufacturing method for the solid-state imaging device according to the first embodiment.

Next, as illustrated in FIG. 19, the semiconductor substrate 101 is thinned from the back surface, and whereby each of the second trenches T2 is caused to penetrate so that the light-shielding film 111 in the second trench T2 reaches the back surface of the semiconductor substrate 101. For thinning the semiconductor substrate 101, for example, chemical mechanical polishing (CMP) or the like may be used.

Figure 20:
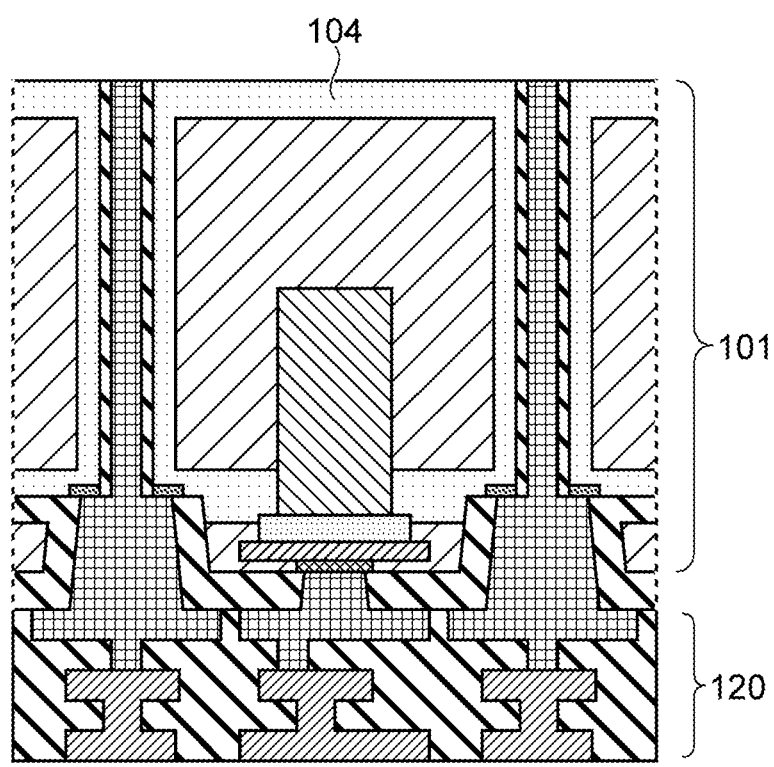
FIG. 20 is a process cross-sectional view illustrating a thirteenth manufacturing method for the solid-state imaging device according to the first embodiment.

Next, ion implantation of acceptors into the entire back surface of the semiconductor substrate 101 is performed. Therefore, the P–type semiconductor region 104 surrounding the photoelectric conversion region 102 is completed, as illustrated in FIG. 20.

Then, the pinning layer 113, the planarization film 114, the color filter 115, and the on-chip lens 116 are sequentially formed on the back surface of the semiconductor substrate 101, and thus, the light-receiving chip 71 in the image sensor 10 is formed. Then, the circuit chip 72 which is separately prepared and the light-receiving chip 71 are bonded to each other, and the image sensor 10 having the cross-sectional structure as illustrated in FIG. 6 is formed.

1.10 Functions and Effects

As described above, in the present embodiment, the position of the anode contact 108 and the position of the cathode contact 107 and/or the N+type semiconductor region 106 are shifted in the height direction. Thus, according to the present embodiment, it is possible to increase the distance from the anode contact 108 to the cathode contact 107 and/or the N+type semiconductor region 106 without increasing the size of the SPAD pixel 20 in a lateral direction (direction parallel to the incident surface). Therefore, it is possible to suppress the occurrence of the tunneling effect without increasing the pixel size, and thus, the avalanche amplification is stably generated while suppressing a decrease in resolution.

1.11 Modifications

Next, specific examples of modifications of the SPAD pixel 20 according to the first embodiment will be described.

1.11.1 First Modification

Figure 21:
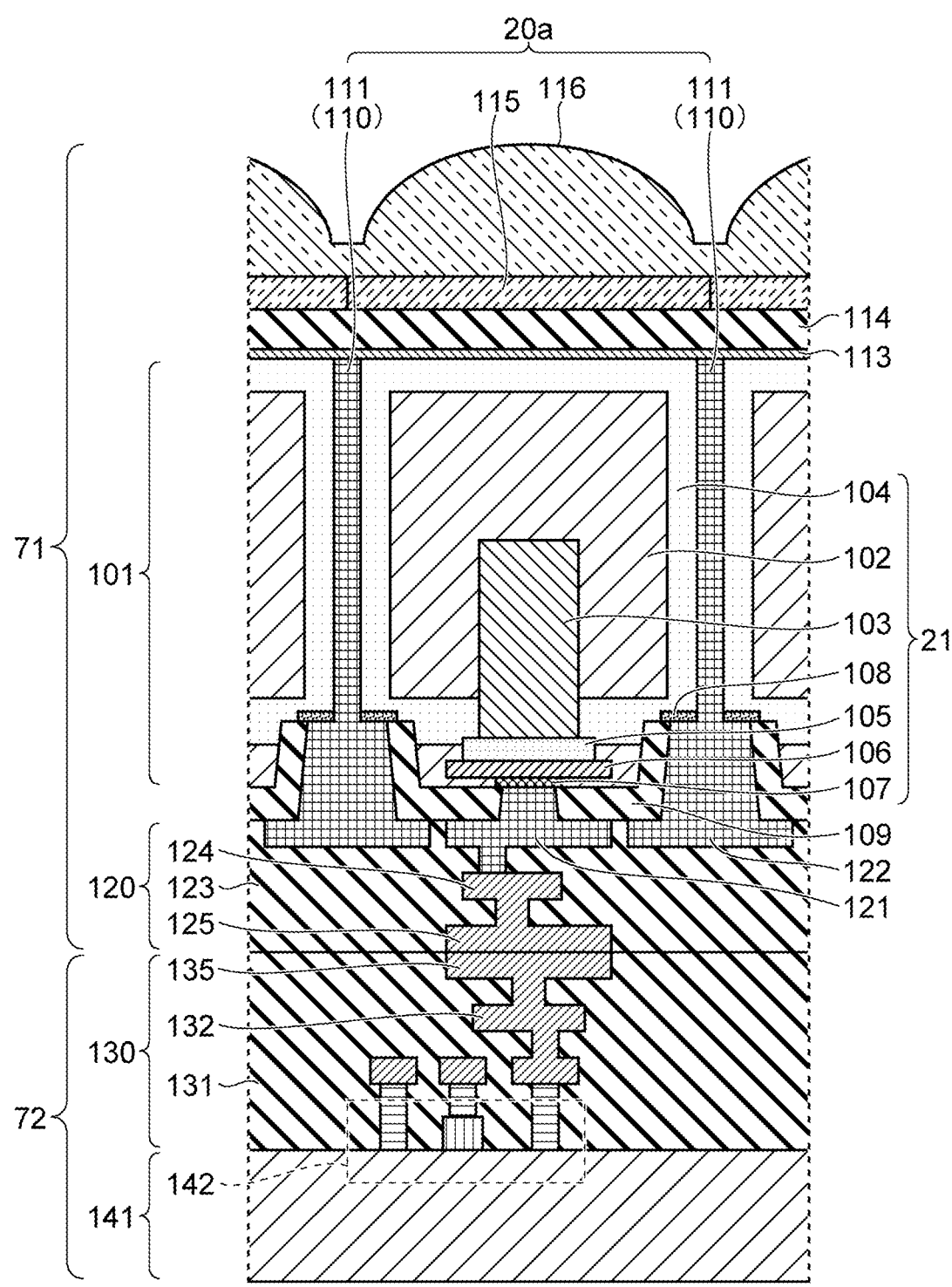
FIG. 21 is a vertical cross-sectional view illustrating an example of a cross-sectional structure as viewed from a plane perpendicular to a light incident surface of a SPAD pixel according to a first modification of the first embodiment.

FIG. 21 is a vertical cross-sectional view illustrating an example of a cross-sectional structure as viewed from a plane perpendicular to the light incident surface of a SPAD pixel according to a first modification.

As illustrated in FIG. 21, the SPAD pixel 20a according to the first modification has a structure similar to the cross-sectional structure described in the first embodiment with reference to FIG. 6 and the like, and in the structure, the insulating film 112 (corresponding to the insulating films 109B) in the second trench (corresponding to the second trench T2) is omitted.

The omission of the insulating film 112 in the element isolation portion 110, as described above, makes it possible to bring the anode electrode 122 into contact with the P–type semiconductor region 104a also in the second trench, in addition to the anode contact 108, and a low resistance contact can be achieved, as described in the first embodiment.

1.11.2 Second Modification

Figure 22:
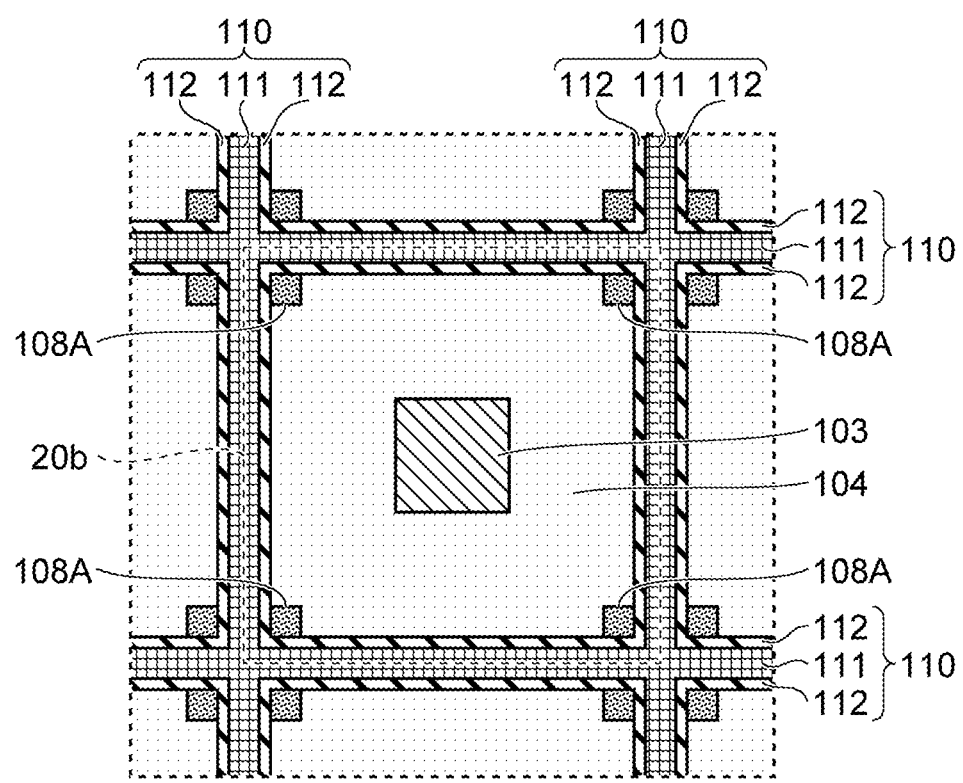
FIG. 22 is a horizontal cross-sectional view illustrating an example of a cross-sectional structure as viewed from a plane parallel to a light incident surface of a SPAD pixel according to a second modification of the first embodiment.

FIG. 22 is a horizontal cross-sectional view illustrating an example of a cross-sectional structure as viewed from a plane parallel to the light incident surface of a SPAD pixel according to a second modification. Note that FIG. 22 illustrates a plane corresponding to that of FIG. 7.

As illustrated in FIG. 22, the SPAD pixel 20b according to the second modification has a structure similar to the cross-sectional structure described in the first embodiment with reference to FIG. 7 and the like, and in the structure, regions where anode contacts 108A are formed are limited to make partial contact with the P–type semiconductor region 104 on the outer periphery of the P–type semiconductor region 104. Specifically, the regions where the anode contacts 108A are formed are limited to the four corners of a rectangular region divided by the element isolation portion 110.

As described above, limiting the regions where the anode contacts 108A are formed makes it possible to control the portion where the anode contacts 108 and the anode electrodes 122 make contact with each other, as described in the first embodiment, and thus, control or the like of a distribution of the electric field formed in the photoelectric conversion region 102 is made possible.

1.11.3 Third Modification

Figure 23:
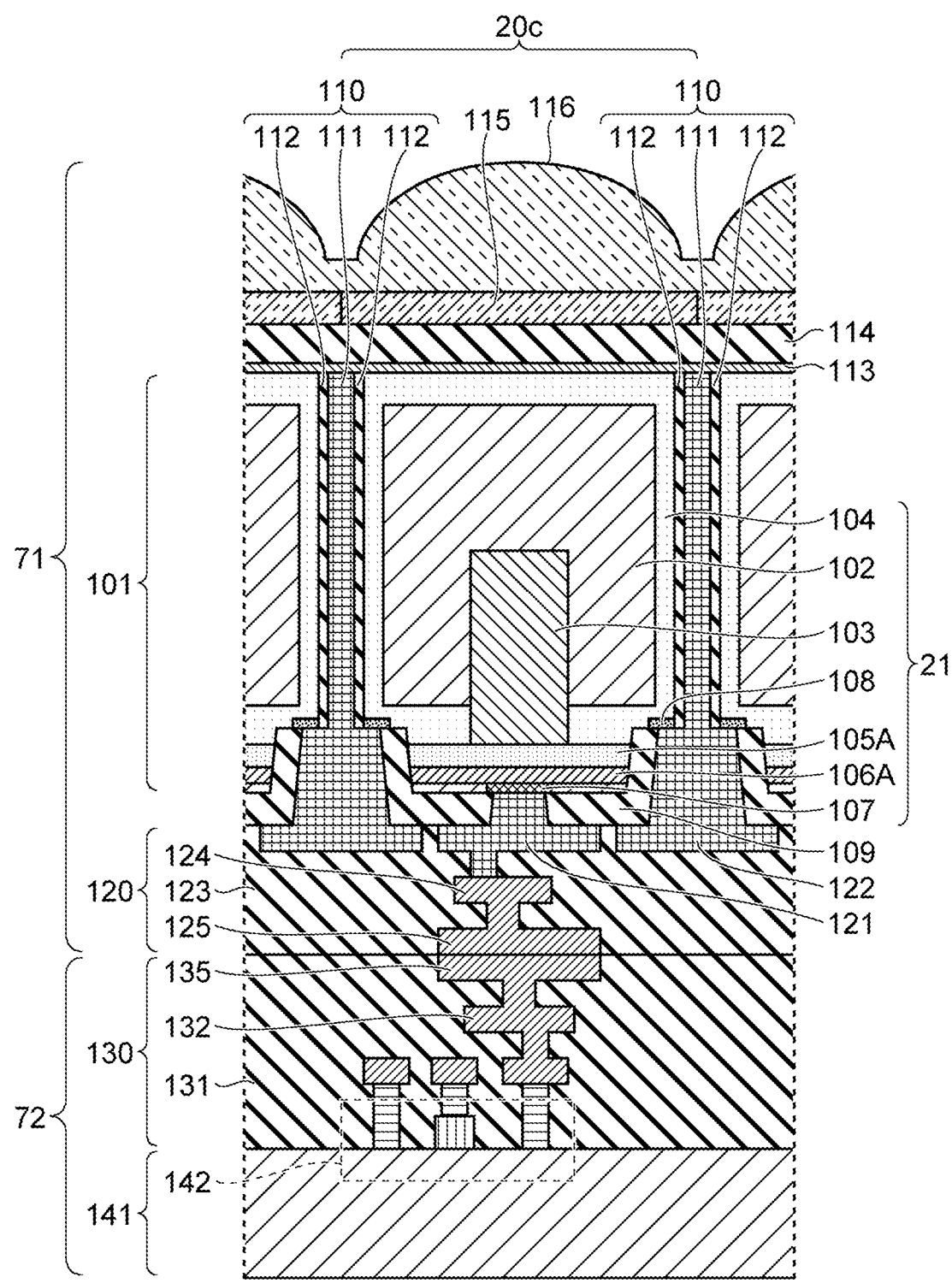
FIG. 23 is a vertical cross-sectional view illustrating an example of a cross-sectional structure as viewed from a plane perpendicular to a light incident surface of a SPAD pixel according to a third modification of the first embodiment.

FIG. 23 is a vertical cross-sectional view illustrating an example of a cross-sectional structure as viewed from a plane perpendicular to the light incident surface of a SPAD pixel according to a third modification.

As illustrated in FIG. 23, the SPAD pixel 20c according to the third modification has a structure similar to the cross-sectional structure described in the first embodiment with reference to FIG. 6 and the like, and in the structure, a P+type semiconductor region 105A and an N+type semiconductor region 106A expand until making contact with the insulating film 109 formed in the first trench.

As described above, expansion of the P+type semiconductor region 105A and the N+type semiconductor region 106A to the entire region surrounded by the first trenches makes it possible to expand a region where the avalanche amplification is generated, and thus, improving the quantum efficiency.

In addition, expansion of the P+type semiconductor region 105A to the entire region surrounded by the first trenches makes it possible to prevent charges generated near the anode contacts 108 from directly flowing into the N+type semiconductor region 106A or the cathode contact 107, and thus, improving the quantum efficiency by reducing charges that do not contribute to the avalanche amplification.

1.11.4 Fourth Modification

Figure 24:
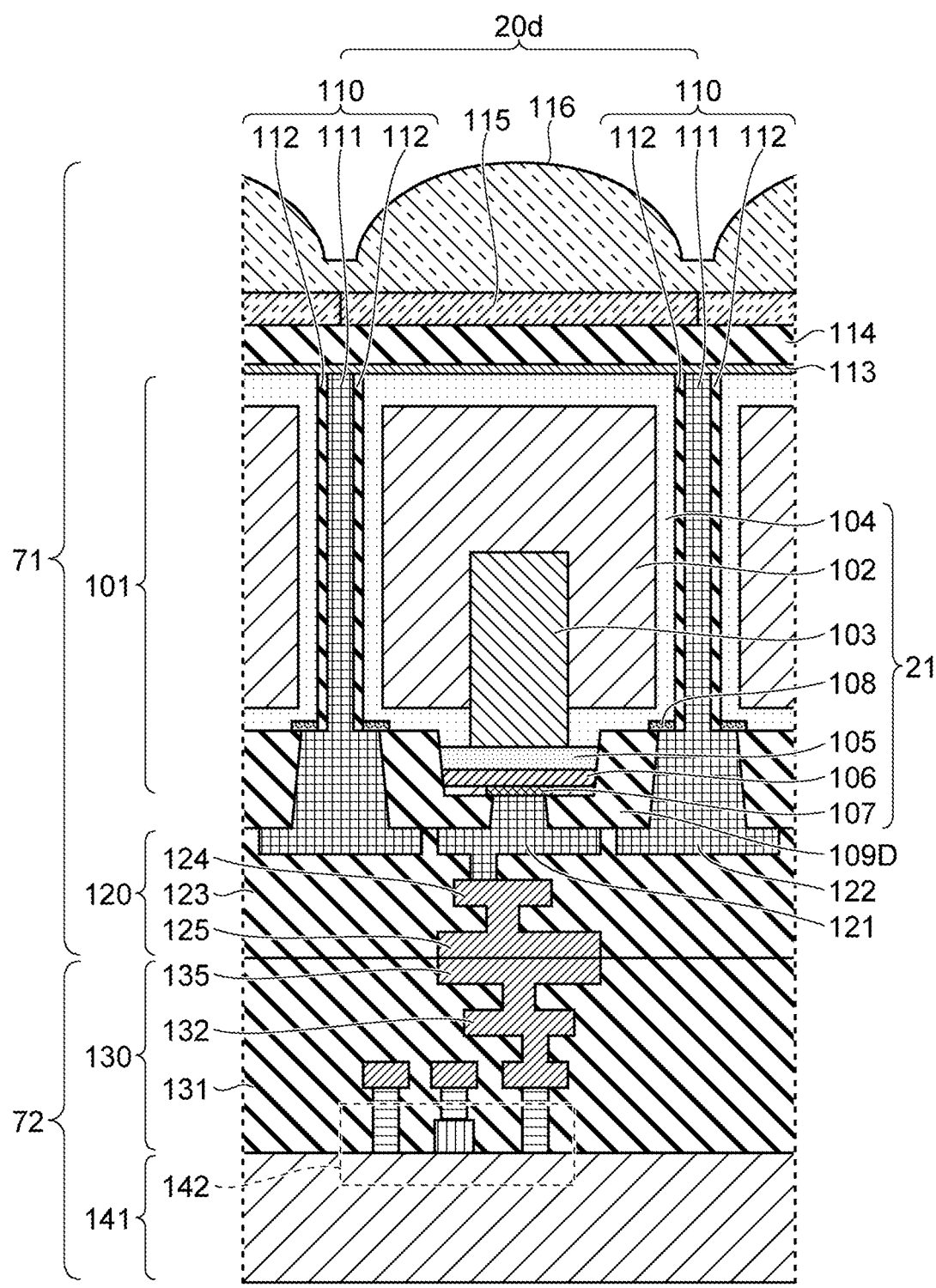
FIG. 24 is a vertical cross-sectional view illustrating an example of a cross-sectional structure as viewed from a plane perpendicular to a light incident surface of a SPAD pixel according to a fourth modification of the first embodiment.

FIG. 24 is a vertical cross-sectional view illustrating an example of a cross-sectional structure as viewed from a plane perpendicular to the light incident surface of a SPAD pixel according to a fourth modification.

As illustrated in FIG. 24, the SPAD pixel 20d according to the fourth modification has a structure similar to the cross-sectional structure described in the first embodiment with reference to FIG. 6 and the like, and in the structure, the diameter of the first trench is increased, and an insulating film 109D in the first trench is thereby expanded to the extent that the insulating film 109D makes contact with at least the P+type semiconductor region 105A.

As described above, the contact of the insulating film 109D with the P+type semiconductor region 105A by the increased diameter of the first trench makes it possible to prevent the charges generated in the vicinity of the anode contacts 108 from directly flowing into the N+type semiconductor region 106A or the cathode contact 107, and thus, improving the quantum efficiency by reducing charges that do not contribute to the avalanche amplification.

1.11.5 Fifth Modification

In a fifth modification, some examples of connection wiring for the anode in the embodiment and the modification thereof will be described. Note that in the following, for the sake of simplicity, a description will be made of examples based on the first embodiment.

Figure 25:
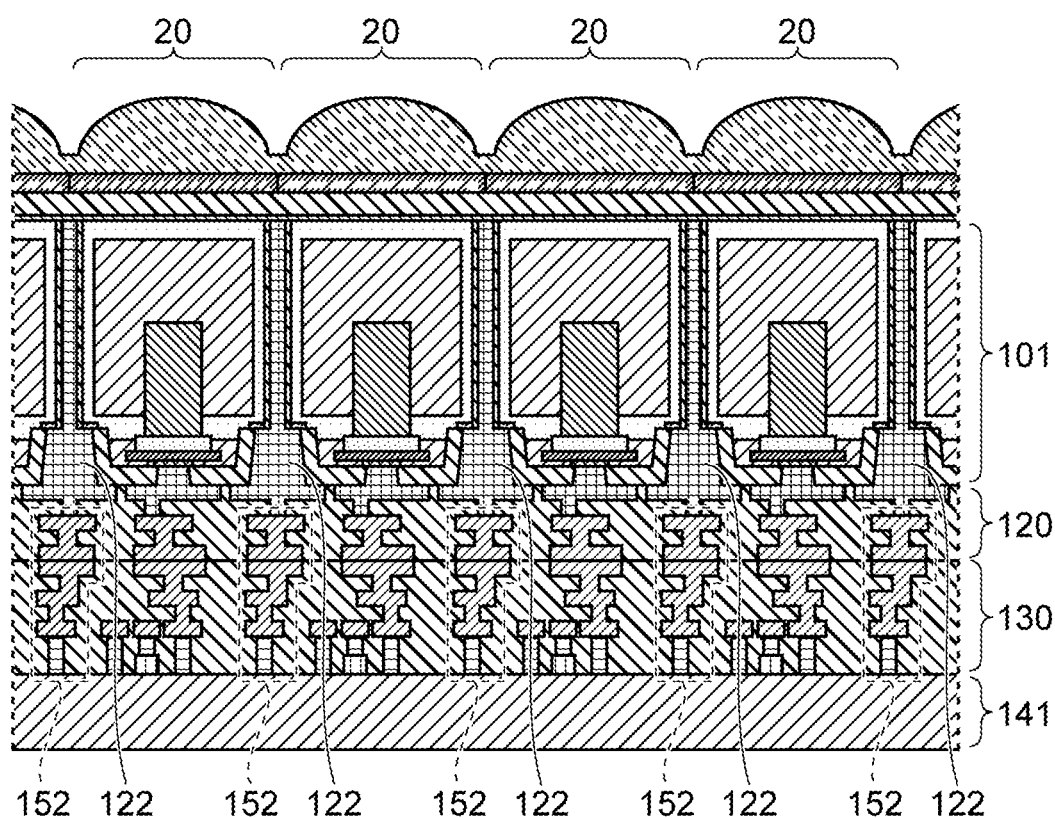
FIG. 25 is a diagram illustrating an example of connection wiring for anodes according to the first embodiment.

FIG. 25 is a diagram illustrating an example of connection wiring for anodes according to the first embodiment. As illustrated in FIG. 25, according to the first embodiment, wirings 152 for applying the reverse bias voltage V_SPAD is connected to the anode electrodes 122 of each SPAD pixel 20 in a one-to-one manner.

However, for example, as can be seen with reference to FIG. 7, the anode electrodes 122 are continued between the plurality of SPAD pixels 20. For example, the anode electrodes 122 are electrically connected between all the SPAD pixels 20 arranged in the SPAD array unit 11.

Therefore, a configuration in which the wirings 152 are provided for the anode electrodes 122 of the respective SPAD pixels 20 in the one-to-one manner is not essential.

Figure 26:
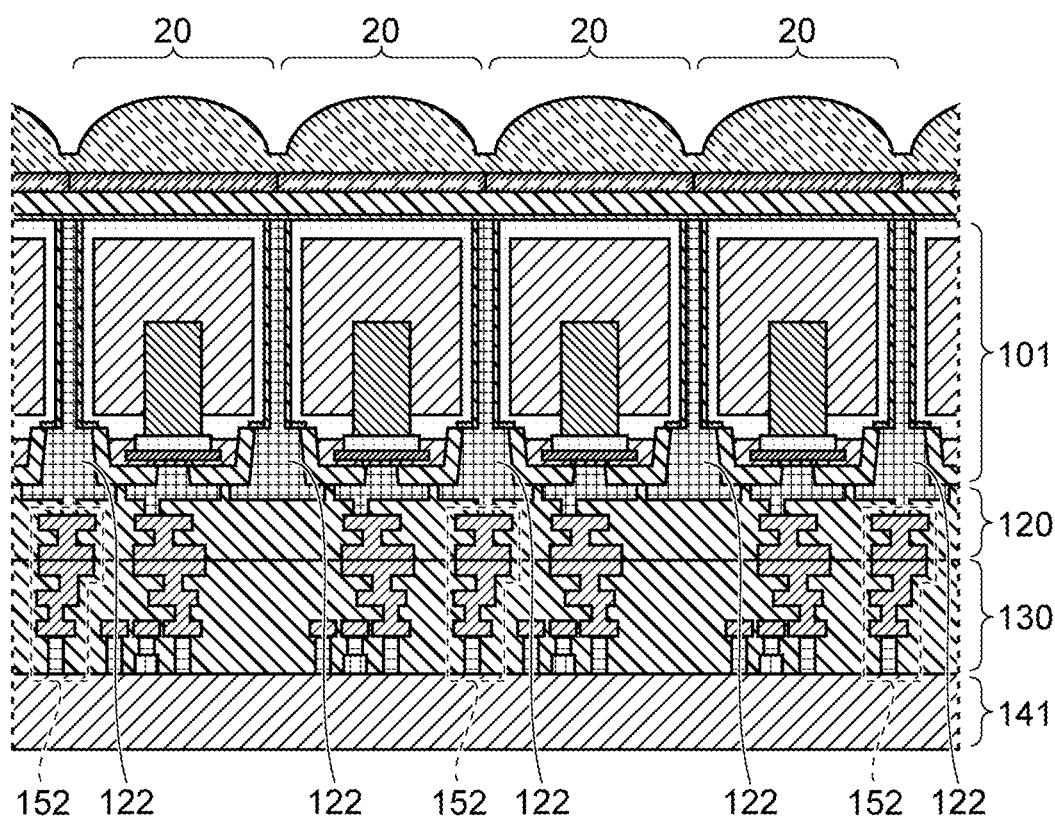
FIG. 26 is a diagram illustrating an example of the connection wiring for the anodes according to a fifth modification of the first embodiment.
Figure 27:
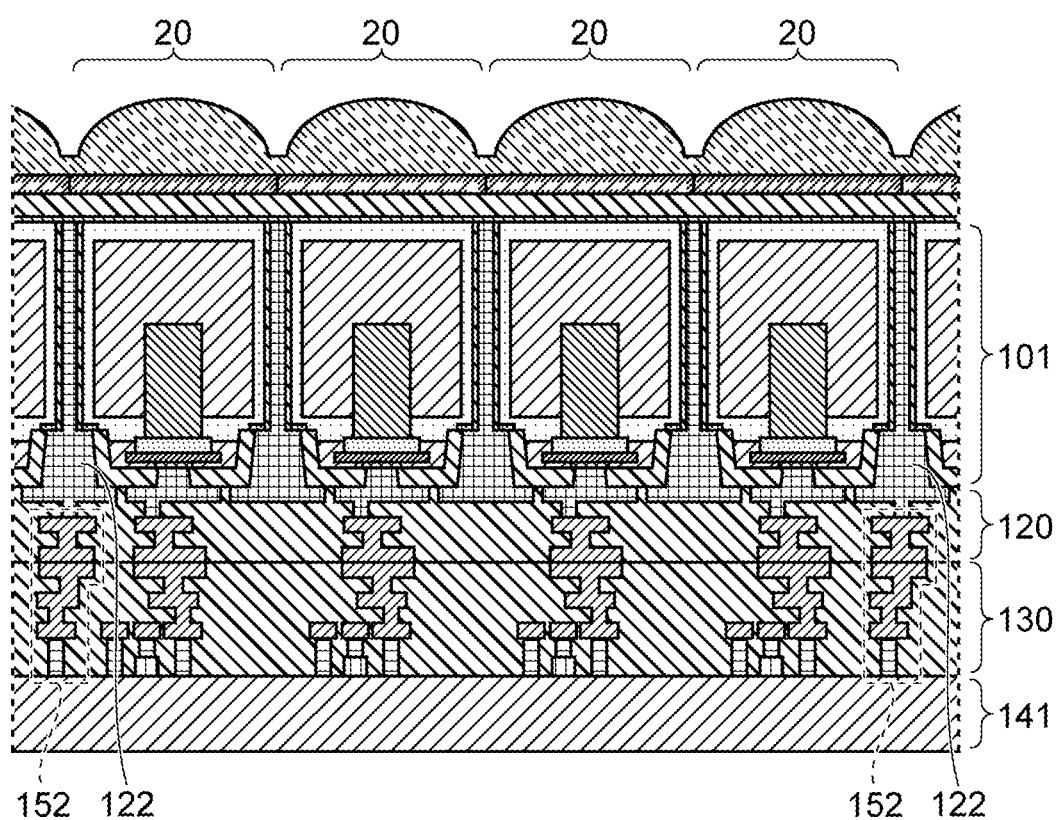
FIG. 27 is a diagram illustrating another example of the connection wiring for the anodes according to the fifth modification of the first embodiment.

The number of the wirings 152 to be arranged may be reduced, such as, the wiring 152 is provided for every other SPAD pixel 20, as illustrated in FIG. 26, or the wiring 152 is provided for every three SPAD pixels 20, as illustrated in FIG. 27.

Figure 28:
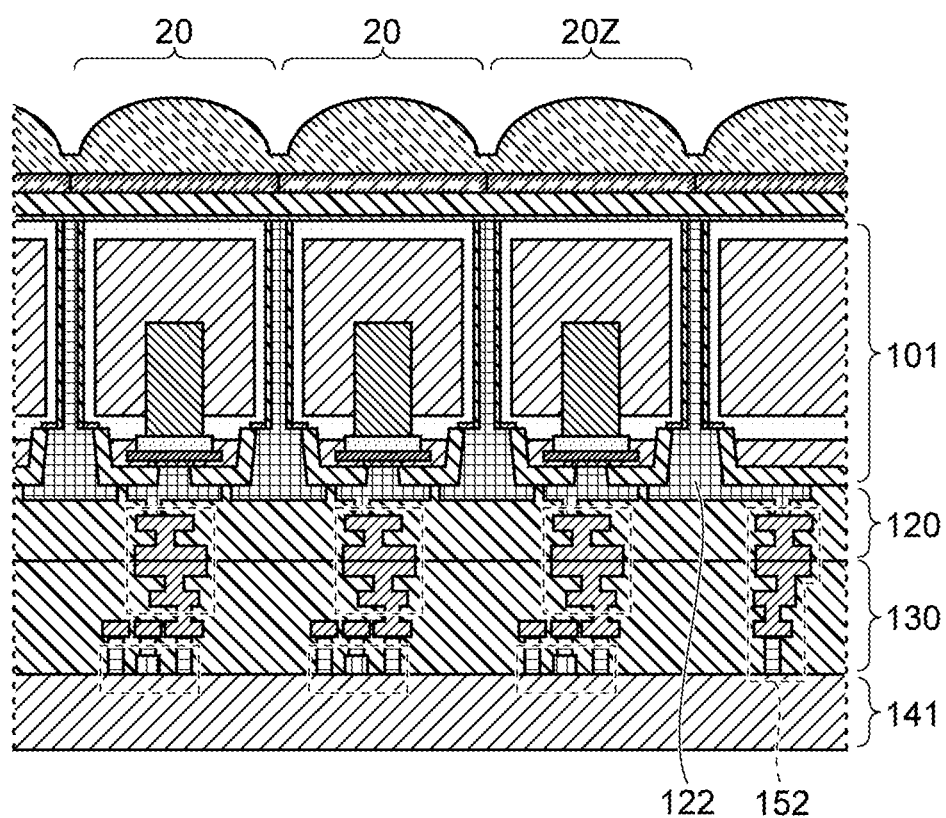
FIG. 28 is a diagram illustrating further another example of the connection wiring for the anodes according to the fifth modification of the first embodiment.

Alternatively, as illustrated in an example of FIG. 28, the wiring 152 may be provided for at least one of SPAD pixels 20Z that are located on the outermost periphery of the SPAD array unit 11 so that the wirings 152 are not provided for the other SPAD pixels 20 and 20Z.

As described above, the reduction of the number of the wirings 152 makes it possible to simplify a wiring pattern, and thus, it is possible to achieve simplification of the manufacturing process, reduction in manufacturing cost, and the like.

Note that in the above embodiment and the modifications thereof, examples of the N–type cathode and the P– type anode have been described, but the present invention is not limited to such a combination, and different types of cathode and anode, such as a P–type cathode and an N–type anode, may be employed.

2. Second Embodiment

Next, a solid-state imaging device and an electronic device according to a second embodiment will be described in detail with reference to the drawings.

The SPAD pixels 20, 20a, 20b, 20c, and 20d according to the first embodiment and the modifications thereof described above are not limited to the electronic device 1 as the imaging device that acquires image data of a color image or the like, and can also be used for, for example, an electronic device as a distance measuring device that measures a distance to an object.

Figure 29:
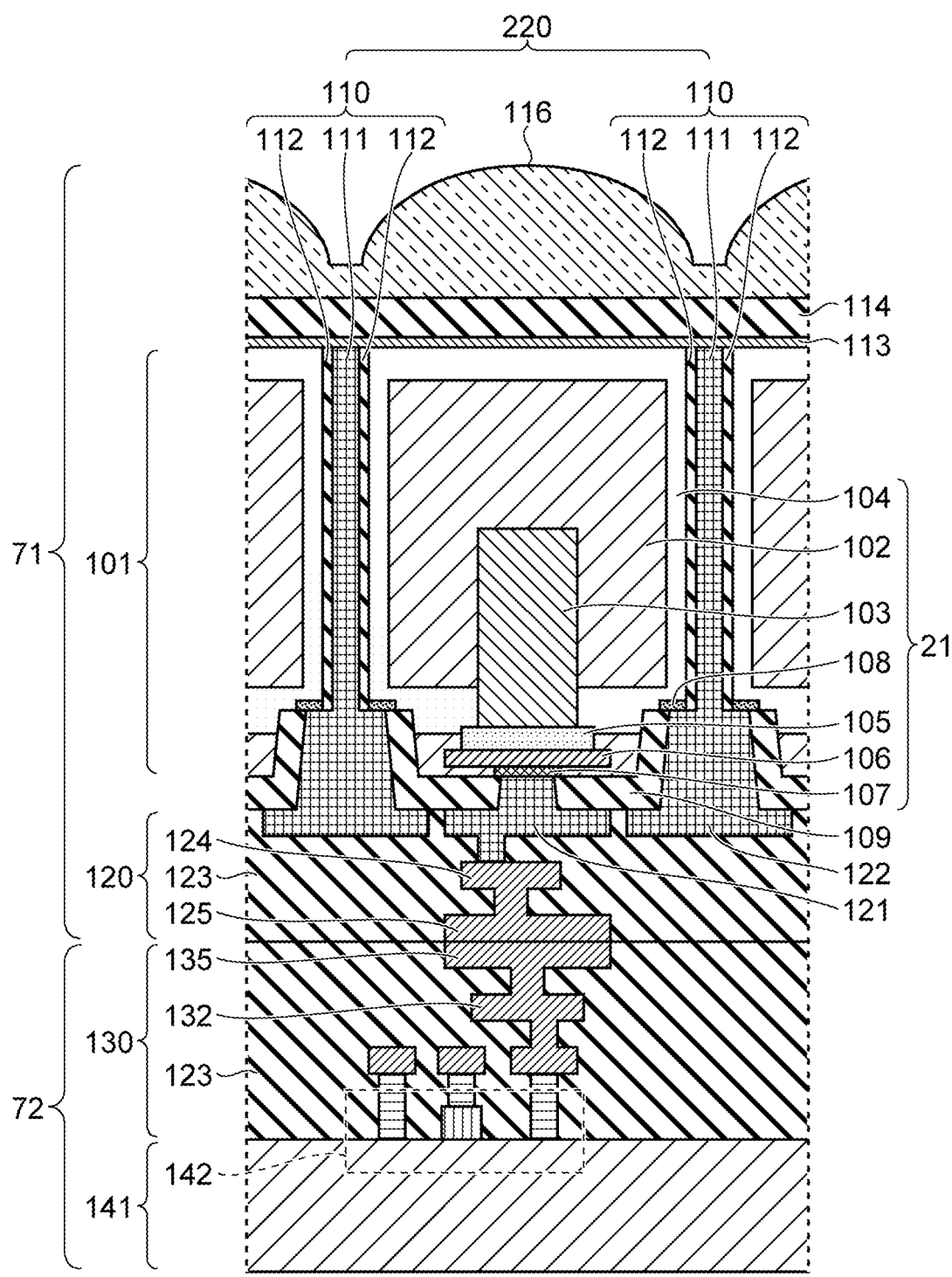
FIG. 29 is a vertical cross-sectional view illustrating an example of a cross-sectional structure as viewed from a plane perpendicular to a light incident surface of a SPAD pixel according to a second embodiment.

FIG. 29 is a vertical cross-sectional view illustrating an example of a cross-sectional structure as viewed from a plane perpendicular to a light incident surface of a SPAD pixel according to the second embodiment. As illustrated in FIG. 29, a SPAD pixel 220 has a structure similar to the cross-sectional structure described in the first embodiment with reference to FIG. 6 and the like, and in the structure, the color filter 115 is omitted.

In this way, even in a case where the SPAD pixel 220 is used for the electronic device being the distance measuring device, as in the first embodiment, shift of the position of the anode contact 108 relative to the position of the cathode contact 107 and the N+type semiconductor region 106, in the height direction makes it possible to increase the distance from the anode contact 108 to the cathode contact 107 and/or the N+type semiconductor region 106 without increasing the size of the SPAD pixel 220 in a lateral direction (direction parallel to the incident surface). Therefore, it is possible to suppress the occurrence of the tunneling effect without increasing the pixel size, and thus, the avalanche amplification is stably generated while suppressing a decrease in resolution.

The other configurations, operations, and effects may be similar to those in the above-described embodiments or the modifications thereof, and detailed description thereof will be omitted here.

3. Third Embodiment

Next, a solid-state imaging device and an electronic device according to a third embodiment will be described in detail with reference to the drawings.

In the above-described embodiment and the modifications thereof, examples of the element isolation portion 110 of FFTI type in which the second trench penetrates the semiconductor substrate 101 from the surface side to the back surface side have been described, but as described above, the element isolation portion 110 is not limited to the FFTI type.

Figure 30:
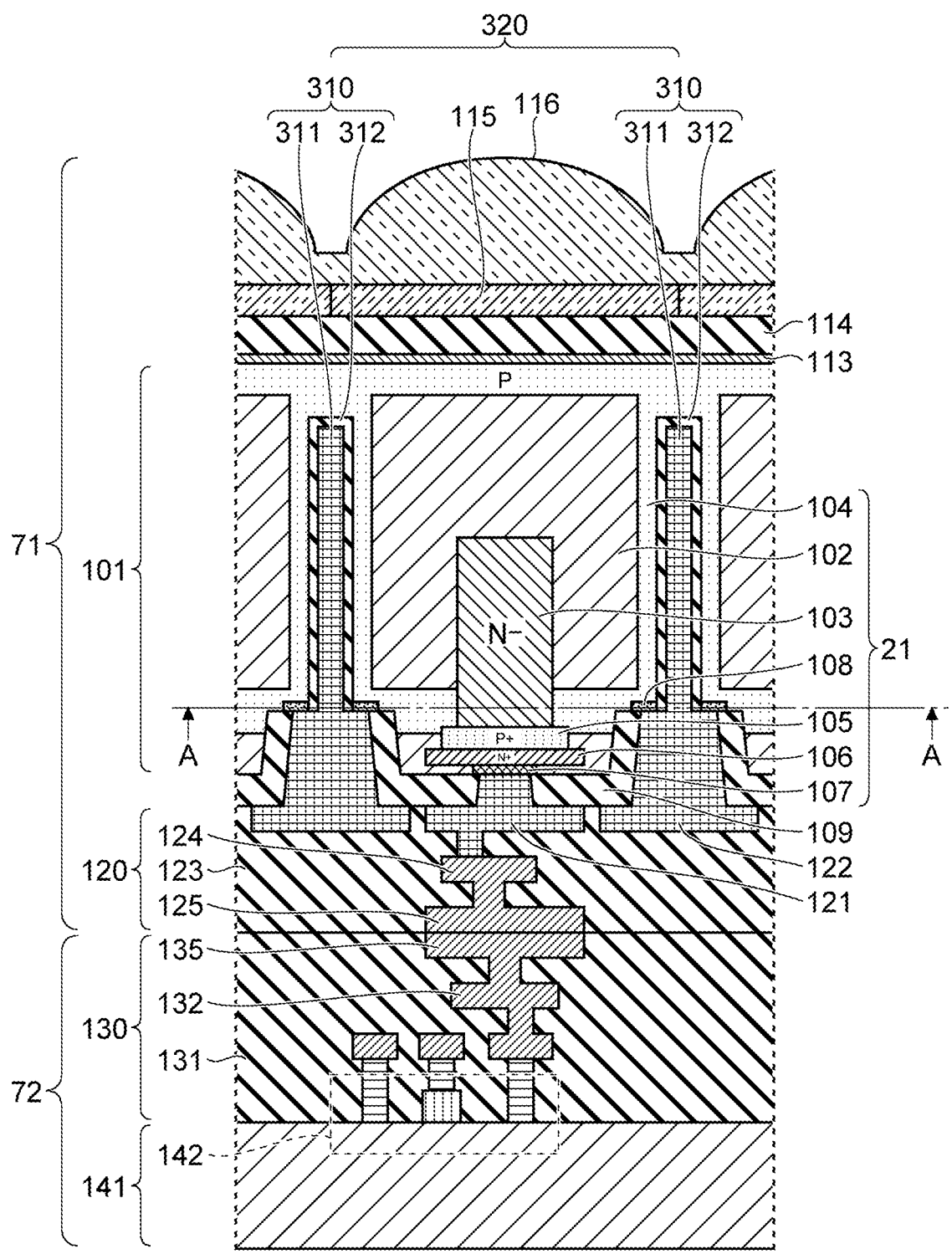
FIG. 30 is a vertical cross-sectional view illustrating an example of a cross-sectional structure as viewed from a plane perpendicular to a light incident surface of a SPAD pixel according to a third embodiment.

FIG. 30 is a vertical cross-sectional view illustrating an example of a cross-sectional structure as viewed from a plane perpendicular to a light incident surface of a SPAD pixel according to the third embodiment. As illustrated in FIG. 30, a SPAD pixel 320 has a structure similar to the cross-sectional structure described in the first embodiment with reference to FIG. 6 and the like, and in the structure, an element isolation portion 310 of DTI type is used in place of the element isolation portion 110 of FFTI type.

The element isolation portion 310 of DTI type includes an insulating film 312 configured to cover the inner side surface and a bottom surface of the second trench, and a light-shielding film 311 configured to fill the inside of the second trench in which the inner surface is covered with the insulating film 312, in the second trench formed in the semiconductor substrate 101 from the surface side (lower side in the drawing) to the extent that the second trench does not reach the back surface.

Such an element isolation portion 310 can be achieved by, for example, using the second trench formed shallowly or the semiconductor substrate 101 large in thickness.

As described above, according to the present embodiment, the element isolation portion 310 of DTI type that is formed from the surface side of the semiconductor substrate 101 is used. This makes it possible to facilitate the process of thinning the semiconductor substrate 101 from the back surface side.

Furthermore, use of the element isolation portion 310 of DTI type that is formed from the surface side of the semiconductor substrate 101 provides the P-type semiconductor region 104 that is not isolated for each SPAD pixel 320 on the back surface side of the semiconductor substrate 101. Therefore, a variation in electric field between the SPAD pixels 320 caused by a variation in contact resistance between the P-type semiconductor regions 104 and the anode contacts 108 is suppressed, the electric fields in the respective SPAD pixels 320 are equalized, and thus, the yield of the image sensors 10 can be improved.

The other configurations, operations, and effects may be similar to those in the above-described embodiments or the modifications thereof, and detailed description thereof will be omitted here.

4. Fourth Embodiment

Next, a solid-state imaging device and an electronic device according to a fourth embodiment will be described in detail with reference to the drawings.

Figure 31:
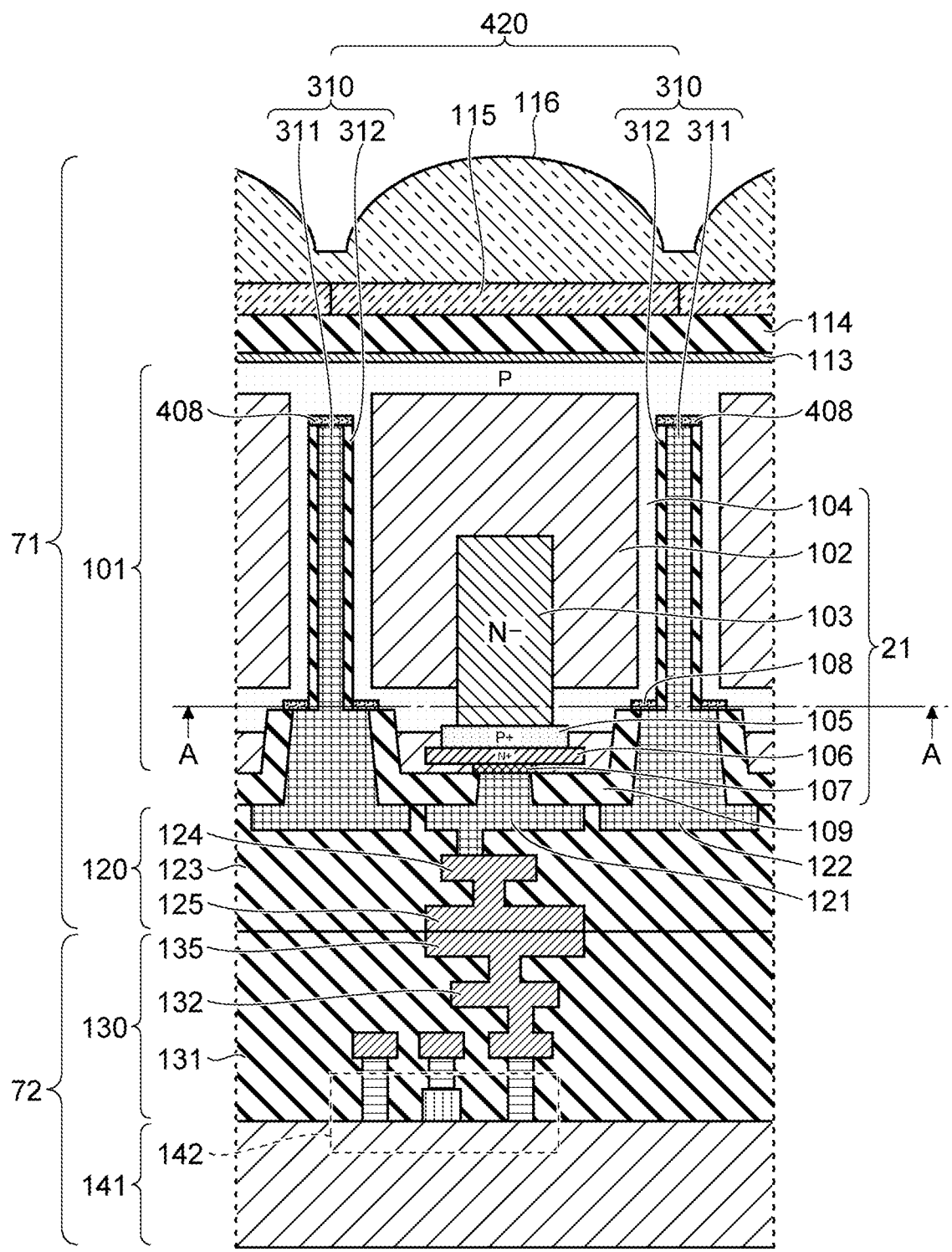
FIG. 31 is a vertical cross-sectional view illustrating an example of a cross-sectional structure as viewed from a plane perpendicular to a light incident surface of a SPAD pixel according to a fourth embodiment.

FIG. 31 is a vertical cross-sectional view illustrating an example of a cross-sectional structure as viewed from a plane perpendicular to a light incident surface of a SPAD pixel according to the fourth embodiment. As illustrated in FIG. 31, a SPAD pixel 420 has, for example, a configuration similar to that of the SPAD pixel 320 descried in the third embodiment with reference to FIG. 30, and in the configuration, an anode contact 408 is provided at the bottom of the second trench.

According to such a structure, the light-shielding film 311 electrically continuous from the anode electrode 122 is electrically connected to the P-type semiconductor region 104 on the back surface side of the semiconductor substrate 101 via the anode contact 408 at the bottom of the second trench. Therefore, the contact resistance between the P-type semiconductor region 104 and the anode contact 108 can be further reduced, and the variation in the contact resistance can be suppressed, and thus, the variation in the electric field between the SPAD pixels 320 can be further suppressed. Therefore, the electric field between the SPAD pixels 320 is further equalized, and thereby, the yield of the image sensors 10 can be further improved.

The other configurations, operations, and effects may be similar to those in the above-described embodiments or the modifications thereof, and detailed description thereof will be omitted here.

5. Fifth Embodiment

Next, a solid-state imaging device and an electronic device according to a fifth embodiment will be described in detail with reference to the drawings.

In the third and fourth embodiments described above, examples of the element isolation portion 310 of DTI type provided in the second trench formed from the surface side of the semiconductor substrate 101 have been described. Meanwhile, in the fifth embodiment, an example of an element isolation portion of RDTI type that is provided in the second trench formed from the back surface side of the semiconductor substrate 101 is described.

Figure 32:
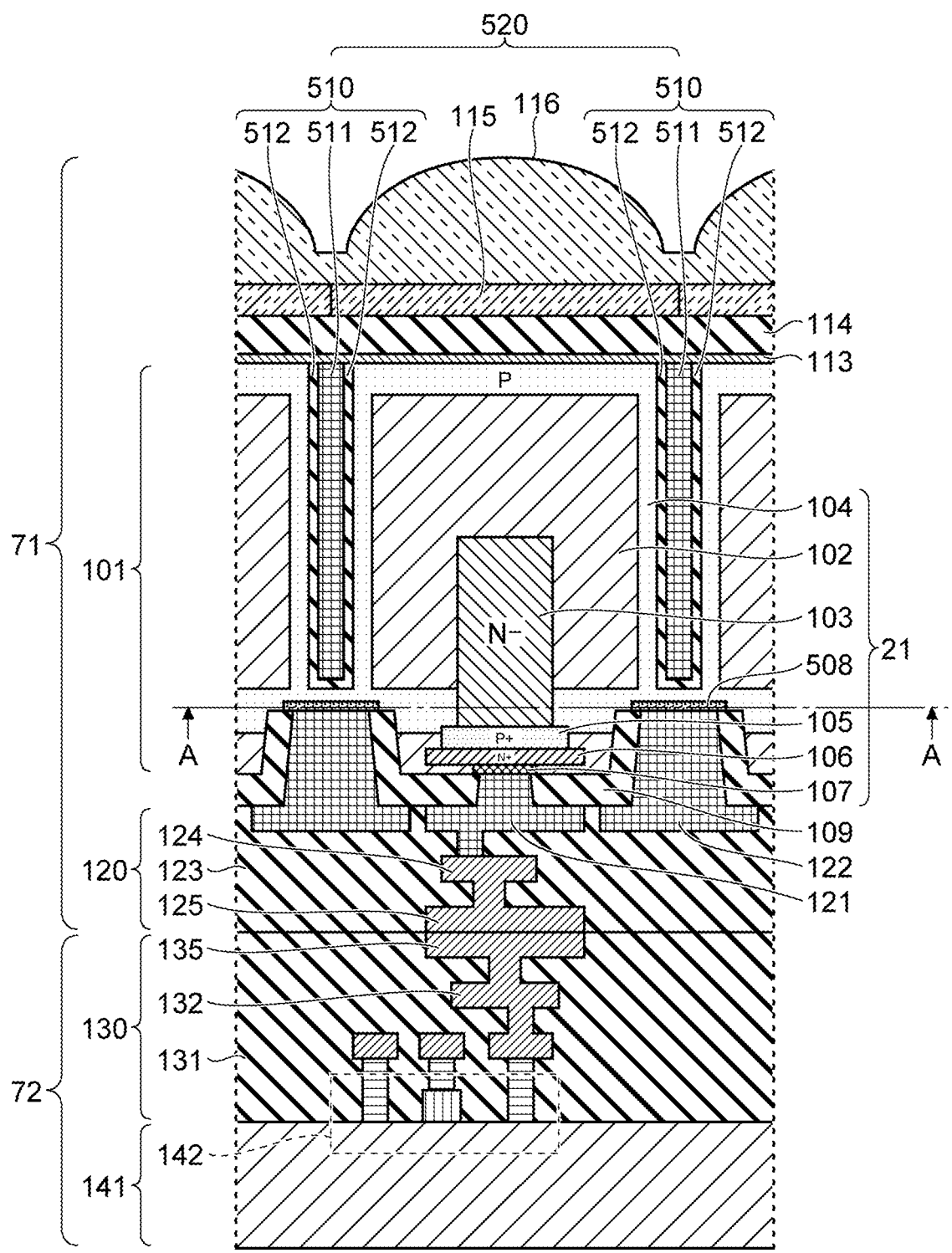
FIG. 32 is a vertical cross-sectional view illustrating an example of a cross-sectional structure as viewed from a plane perpendicular to a light incident surface of a SPAD pixel according to a fifth embodiment.

FIG. 32 is a vertical cross-sectional view illustrating an example of a cross-sectional structure as viewed from a plane perpendicular to a light incident surface of a SPAD pixel according to the fifth embodiment. As illustrated in FIG. 32, a SPAD pixel 520 has a structure similar to, for example, the cross-sectional structure described in the third embodiment with reference to FIG. 30, and in the structure, an element isolation portion 510 of RDTI type is used in place of the element isolation portion 110 of FFTI type and an anode contact 508 is used in place of the anode contact 108.

The element isolation portion 510 of RDTI type includes an insulating film 512 configured to cover the inner side surface and bottom surface of the second trench, and a light-shielding film 511 configured to fill the inside of the second trench in which the inner surface is covered with the insulating film 512, in the second trench formed in the semiconductor substrate 101 from the back surface side (upper side in the drawing) to the extent that the second trench does not reach the surface.

Such a structure makes it possible to isolate the anode electrode 122 and the element isolation portion 510 from each other, forming the anode contact 508 on the entire back surface of the anode electrode 122. Therefore, the contact resistance between the P-type semiconductor region 104 and the anode contact 108 can be further reduced, and thus, the SPAD pixel 520 with better characteristics can be achieved.

Furthermore, the second trench can be formed from the back surface side of the semiconductor substrate 101, and thus, for example, the process of forming the element isolation portion 510 is facilitated as compared with forming the element isolation portion 310 of DTI type according to the third or fourth embodiment.

The other configurations, operations, and effects may be similar to those in the above-described embodiments or the modifications thereof, and detailed description thereof will be omitted here.

6. Sixth Embodiment

Next, a solid-state imaging device and an electronic device according to a sixth embodiment will be described in detail with reference to the drawings.

In the above embodiments and the modifications thereof, for example, examples of one photodiode 21 that is provided for one color filter 115R, 115G, or 115B constituting the color filter array 60 being the Bayer array have been described. However, in a case where photon counting is performed using the avalanche photodiode, even if a plurality of photons is incident on one photodiode 21 in an avalanche amplification, the incidence of the photons is counted as one time. Therefore, in order to more accurately count the number of incident photons, it is preferable to reduce the area of one photodiode. Furthermore, in a case where the illuminance is high, the dynamic range of each SPAD pixel 20 can be expanded by reducing the area of one photodiode.

Figure 33:
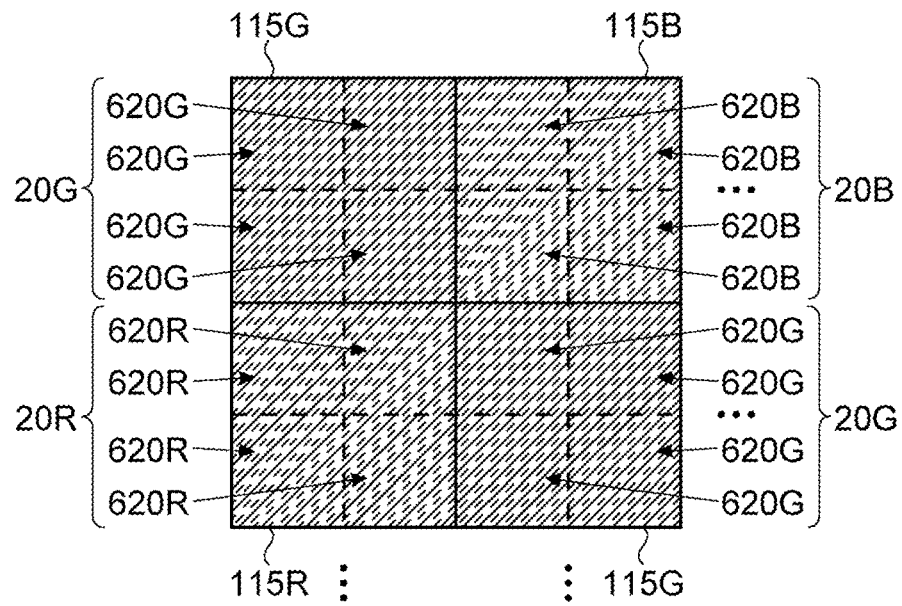
FIG. 33 is a plan view illustrating an example of a planar layout of SPAF pixels according to a sixth embodiment.

Therefore, in the sixth embodiment, as illustrated in the example of FIG. 33, each of SPAD pixels 20R, 20G, and 20B (hereinafter, when the SPAD pixels 20R, 20G, and 20B are not distinguished from each other, the SPAD pixels are denoted by is divided into a plurality of (in this example, four pixels, i.e., 2×2 pixels) SPAD pixels 620R, 620G, or 620B (hereinafter, when the SPAD pixels 620R, 620G, and 620B are not distinguished from each other, the SPAD pixels are denoted by 620). Alternatively, a plurality of SPAD pixels 620, 620G, or 620B shares one color filter 115R, 115G, or 115B.

As described above, dividing one SPAD pixel 20 into a plurality of SPAD pixels 620 makes it possible to reduce the area per one SPAD pixel 620, and thus, the number of incident photons can be counted more accurately. Furthermore, the reduction of the area of one photodiode also makes it possible to expand the dynamic range of each SPAD pixel 20.

Figure 34:
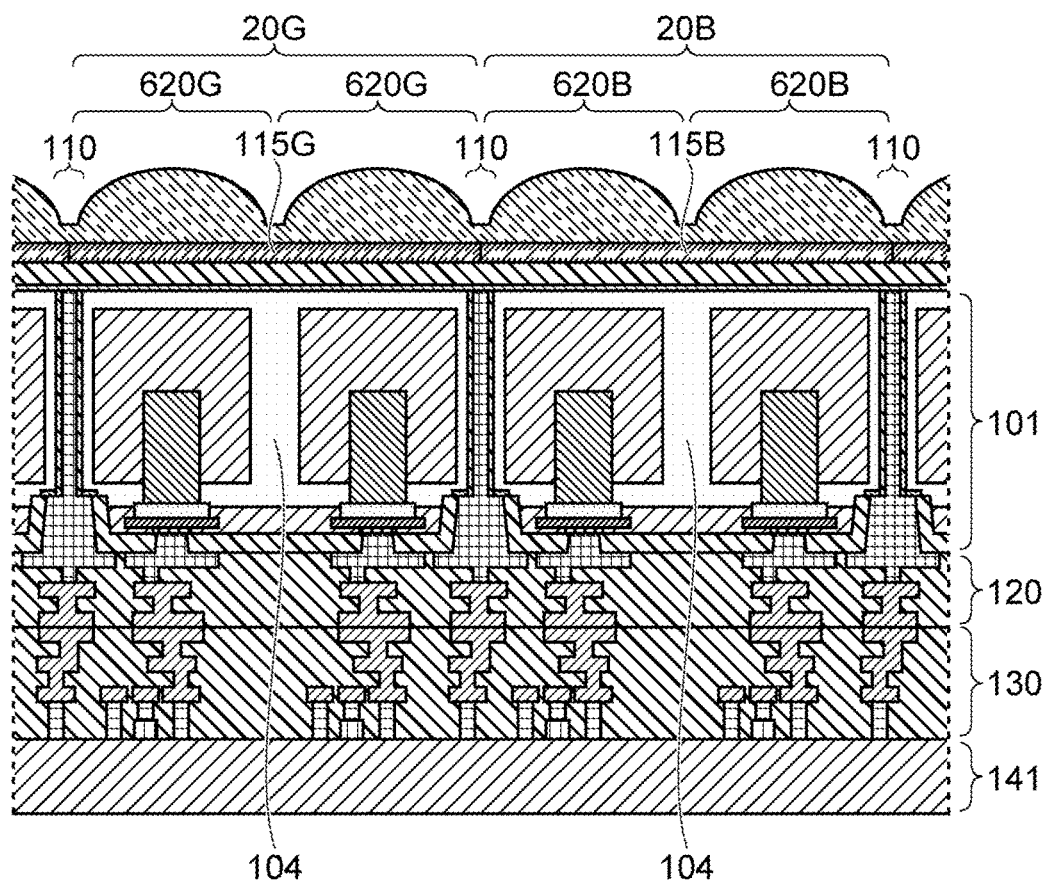
FIG. 34 is a vertical cross-sectional view illustrating an example of a cross-sectional structure as viewed from a plane perpendicular to light incident surfaces of SPAD pixels according to the sixth embodiment.

Note that as illustrated in FIG. 34, the element isolation portions 110 may not be provided between the SPAD pixels 620 obtained by dividing one SPAD pixel 20. In that configuration, instead of the element isolation portions 110, the P-type semiconductor region 104 may be arranged between the SPAD pixels 620. This makes it possible to reduce the pixel pitch as compared with providing the element isolation portions 110, further reducing the size of the image sensor 10.

The other configurations, operations, and effects may be similar to those in the above-described embodiments or the modifications thereof, and detailed description thereof will be omitted here.

7. Seventh Embodiment

Next, a solid-state imaging device and an electronic device according to a seventh embodiment will be described in detail with reference to the drawings.

In the above sixth embodiment, the example in which the P-type semiconductor region 104 is arranged between the plurality of SPAD pixels 620 obtained by dividing one SPAD pixel 20 has been described, but the present invention is not limited to such a structure.

Figure 35:
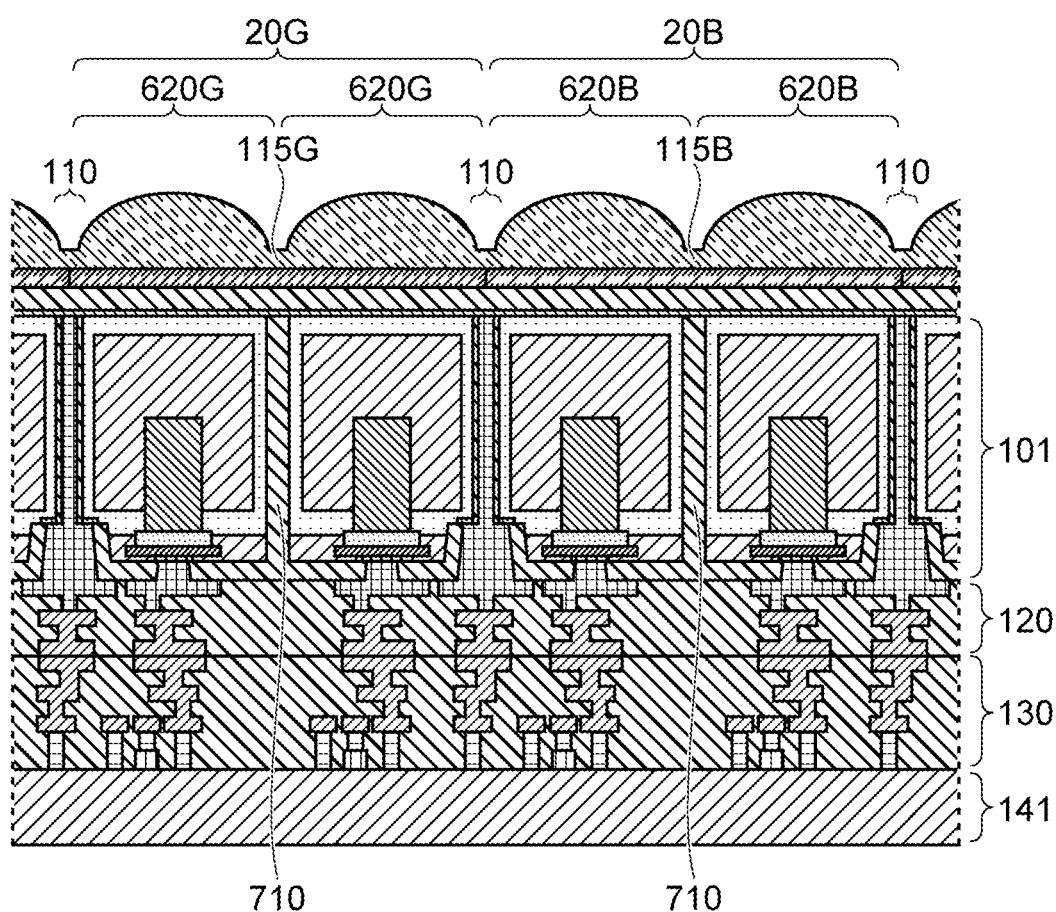
FIG. 35 is a vertical cross-sectional view illustrating an example of a cross-sectional structure as viewed from a plane perpendicular to light incident surfaces of SPAD pixels according to a seventh embodiment.

For example, as illustrated in FIG. 35, a trench may be provided in adjacent SPAD pixels 620 to provide a structure in which an insulating film 710 is embedded in the trench.

Such a structure makes it possible to suppress optical crosstalk between adjacent SPAD pixels 620, enabling more accurate counting of the number of incident photons.

The other configurations, operations, and effects may be similar to those in the above-described embodiments or the modifications thereof, and detailed description thereof will be omitted here.

8. Eighth Embodiment

Next, a solid-state imaging device and an electronic device according to an eighth embodiment will be described in detail with reference to the drawings.

Figure 36:
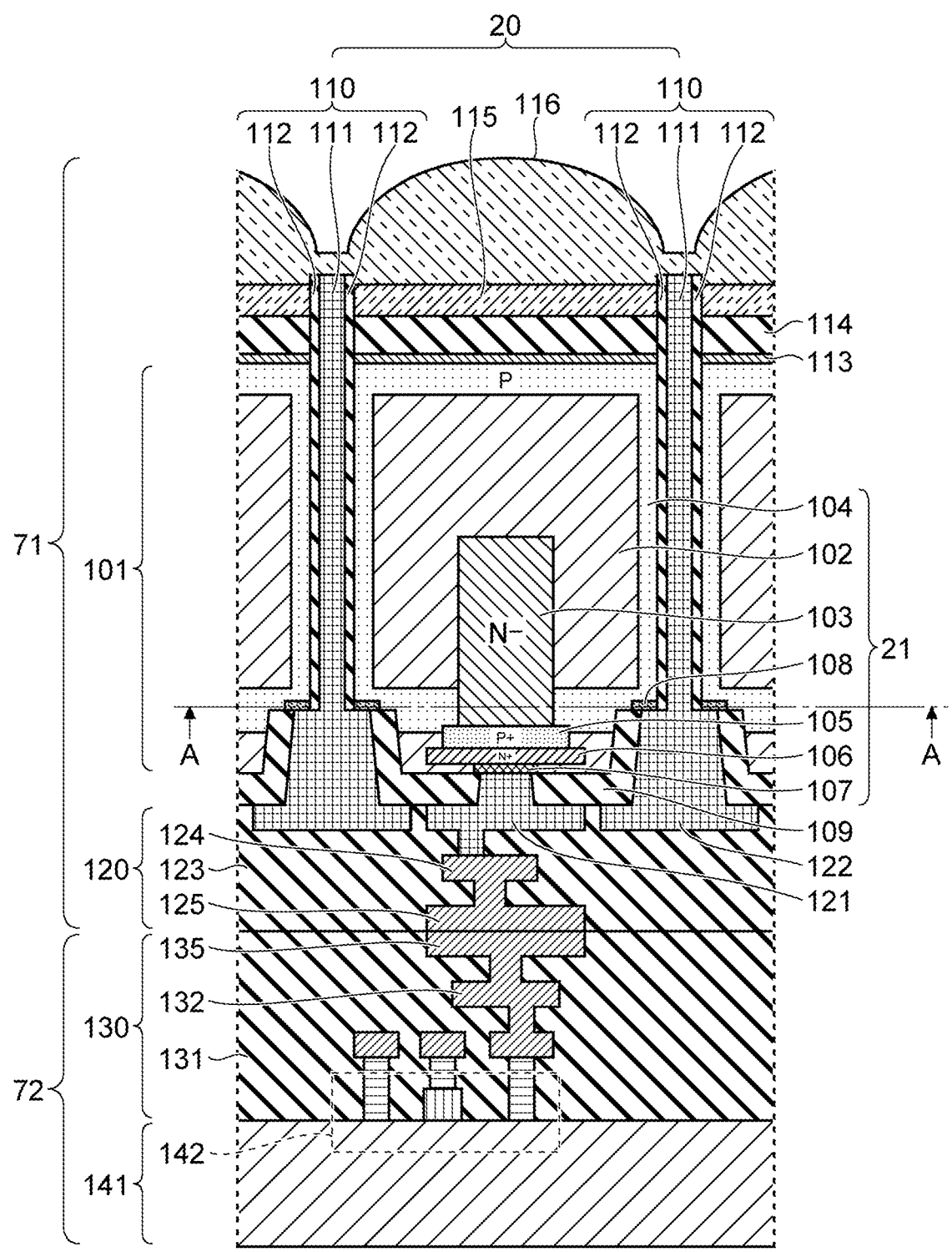
FIG. 36 is a vertical cross-sectional view illustrating an example of a cross-sectional structure as viewed from a plane perpendicular to a light incident surface of a SPAD pixel according to an eighth embodiment.

The element isolation portions 110 and 510 in the above embodiments and the modifications thereof are not limited to the semiconductor substrate 101 as in the example illustrated in FIG. 36, and, for example, may penetrate the color filter 115.

As described above, the structure in which the element isolation portions 110 penetrate the color filter 115 and protrude above the color filter 115 makes it possible to reduce the crosstalk between the adjacent SPAD pixels 20.

The other configurations, operations, and effects may be similar to those in the above-described embodiments or the modifications thereof, and detailed description thereof will be omitted here.

9. Example of Application to Electronic Device

The solid-state imaging element described above is applicable to various electronic devices, for example, an imaging device such as a digital still camera or a digital video camera, a mobile phone having an imaging function, or another device having the imaging function.

Figure 37:
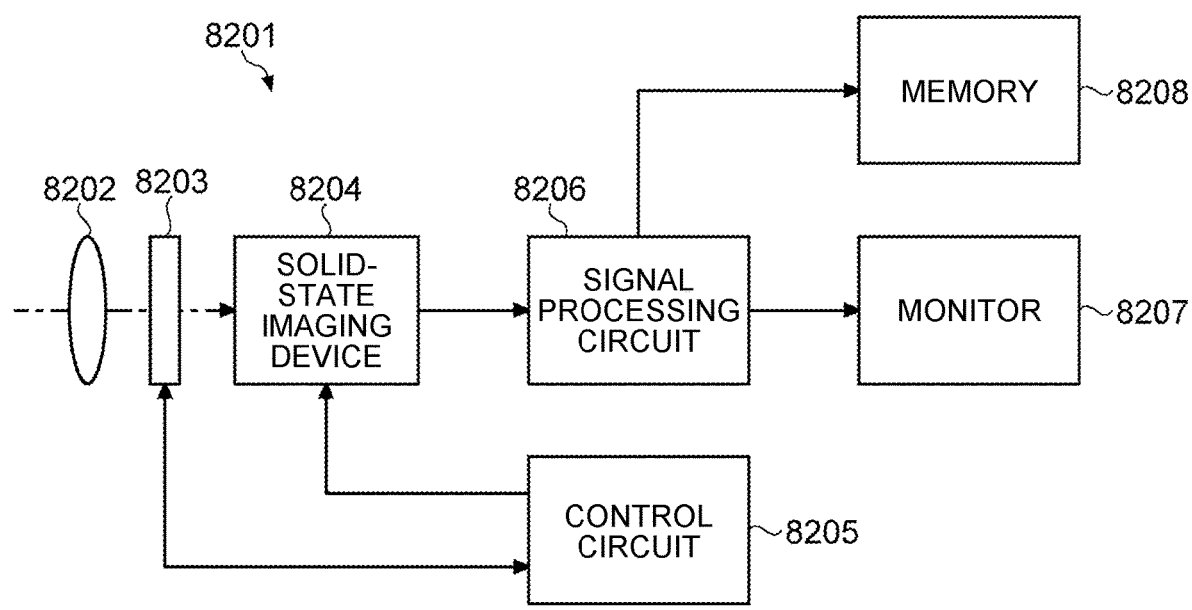
FIG. 37 is a diagram illustrating a configuration of an imaging device and the electronic device using a solid-state imaging element to which the present technology is applied.

FIG. 37 is a block diagram illustrating a configuration example of an imaging device as the electronic device to which the present technology is applied.

an imaging device 8201 illustrated in FIG. 37 includes an optical system 8202, a shutter device 8203, a solid-state imaging element 8204, a drive circuit 8205, a signal processing circuit 8206, a monitor 8207, and a memory 8208, and the imaging device 8201 is configured to capture a still image and a moving image.

The optical system 8202 has one or a plurality of lenses, guides light (incident light) from an object to the solid-state imaging element 8204, and forms an image on a light-receiving surface of the solid-state imaging element 8204.

The shutter device 8203 is arranged between the optical system 8202 and the solid-state imaging element 8204, and controls a light irradiation period and a light shielding period for the solid-state imaging element 8204 according to the control of a drive circuit 1005.

The solid-state imaging element 8204 includes a package including the solid-state imaging element described above. The solid-state imaging element 8204 accumulates signal charge for a certain period, according to light focused on the light-receiving surface via the optical system 8202 and the shutter device 8203. The signal charge accumulated in the solid-state imaging element 8204 is transferred according to a drive signal (timing signal) supplied from the drive circuit 8205.

The drive circuit 8205 outputs the drive signal controlling a transfer operation of the solid-state imaging element 8204 and a shutter operation of the shutter device 8203 to drive the solid-state imaging element 8204 and the shutter device 8203.

The signal processing circuit 8206 performs various signal processing on the signal charge output from the solid-state imaging element 8204. An image (image data) obtained by performing the signal processing by the signal processing circuit 8206 is supplied to the monitor 8207 and displayed thereon, or supplied to the memory 8208 and stored (recorded) therein.

In the imaging device 8201 configured as described above as well, application of the solid-state imaging device 10 in place of the solid-state imaging element 8204 described above makes it possible to achieve imaging with low noise in all pixels.

10. Example of Application to Mobile Object

The technology according to the present disclosure is applicable to various products. For example, the technology according to the present disclosure may be achieved as a device mounted on any type of mobile object, such as an automobile, electric vehicle, hybrid electric vehicle, motorcycle, bicycle, personal mobility, airplane, drone, ship, robot, construction machine, or agricultural machine (tractor).

Figure 38:
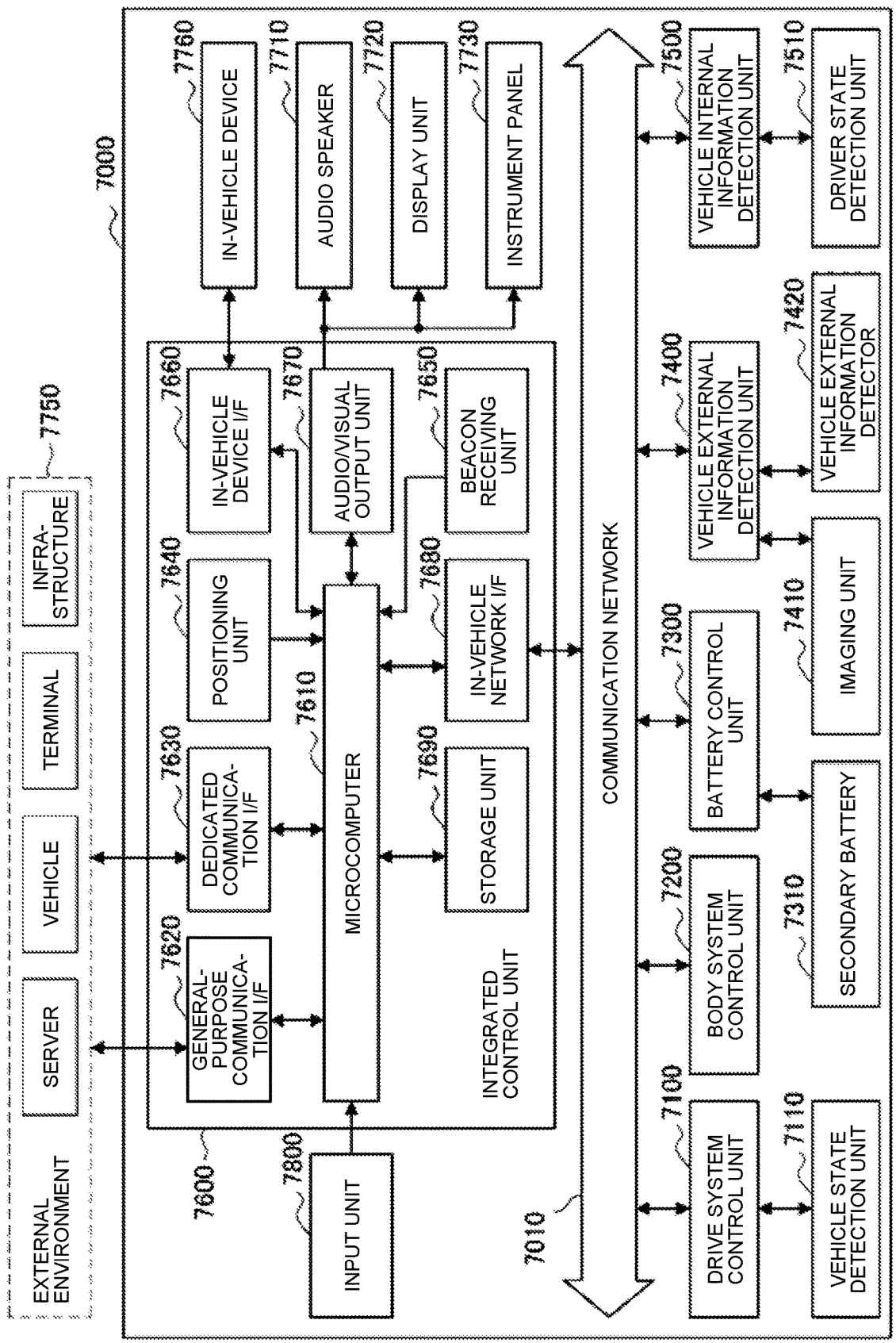
FIG. 38 is a block diagram illustrating an example of a schematic configuration of a vehicle control system.

FIG. 38 is a block diagram illustrating an example of a schematic configuration of a vehicle control system 7000 that is an example of a mobile object control system to which the technology according to the present disclosure is applicable. The vehicle control system 7000 includes a plurality of electronic control units that is connected via a communication network 7010. In the example illustrated in FIG. 38, the vehicle control system 7000 includes a drive system control unit 7100, a body system control unit 7200, a battery control unit 7300, a vehicle external information detection unit 7400, a vehicle internal information detection unit 7500, and an integrated control unit 7600. The communication network 7010 connecting a plurality of these control units may be, for example, an in-vehicle communication network according to any standard, such as controller area network (CAN), local interconnect network (LIN), local area network (LAN), or FlexRay (registered trademark).

Each of the control units includes a microcomputer configured to perform arithmetic processing according to various programs, a storage unit configured to store programs executed by the microcomputer, parameters used for various calculations, and the like, and a drive circuit configured to drive various devices to be controlled. Each control unit includes a network I/F for communication with another control unit via the communication network 7010, and a communication I/F for communication with a device, sensor, or the like inside or outside the vehicle in a wired or wireless manner. FIG. 38 illustrates, as a functional configuration of the integrated control unit 7600, a microcomputer 7610, a general-purpose communication I/F 7620, a dedicated communication I/F 7630, a positioning unit 7640, a beacon receiving unit 7650, an in-vehicle device I/F 7660, an audio/visual output unit 7670, an in-vehicle network I/F 7680, and a storage unit 7690. Likewise, each of the other control units also includes the microcomputer, the communication I/F, the storage unit, and the like.

The drive system control unit 7100 controls the operation of devices relating to the drive system of the vehicle, according to various programs. For example, the drive system control unit 7100 functions as a control device for a driving force generation device for generating a driving force of the vehicle, such as an internal combustion engine or a driving motor, a driving force transmission mechanism for transmitting the driving force to wheels, a steering mechanism for adjusting a steering angle of the vehicle, a braking device for generating a braking force of the vehicle, and the like. The drive system control unit 7100 may have a function as a control device such as an antilock brake system (ABS) or an electronic stability control (ESC).

A vehicle state detection unit 7110 is connected to the drive system control unit 7100. The vehicle state detection unit 7110 includes, for example, at least one of a gyroscope sensor configured to detect an angular velocity of axial rotational motion of the vehicle body, an acceleration sensor configured to detect acceleration of the vehicle, or a sensor configured to detect an operation amount of an accelerator pedal, an operation amount of a brake pedal, a steering angle of a steering wheel, an engine speed, a wheel rotation speed, or the like. The drive system control unit 7100 performs arithmetic processing by using a signal input from the vehicle state detection unit 7110, and controls an internal combustion engine, a driving motor, an electric power steering device, a brake device, or the like.

The body system control unit 7200 controls the operations of various devices mounted on the vehicle body, according to various programs. For example, the body system control unit 7200 functions as a control device for a keyless entry system, a smart key system, a power window device, or various lamps, such as a headlight, back-up light, brake light, blinker, or fog light. In this case, a radio wave transmitted from a portable device that substitutes for a key or signals of various switches can be input to the body system control unit 7200. The body system control unit 7200 receives an input of the radio waves or signals to control a door lock device, the power window device, the lamps, and the like of the vehicle.

The battery control unit 7300 controls a secondary battery 7310 that is a power supply for the driving motor, according to various programs. For example, information such as battery temperature, battery output voltage, or a remaining capacity of a battery is input to the battery control unit 7300, from a battery device including the secondary battery 7310. The battery control unit 7300 performs arithmetic processing by using these signals, and adjusts/controls the temperature of the secondary battery 7310 or controls a cooling device or the like included in the battery device.

The vehicle external information detection unit 7400 detects information outside the vehicle on which the vehicle control system 7000 is mounted. For example, at least one of an imaging unit 7410 and a vehicle external information detector 7420 is connected to the vehicle external information detection unit 7400. The imaging unit 7410 includes at least one of a time of flight (ToF) camera, a stereo camera, a monocular camera, an infrared camera, and other cameras. The vehicle external information detector 7420 includes, for example, at least one of an environment sensor configured to detect current weather and a surrounding information detection sensor configured to detect another vehicle, an obstacle, a pedestrian, or the like around the vehicle on which the vehicle control system 7000 is mounted.

The environment sensor may include, for example, at least one of a raindrop sensor configured to detect rainy weather, a fog sensor configured to detect fog, a daylight sensor configured to detect a degree of daylight, and a snow sensor configured to detect snowfall. The surrounding information detection sensor may include at least one of an ultrasonic sensor, a radar device, light detection and ranging, laser imaging detection and ranging (LIDAR) device. The imaging unit 7410 and the vehicle external information detector 7420 may be provided as independent sensors or devices, or may be provided as a device in which a plurality of sensors or devices is integrated.

Figure 39:
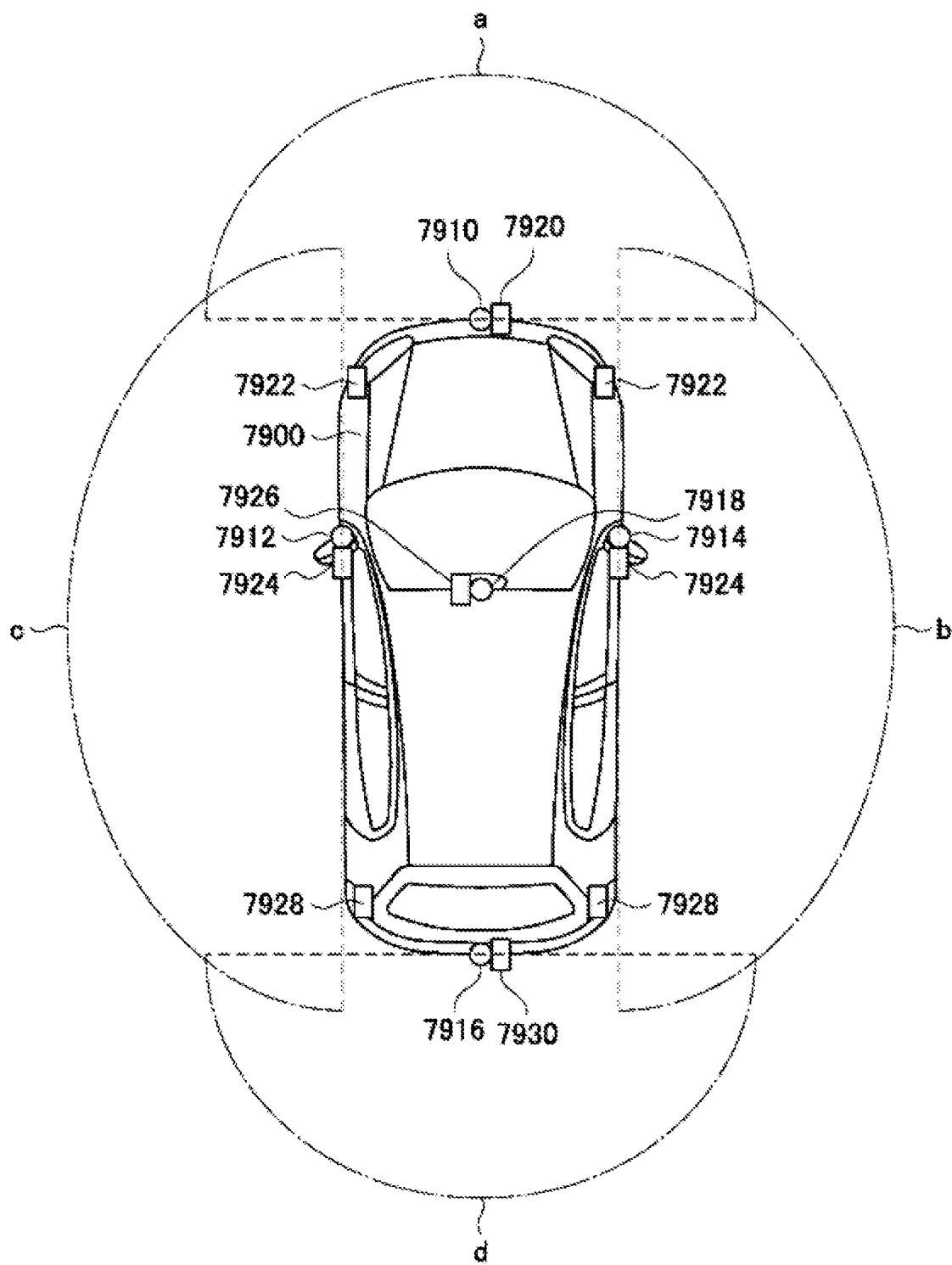
FIG. 39 is an explanatory diagram illustrating an example of installation positions of vehicle external information detectors and imaging units.

Here, FIG. 39 illustrates an example of installation positions of the imaging units 7410 and the vehicle external information detectors 7420. Imaging units 7910, 7912, 7914, 7916, and 7918 are each provided at, for example, at least one of the front nose, side mirrors, rear bumper, back door, and an upper portion of a windshield on the vehicle interior side of a vehicle 7900. The imaging unit 7910 provided at the front nose and the imaging unit 7918 provided at the upper portion of the windshield on the vehicle interior side each mainly acquire an image of an area in front of the vehicle 7900. The imaging units 7912 and 7914 provided at the side mirrors each mainly acquire an image captured from a lateral side of the vehicle 7900. The imaging unit 7916 provided at the rear bumper or the back door mainly acquires an image of an area in back of the vehicle 7900. The imaging unit 7918 provided at the upper portion of the windshield on the vehicle interior side is mainly used to detect a preceding vehicle, pedestrian, obstacle, traffic light, traffic sign, lane, or the like.

Note that FIG. 39 illustrates an example of imaging ranges of the imaging units 7910, 7912, 7914, and 7916. An imaging range a indicates an imaging range of the imaging unit 7910 provided at the front nose, imaging ranges b and c indicate imaging ranges of the imaging units 7912 and 7914 provided at the respective side mirrors, and an imaging range d indicates an imaging range of the imaging unit 7916 provided at the rear bumper or the back door. For example, it is possible to superimpose image data captured by the imaging units 7910, 7912, 7914, and 7916 on each other to obtain an overhead view image of the vehicle 7900 as viewed from above.

Vehicle external information detectors 7920, 7922, 7924, 7926, 7928, and 7930 that are provided at the front, rear, sides, corners, and at the upper portion of the windshield on the vehicle interior side of the vehicle 7900 may be, for example, an ultrasonic sensor or a radar device. The vehicle external information detectors 7920, 7926, and 7930 provided at the front nose, rear bumper, back door, and the upper portion of the windshield on the vehicle interior side of the vehicle 7900 may be, for example, a LIDAR device. These vehicle external information detectors 7920 to 7930 are mainly used to detect a preceding vehicle, pedestrian, obstacle, or the like.

Referring back to FIG. 38, the description will be continued. The vehicle external information detection unit 7400 causes the imaging unit 7410 to capture an image outside the vehicle, and receives the captured image data. Furthermore, the vehicle external information detection unit 7400 receives detection information from the vehicle external information detectors 7420 that is connected to the vehicle external information detection unit 7400. In a case where the vehicle external information detector 7420 is an ultrasonic sensor, a radar device, or a LIDAR device, the vehicle external information detection unit 7400 causes the vehicle external information detector 7420 to emit an ultrasonic wave, electromagnetic wave, or the like, and receives information of a reflected wave received. The vehicle external information detection unit 7400 may perform object detection processing or distance detection processing for a person, a vehicle, an obstacle, a sign, characters on a road surface, or the like, on the basis of the received information. The vehicle external information detection unit 7400 may perform environment recognition processing to recognize rainfall, fog, road surface conditions, or the like, on the basis of the received information. The vehicle external information detection unit 7400 may calculate a distance to the object outside the vehicle, on the basis of the received information.

Furthermore, the vehicle external information detection unit 7400 may perform image recognition processing or distance detection processing to recognize the person, car, obstacle, sign, characters on the road surface, or the like, on the basis of the received image data. The vehicle external information detection unit 7400 may perform processing such as distortion correction or alignment on the received image data and combine image data captured by different imaging units 7410, generating an overhead view image or panoramic image. The vehicle external information detection unit 7400 may perform viewpoint transformation processing by using image data captured by different imaging units 7410.

The vehicle internal information detection unit 7500 detects information inside the vehicle. For example, a driver state detection unit 7510 configured to detect the state of a driver is connected to the vehicle internal information detection unit 7500. The driver state detection unit 7510 may include a camera configured to image the driver, a biological sensor configured to detect biological information of the driver, a microphone configured to collect voice in the vehicle interior, or the like. The biological sensor is provided on a seat surface, the steering wheel, or the like to detect the biological information of an occupant sitting on the seat or the driver holding the steering wheel. The vehicle internal information detection unit 7500 may calculate the degree of fatigue or degree of concentration of the driver or may determine whether the driver is drowsy, on the basis of detection information input from the driver state detection unit 7510. The vehicle internal information detection unit 7500 may perform processing such as noise cancellation processing on voice signals collected.

The integrated control unit 7600 controls the overall operations in the vehicle control system 7000, according to various programs. An input unit 7800 is connected to the integrated control unit 7600. The input unit 7800 is achieved by a device, such as a touch panel, button, microphone, switch, or lever, that is configured to be operated for input by the occupant. Data obtained by performing voice recognition on voice input by the microphone may be input to the integrated control unit 7600. The input unit 7800 may be, for example, a remote control device using infrared ray or any other radio wave, or an external connection device such as a mobile phone or personal digital assistant (PDA) compatible in operation with the vehicle control system 7000. The input unit 7800 may be, for example, a camera, and in this case, the occupant can input information by gesture. Alternatively, data obtained by detecting the movement of a wearable device worn by the occupant may be input. Furthermore, the input unit 7800 may include, for example, an input control circuit or the like that is configured to generate an input signal on the basis of information input by the occupant or the like by using the input unit 7800 and output the input signal to the integrated control unit 7600. The occupant or the like operates the input unit 7800, inputs various data to the vehicle control system 7000 or instructs the vehicle control system 7000 to perform a processing operation.

The storage unit 7690 may include a read only memory (ROM) configured to store various programs executed by the microcomputer, and a random access memory (RAM) configured to store various parameters, calculation results, sensor values, or the like. Furthermore, the storage unit 7690 may be achieved by a magnetic storage device such as a hard disc drive (HDD), a semiconductor storage device, an optical storage device, a magneto-optical storage device, or the like.

The general-purpose communication I/F 7620 is a general-purpose communication I/F configured to mediate communication between various devices in an external environment 7750. In the general-purpose communication I/F 7620, a cellular communication protocol such as Global System of Mobile communications (GSM) (registered trademark), WiMAX (registered trademark), Long Term Evolution (LTE) (registered trademark), or LTE-Advanced (LTE-A), or other wireless communication protocols such as a wireless LAN (also referred to as Wi-Fi (registered trademark)) and Bluetooth (registered trademark) may be implemented. For example, the general-purpose communication I/F 7620 may be connected to a device (e.g., an application server or control server) on an external network (e.g., the Internet, a cloud network, or a business-specific network) via a base station or an access point. Furthermore, for example, the general-purpose communication I/F 7620 may be connected to a terminal (e.g., a terminal of the driver, the pedestrian, or a store, or a machine type communication (MTC) terminal) in the vicinity of the vehicle, by using a peer to peer (P2P) technology.

The dedicated communication I/F 7630 is a communication I/F that supports a communication protocol that is designed for use in a vehicle. For example, in the dedicated communication I/F 7630, a standard protocol, such as wireless access in vehicle environment (WAVE) that is defined by a combination of IEEE 802.11p as a lower layer and IEEE 1609 as an upper layer, dedicated short range communications (DSRC), or a cellular communication protocol, may be implemented. Typically, the dedicated communication I/F 7630 performs V2X communication that is a concept including at least one of vehicle-to-vehicle communication, vehicle-to-infrastructure communication, vehicle-to-home communication, and vehicle-to-pedestrian communication.

The positioning unit 7640 receives, for example, a GNSS signal (e.g., a GPS signal from a global positioning system (GPS) satellite) from a global navigation satellite system (GNSS) satellite, performs positioning, and generates position information including the latitude, longitude, and altitude of the vehicle. Note that the positioning unit 7640 may identify the current position by exchanging signals with a wireless access point, or may acquire the position information from a terminal such as a mobile phone, PHS, or a smartphone having a positioning function.

For example, the beacon receiving unit 7650 receives a radio wave or electromagnetic wave emitted from a radio station or the like installed on a road, and acquires information about the current position, traffic congestion, traffic regulation, required time, or the like. Note that the function of the beacon receiving unit 7650 may be included in the dedicated communication I/F 7630 described above.

The in-vehicle device I/F 7660 is a communication interface configured to mediate connection between the microcomputer 7610 and various in-vehicle devices 7760 in the vehicle. The in-vehicle device I/F 7660 may establish wireless connection by using a wireless communication protocol such as wireless LAN, Bluetooth (registered trademark), near field communication (NFC), or wireless USB (WUSB). Furthermore, the in-vehicle device I/F 7660 may establish wired connection such as a universal serial bus (USB), high-definition multimedia interface (HDMI) (registered trademark), mobile high-definition link (MHL), via a connection terminal which is not illustrated (and a cable, if necessary). The in-vehicle device 7760 may include, for example, at least one of a mobile device or a wearable device of the occupant, or an information device carried in or attached to the vehicle. Furthermore, the in-vehicle device 7760 may include a navigation device configured to search for a route to any destination. The in-vehicle device I/F 7660 exchanges control signals or data signals with these in-vehicle devices 7760.

The in-vehicle network I/F 7680 is an interface configured to mediate communication between the microcomputer 7610 and the communication network 7010. The in-vehicle network I/F 7680 transmits and receives signals and the like in accordance with a predetermined protocol supported by the communication network 7010.

The microcomputer 7610 of the integrated control unit 7600 controls the vehicle control system 7000 according to various programs, on the basis of information acquired via at least one of the general-purpose communication I/F 7620, the dedicated communication I/F 7630, the positioning unit 7640, the beacon receiving unit 7650, the in-vehicle device I/F 7660, and the in-vehicle network I/F 7680. For example, the microcomputer 7610 may calculate a control target value of the driving force generation device, the steering mechanism, or the braking device on the basis of the acquired information inside and outside of the vehicle, outputting a control command to the drive system control unit 7100. For example, the microcomputer 7610 may perform cooperative control to achieve the function of advanced driver assistance system (ADAS) including avoiding collision or mitigating impact of the vehicle, following based on a distance between vehicles, driving while maintaining vehicle speed, warning of collision of the vehicle, warning of lane departure of the vehicle, and the like. Furthermore, the microcomputer 7610 may perform cooperative control for the purpose of automated driving or the like that is autonomous driving without depending on the driver's operation by controlling the driving force generation device, the steering mechanism, the braking device, or the like, on the basis of the acquired information around the vehicle.

The microcomputer 7610 may generate three-dimensional distance information between the vehicle and an object such as surrounding structures or a person on the basis of information acquired via at least one of the general-purpose communication I/F 7620, the dedicated communication I/F 7630, the positioning unit 7640, the beacon receiving unit 7650, the in-vehicle device I/F 7660, and the in-vehicle network I/F 7680, creating local map information including surrounding information around the current position of the vehicle. Furthermore, the microcomputer 7610 may predict danger such as collision of the vehicle, approaching of the pedestrian or the like, or entrance into a blocked road, on the basis of the information acquired to generate a warning signal. The warning signal may be, for example, a signal for generating a warning sound or turning on a warning lamp.

The audio/visual output unit 7670 transmits an output signal of at least one of a sound or an image to an output device configured to visually or audibly notifying the occupant of the vehicle or the outside of the vehicle of information. In the example of FIG. 38, an audio speaker 7710, a display unit 7720, and an instrument panel 7730 are illustrated as the output device. The display unit 7720 may include, for example, at least one of an on-board display and a head-up display. The display unit 7720 may have an augmented reality (AR) display function. The output device may be another device other than the devices described above, for example, a wearable device such as a headphone or a spectacle type display worn by the occupant, a projector, or a lamp. In a case where the output device is a display device, the display device visually displays results obtained by various processing performed by the microcomputer 7610 or information received from another control unit, in various formats, such as text, image, table, and graph. Furthermore, in a case where the output device is a sound output device, the sound output device converts an audio signal including sound data, acoustic data, or the like reproduced, into an analog signal and aurally outputs the analog signal.

Note that, in the example illustrated in FIG. 38, at least two control units connected via the communication network 7010 may be integrated as one control unit. Alternatively, each control unit may include a plurality of control units. Furthermore, the vehicle control system 7000 may include another control unit which is not illustrated. Furthermore, in the above description, part or all of the function of any one of the control units may be provided to another control unit. In other words, as long as information is transmitted/received via the communication network 7010, any one of the control units may perform predetermined arithmetic processing. Likewise, a sensor or a device connected to any one of the control units may be connected to another control unit, and a plurality of control units may mutually transmit/receive detection information via the communication network 7010.

Note that a computer program for achieving each function of the electronic device 1 according to the present embodiment described with reference to FIG. 1 can be mounted in any one of the control units or the like. Furthermore, it is also possible to provide a computer-readable recording medium storing such a computer program. The recording medium is, for example, a magnetic disk, an optical disk, a magneto-optical disk, a flash memory, or the like. Furthermore, the computer program described above may be distributed, for example, via a network without using the recording medium.

In the vehicle control system 7000 described above, the electronic device 1 according to the present embodiment described with reference to FIG. 1 is applicable to the integrated control unit 7600 in the example of application illustrated in FIG. 38. For example, the storage unit 40 and the processor 50 of the electronic device 1 correspond to the microcomputer 7610, storage unit 7690, and in-vehicle network I/F 7680 of the integrated control unit 7600. However, the vehicle control system 7000 is not limited to the above description and may correspond to a host 80 in FIG. 1.

In addition, at least some of component elements of the electronic device 1 according to the present embodiment described with reference to FIG. 1 may be achieved in a module (e.g., an integrated circuit module including one die) for the integrated control unit 7600 illustrated in FIG. 38. Alternatively, the electronic device 1 according to the present embodiment described with reference to FIG. 1 may be achieved by a plurality of control units of the vehicle control system 7000 illustrated in FIG. 38.

11. Example of Application to Endoscopic Surgical System

Furthermore, the technology according to the present disclosure (the present technology) is applicable to various products. For example, the technology according to the present disclosure may be applied to an endoscopic surgical system.

Figure 40:
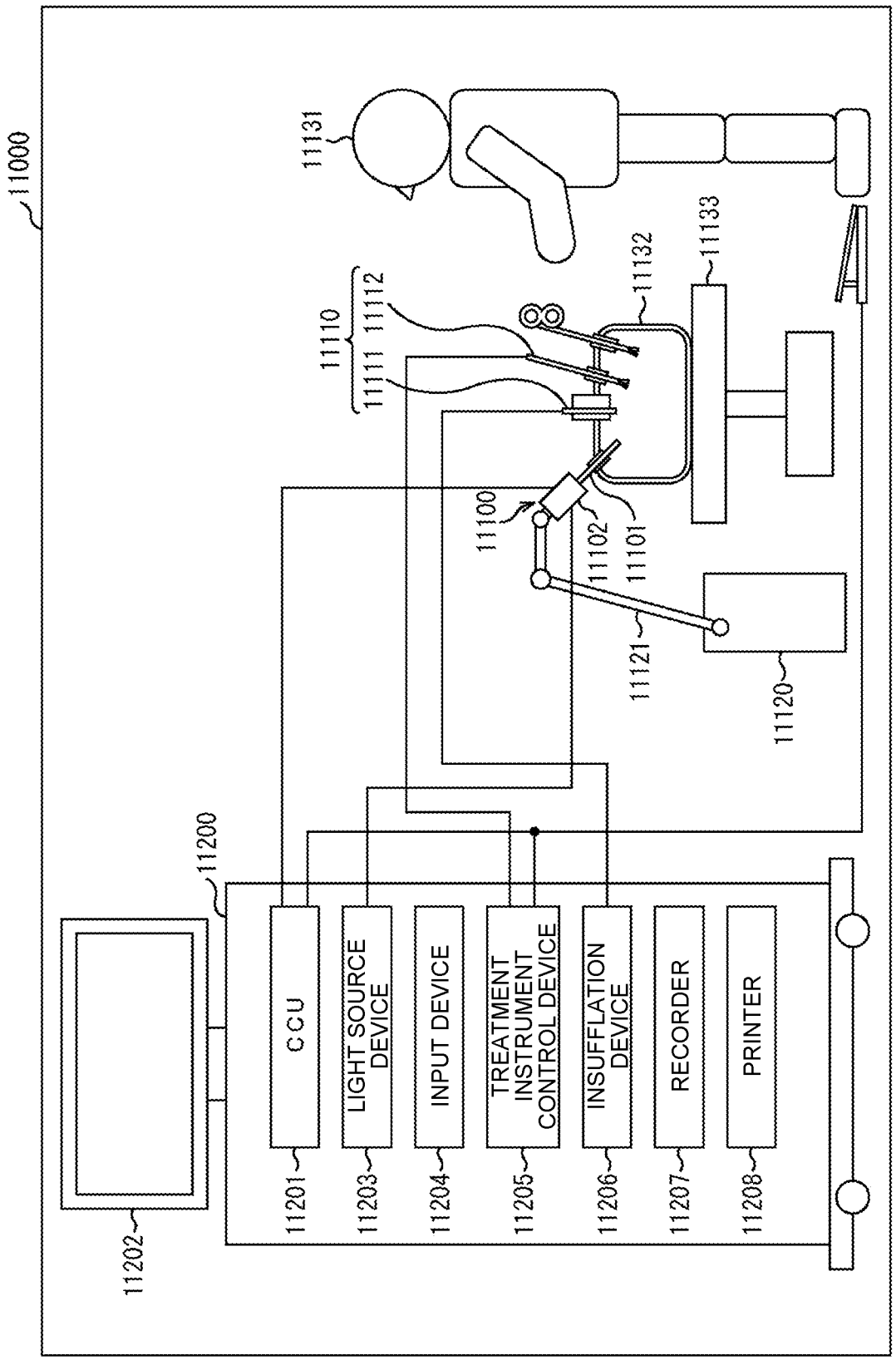
FIG. 40 is a diagram illustrating an example of a schematic configuration of an endoscopic surgical system.

FIG. 40 is a diagram illustrating an example of a schematic configuration of an endoscopic surgical system to which the technology according to the present disclosure (the present technology) can be applied.

FIG. 40 illustrates a state in which an operator (surgeon) 11131 is performing surgery on a patient 11132 lying on a patient's bed 11133 by using an endoscopic surgical system 11000. As illustrated in the drawing, the endoscopic surgical system 11000 includes an endoscope 11100, an other surgical instruments 11110 such as an insufflation tube 11111 and an energy treatment instrument 11112, a support arm device 11120 configured to support the endoscope 11100, and a cart 11200 on which various devices for endoscopic surgery are mounted.

The endoscope 11100 includes a lens barrel 11101 that has a region having a predetermined length from the distal end, the region being inserted into the body cavity of the patient 11132, and a camera head 11102 connected to the proximal end of the lens barrel 11101. In the example, the endoscope 11100 configured as a so-called rigid endoscope having the lens barrel 11101 that is rigid is illustrated, but the endoscope 11100 may be configured as a so-called flexible endoscope having a flexible lens barrel.

An opening portion into which an objective lens is fitted is provided at the distal end of the lens barrel 11101. A light source device 11203 is connected to the endoscope 11100, light generated by the light source device 11203 is guided to the distal end of the lens barrel 11101 by a light guide extending inside the lens barrel 11101, and the light is emitted toward an observation target in the body cavity of the patient 11132 via the objective lens. Note that the endoscope 11100 may be a forward-viewing endoscope, an oblique-viewing endoscope, or a side-viewing endoscope.

An optical system and an imaging element are provided inside the camera head 11102, and reflected light (observation light) from the observation target is focused on the imaging element by the optical system. The observation light is photoelectrically converted by the imaging element, and an electric signal corresponding to the observation light, that is, an image signal corresponding to the observation image is generated. The image signal is transmitted as RAW data to a camera control unit (CCU) 11201.

The CCU 11201 includes a central processing unit (CPU), a graphics processing unit (GPU), and the like, and integrally controls the operation of the endoscope 11100 and a display device 11202. Furthermore, the CCU 11201 receives the image signal from the camera head 11102, and performs various image processing, such as development processing (demosaic processing) for displaying an image based on the image signal, on the image signal.

The display device 11202 displays the image based on the image signal subjected to the image processing by the CCU 11201, in response to the control from the CCU 11201.

The light source device 11203 includes, for example, a light source such as a light emitting diode (LED) and supplies irradiation light for imaging a surgical site or the like to the endoscope 11100.

An input device 11204 is an input interface for the endoscopic surgical system 11000. The user is allowed to input various information and instructions to the endoscopic surgical system 11000 via the input device 11204. For example, the user inputs an instruction or the like to change conditions of imaging (type of irradiation light, magnification, focal length, etc.) by the endoscope 11100.

A treatment instrument control device 11205 controls drive of the energy treatment instrument 11112 for cauterization and incision of tissue, blood vessel sealing, or the like. An insufflation device 11206 feeds gas into the body cavity of the patient 11132 via the insufflation tube 11111 to inflate the body cavity, for the purpose of ensuring the field of view of the endoscope 11100 and ensuring a working space for the operator. A recorder 11207 is a device configured to record various information relating to surgery. A printer 11208 is a device configured to print the various information regarding surgery in various formats such as text, image, or graph.

Note that the light source device 11203 configured to supply the irradiation light for imaging the surgical site to the endoscope 11100 can include, for example, an LED, a laser light source, or a white light source including a combination thereof. The white light source including a combination of RGB laser light sources makes it possible to highly precisely control the output intensity and output timing of each color (each wavelength), and thereby the white balance of a captured image can be adjusted in the light source device 11203. Furthermore, in this configuration, irradiating the observation target with laser light beams from the RGB laser light sources in a time division manner and controlling the drive of the imaging element of the camera head 11102 in synchronization with the irradiation timing also make it possible to capture images corresponding to RGB in a time division manner. According to this method, a color image can be obtained without providing a color filter for the imaging element.

Furthermore, the driving of the light source device 11203 may be controlled so as to change the intensity of light to be output every predetermined time. The drive of the imaging element of the camera head 11102 is controlled in synchronization with the timing of change in the intensity of light, images are thereby acquired in a time division manner and combined, and thus, an image with high dynamic range can be generated without so-called underexposed and overexposed images.

Furthermore, the light source device 11203 may be configured to supply light in a predetermined wavelength band used for observation using special light. In the observation using special light, for example, so-called narrow band imaging is performed in which wavelength dependence of light absorption in body tissue is used in irradiation of light in a band narrower than that of irradiation light (i.e., white light) used in normal observation, and thereby a predetermined tissue such as blood vessel in mucosal surface is captured with high contrast. Alternatively, in the observation using special light, fluorescence observation for obtaining an image of fluorescence generated by irradiation with excitation light may be performed. In the fluorescence observation, it is possible, for example, to irradiate a body tissue with excitation light to observe fluorescence from the body tissue (auto-fluorescence imaging), or to locally inject a reagent such as indocyanine green (ICG) into the body tissue and irradiate the body tissue with excitation light used for the fluorescence wavelength of the reagent to obtain a fluorescent image. The light source device 11203 is configured to supply light in a narrow band and/or excitation light, which is used for such observation using special light.

Figure 41:
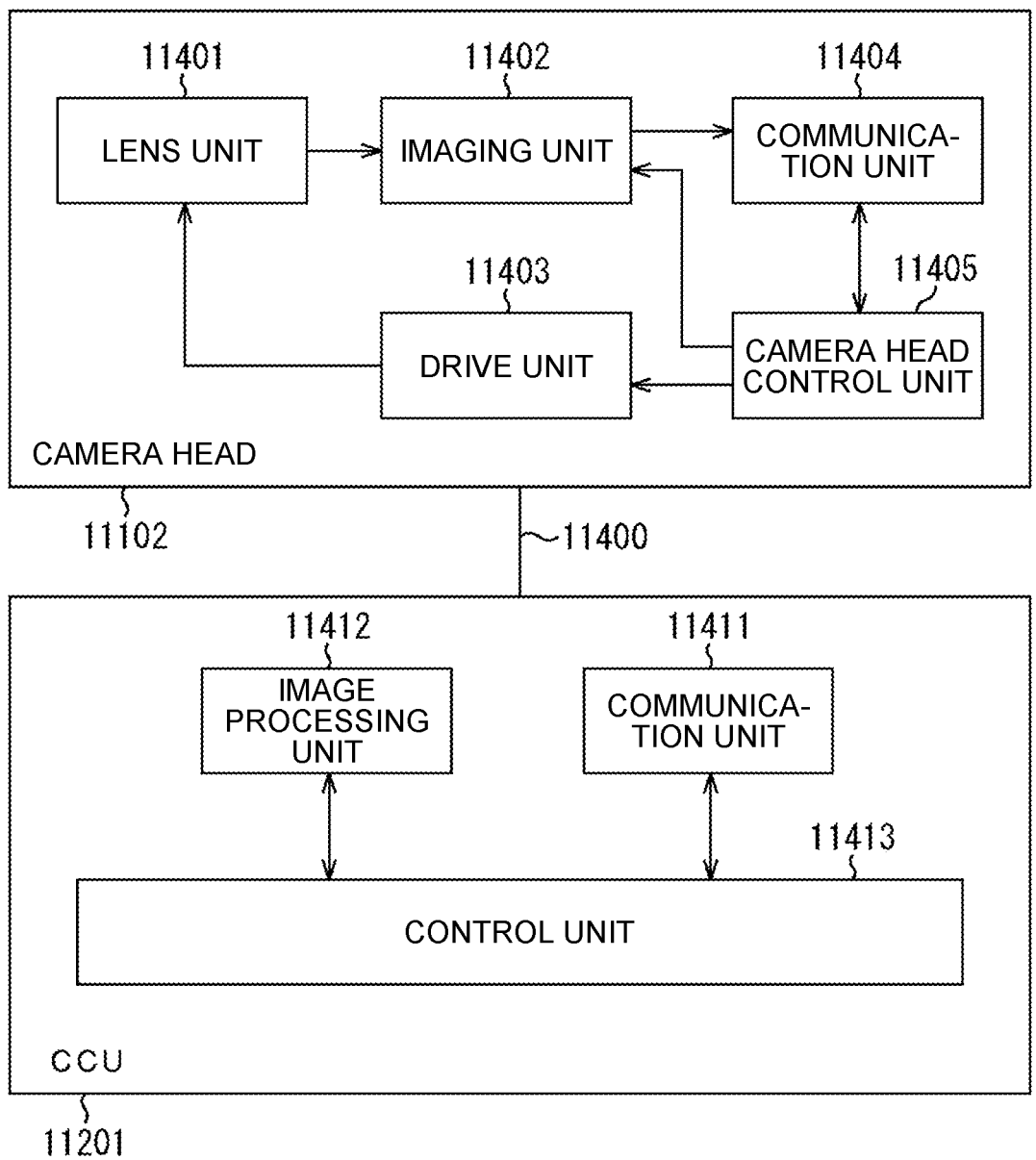
FIG. 41 is a block diagram illustrating an example of a functional configuration of a camera head and a CCU.

FIG. 41 is a block diagram illustrating an example of a functional configuration of the camera head 11102 and the CCU 11201 that are illustrated in FIG. 40.

The camera head 11102 has a lens unit 11401, an imaging unit 11402, a drive unit 11403, a communication unit 11404, and a camera head control unit 11405. The CCU 11201 has a communication unit 11411, an image processing unit 11412, and a control unit 11413. The camera head 11102 and the CCU 11201 are communicably connected to each other by a transmission cable 11400.

The lens unit 11401 is an optical system provided at a connection portion with the lens barrel 11101. The observation light captured from the distal end of the lens barrel 11101 is guided to the camera head 11102 and incident on the lens unit 11401. The lens unit 11401 is configured by combining a plurality of lenses including a zoom lens and a focusing lens.

The imaging unit 11402 includes the imaging element. One imaging element (so-called single imaging element) or a plurality of imaging elements (so-called multiple imaging elements) may be employed to constitute the imaging unit 11402. In a case where the imaging unit 11402 uses the multiple imaging elements, for example, the image signals may be generated corresponding to RGB by the respective imaging elements so that a color image may be obtained by combining the image signals. Alternatively, the imaging unit 11402 may have a pair of imaging elements to acquire the image signals for the right eye and the left eye corresponding to three-dimensional (3D) display. Performing the 3D display makes it possible for the operator 11131 to more accurately grasp the depth of biological tissue in the surgical site. Note that, in a case where the imaging unit 11402 uses the multiple imaging elements, a plurality of lens units 11401 can be provided corresponding to the imaging elements as well.

Furthermore, the imaging unit 11402 may not be necessarily provided in the camera head 11102. For example, the imaging unit 11402 may be provided in the lens barrel 11101, immediately next to the objective lens.

The drive unit 11403 includes an actuator and moves the zoom lens and the focusing lens of the lens unit 11401 by a predetermined distance along an optical axis, by the control from the camera head control unit 11405. Therefore, the magnification and focal point of the captured image captured by the imaging unit 11402 can be appropriately adjusted.

The communication unit 11404 includes a communication device for transmitting and receiving various information to and from the CCU 11201. The communication unit 11404 transmits the image signal obtained from the imaging unit 11402 as RAW data to the CCU 11201 via the transmission cable 11400.

Furthermore, the communication unit 11404 receives a control signal for controlling the drive of the camera head 11102 from the CCU 11201, and supplies the control signal to the camera head control unit 11405. The control signal includes, for example, information about imaging conditions, such as information specifying a frame rate of the captured image, information specifying an exposure value in imaging, and/or information specifying the magnification and focal point of the captured image.

Note that the imaging conditions such as the frame rate, the exposure value, the magnification, and the focal point may be appropriately specified by the user, or may be automatically set by the control unit 11413 of the CCU 11201 on the basis of the acquired image signal. In the latter case, the endoscope 11100 has a so-called auto exposure (AE) function, auto focus (AF) function, and auto white balance (AWB) function.

The camera head control unit 11405 controls the drive of the camera head 11102 on the basis of the control signal received from the CCU 11201 via the communication unit 11404.

The communication unit 11411 includes a communication device for transmitting and receiving various information to and from the camera head 11102. The communication unit 11411 receives the image signal transmitted from the camera head 11102 via the transmission cable 11400.

Furthermore, the communication unit 11411 transmits the control signal for controlling the drive of the camera head 11102 to the camera head 11102. The image signal and the control signal are configured to be transmitted by electric communication, optical communication, or the like.

The image processing unit 11412 performs various image processing on the image signal as the RAW data transmitted from the camera head 11102.

The control unit 11413 performs various control relating to imaging of the surgical site or the like by the endoscope 11100 and display of the captured image obtained by imaging the surgical site or the like. For example, the control unit 11413 generates the control signal for controlling the drive of the camera head 11102.

Furthermore, the control unit 11413 causes the display device 11202 to display the captured image showing the surgical site or the like, on the basis of the image signal subjected to the image processing by the image processing unit 11412. At this time, the control unit 11413 may recognize various objects in the captured image by using various image recognition technologies. For example, the control unit 11413 is configured to detect the edge shape, the color, or the like of each of the objects in the captured image to recognize a surgical instrument such as forceps, a specific biological portion, bleeding, mist generated in using the energy treatment instrument 11112, or the like. When causing the display device 11202 to display the captured image, the control unit 11413 may cause the display device 11202 to superimpose and display various surgery support information on the image of the surgical site by using a result of the recognition. Superimposing and displaying of the surgery support information for presentation to the operator 11131 makes it possible to reduce a burden on the operator 11131 or ensure surgery by the operator 11131.

The transmission cable 11400 connecting the camera head 11102 and the CCU 11201 is an electric signal cable compatible with the electric signal communication, an optical fiber compatible with optical communication, or a composite cable thereof.

Here, in the example, communication performed in a wired manner by using the transmission cable 11400 is illustrated, but communication between the camera head 11102 and the CCU 11201 may be performed in a wireless manner.

The example of the endoscopic surgical system to which the technology according to the present disclosure is applicable has been described. The technology according to the present disclosure is applicable to, for example, the endoscope 11100, the imaging unit 11402 of the camera head 11102, and the like of the configurations described above. Application of the technology according to the present disclosure to the imaging unit 11402 and the like makes it possible to acquire the image data having high luminance while suppressing the decrease in resolution.

Note that, here, the example of the endoscopic surgical system has been described, but the technology according to the present disclosure may be further applied to, for example, a microscopic surgery system or the like.

The embodiments of the present disclosure have been described above, but the technical scope of the present disclosure is not limited to the embodiments described above, and various modifications and alterations can be made without departing from the spirit and scope of the present disclosure. Moreover, the component elements of different embodiments and modifications may be suitably combined with each other.

Furthermore, the effects of the embodiments in the description are merely examples and are not intended to restrict the present disclosure, and other effects may be provided.

Note that the present technology may also employ the following configurations.

(1)

A solid-state imaging device comprising:
 a first semiconductor substrate that includes a grid-shaped first trench provided in a first surface, and a second trench provided along a bottom of the first trench; and
 a plurality of photoelectric conversion elements that is provided in the first semiconductor substrate,
 wherein each of the photoelectric conversion elements includes:
 a photoelectric conversion region that is provided in an element region defined by the first trench and the second trench in the first semiconductor substrate, and is configured to photoelectrically convert incident light to generate charges;
 a first semiconductor region that surrounds the photoelectric conversion region in the element region;
 a first contact that makes contact with the first semiconductor region at the bottom of the first trench;
 a first electrode that makes contact with the first contact in the first trench;
 a second semiconductor region that is provided in a region of the element region making contact with the first semiconductor region, and has a first conductivity type the same as the first semiconductor region;
 a third semiconductor region that is a region making contact with the second semiconductor region in the element region, is provided between the second semiconductor region and the first surface, and has a second conductivity type opposite to that of the first conductivity type;
 a second contact that is provided on the first surface so as to make contact with the third semiconductor region; and
 a second electrode that makes contact with the second contact, and
 a height of the first contact from the first surface is different from a height of the third semiconductor region from the first surface.

(2)

The solid-state imaging device according to (1), wherein the height of the first contact from the first surface is larger than the height of the third semiconductor region from the first surface.

(3)

The solid-state imaging device according to (1) or (2), wherein the first contact and the first electrode form an ohmic contact.

(4) The solid-state imaging device according to (3), further comprising a silicide layer that is provided at a portion where the first contact and the first electrode make contact.

(5)

The solid-state imaging device according to any one of (1) to (4), wherein the first contact makes contact with the first semiconductor region so as to surround an outer periphery of the first semiconductor region.

(6)

The solid-state imaging device according to any one of (1) to (4), wherein the first contact makes contact with the first semiconductor region on pat of an outer periphery of the first semiconductor region.

(7)

The solid-state imaging device according to any one of (1) to (6), further comprising a light-shielding film that is provided in the second trench.

(8)

The solid-state imaging device according to (7), wherein the light-shielding film is made of the same material as the first electrode.

(9)

The solid-state imaging device according to (7), wherein the light-shielding film makes in contact with the first semiconductor region.

(10)

The solid-state imaging device according to (7) or (8), further comprising an insulating film that is provided between the light-shielding film and the first semiconductor region.

(11)

The solid-state imaging device according to any one of (7) to (10), wherein
 the second trench reaches a second surface of the first semiconductor substrate opposite to the first surface, from a bottom surface of the first trench, and
 the light-shielding film reaches the second surface of the first semiconductor substrate from the bottom surface of the first trench.

(12)

The solid-state imaging device according to any one of (7) to (10), in which
 the second trench is provided from the bottom of the first trench toward a second surface of the first semiconductor substrate on a side opposite to the first surface, and a bottom of the second trench and the second surface are separated from each other.

(13)

The solid-state imaging device according to (12), further including
  a third contact that is provided at the bottom of the second trench and is configured to make contact with the first semiconductor region, on the second surface side of the first semiconductor substrate,
  in which the light-shielding film makes contact with the third contact at the bottom of the second trench.

(14)

The solid-state imaging device according to any one of (7) to (10), in which
  the second trench is provided from a second surface of the first semiconductor substrate on a side opposite to the first surface, toward the bottom of the first trench, and
  a bottom of the second trench and the bottom of the first trench are separated from each other.

(15)

The solid-state imaging device according to any one of (1) to (14), further comprising a plurality of wirings that is connected to the first electrodes of the plurality of photoelectric conversion elements in a one-to-one manner.

(16)

The solid-state imaging device according to any one of (1) to (14), further comprising wirings that are connected to the first electrodes of some photoelectric conversion elements of the plurality of photoelectric conversion elements.

(17)

The solid-state imaging device according to any one of (1) to (14), further comprising a wiring that is connected to the first electrode of a photoelectric conversion element located at an outermost periphery of the plurality of photoelectric conversion elements.

(18)

The solid-state imaging device according to any one of (1) to (17), further comprising an on-chip lens that is provided for each of the element regions, on a second surface side of the first semiconductor substrate opposite to the first surface, and is configured to focus incident light on the photoelectric conversion region.

(19)

The solid-state imaging device according to any one of (1) to (18), further comprising a color filter that is provided for each of the element regions, on a second surface side of the first semiconductor substrate opposite to the first surface, and is configured to transmit a specific wavelength.

(20)

The solid-state imaging device according to any one of (1) to (18), further including
  a color filter that is provided on a second surface side of the first semiconductor substrate opposite to the first surface and is configured to transmit a specific wavelength,
  in which the color filter is shared between two or more of the element regions, and
  the second trench is provided between element regions not sharing the color filter.

(21)

The solid-state imaging device according to (20), further including an insulating film that fills an inside of a third trench provided between the element regions not sharing the color filter.

(22)

The solid-state imaging device according to (7), further including
  a color filter that is provided for each of the element regions, on a second surface side of the first semiconductor substrate opposite to the first surface, and is configured to transmit a specific wavelength,
  in which the light-shielding film penetrates the color filter.

(23)

The solid-state imaging device according to any one of (1) to (22), further comprising a readout circuit that is connected to the second electrode of each of the photoelectric conversion elements, and is configured to read a charge generated in each of the photoelectric conversion elements.

(24)

The solid-state imaging device according to (23), wherein, the readout circuit is provided in a second semiconductor substrate different from the first semiconductor substrate, and
  the first semiconductor substrate and the second semiconductor substrate are bonded to each other.

(25)

An electronic device comprising:
  a solid-state imaging device;
  an optical system that is configured to focus incident light on a light-receiving surface of the solid-state imaging device; and
  a processor that is configured to control the solid-state imaging device,
  wherein the solid-state imaging device includes:
  a first semiconductor substrate that includes a grid-shaped first trench provided in a first surface, and a second trench provided along a bottom of the first trench; and
  a plurality of photoelectric conversion elements that is provided in the first semiconductor substrate,
  each of the photoelectric conversion elements includes:
  a photoelectric conversion region that is provided in an element region defined by the first trench and the second trench in the first semiconductor substrate, and is configured to photoelectrically convert incident light to generate charges;
  a first semiconductor region that surrounds the photoelectric conversion region in the element region;
  a first contact that makes contact with the first semiconductor region at the bottom of the first trench;
  a first electrode that makes contact with the first contact in the first trench;
  a second semiconductor region that is provided in a region of the element region making contact with the first semiconductor region, and has a first conductivity type the same as the first semiconductor region;
  a third semiconductor region that is a region making contact with the second semiconductor region in the element region, is provided between the second semiconductor region and the first surface, and has a second conductivity type opposite to that of the first conductivity type;
  a second contact that is provided on the first surface so as to make contact with the third semiconductor region; and
  a second electrode that makes contact with the second contact, and
  a height of the first contact from the first surface is different from a height of the third semiconductor region from the first surface.

REFERENCE SIGNS LIST

1 ELECTRONIC DEVICE
10 SOLID-STATE IMAGING DEVICE
11 SPAD ARRAY UNIT
12 DRIVE CIRCUIT
13 OUTPUT CIRCUIT
15 TIMING CONTROL CIRCUIT
20a, 20b, 20c, 20d, 220, 20B, 20G, 20R, 620B, 620G, 620R SPAD PIXEL
21 PHOTODIODE
22 READOUT CIRCUIT
23 QUENCHING RESISTOR
24 SELECT TRANSISTOR
25 DIGITAL CONVERTER
251 RESISTOR
26 INVERTER
27 BUFFER
30 IMAGING LENS
40 STORAGE UNIT
50 PROCESSOR
60 COLOR FILTER ARRAY
61 UNIT PATTERN
71 LIGHT-RECEIVING CHIP
72 CIRCUIT CHIP
101, 141 SEMICONDUCTOR SUBSTRATE
102 PHOTOELECTRIC CONVERSION REGION
103 N-TYPE SEMICONDUCTOR REGION
104, 104a P-TYPE SEMICONDUCTOR REGION
105, 105A P+TYPE SEMICONDUCTOR REGION
106, 106A N+TYPE SEMICONDUCTOR REGION
107 CATHODE CONTACT
108, 108A, 408, 508 ANODE CONTACT
109, 109A, 109B, 109D INSULATING FILM
110, 310, 510 ELEMENT ISOLATION PORTION
111, 311, 511 LIGHT-SHIELDING FILM
112, 312, 512, 710 INSULATING FILM
113 PINNING LAYER
114 PLANARIZATION FILM
115, 115R, 115G, 115B COLOR FILTER
116 ON-CHIP LENS
120, 130 WIRING LAYER
121 CATHODE ELECTRODE
122 ANODE ELECTRODE
123, 131 INTERLAYER DIELECTRIC
124, 132 WIRING
125, 135 CONNECTION PAD
142 CIRCUIT ELEMENT
252, 262 NMOS TRANSISTOR
261 PMOS TRANSISTOR
A1, A2, A3 OPENING
LD PIXEL DRIVE LINE
LS OUTPUT SIGNAL LINE
M1, M2, M3, M4 MASK
T1 FIRST TRENCH
T2 SECOND TRENCH
T3, T4, T5, T11 TRENCH

What is claimed is:

1. A light detecting device, comprising:
a first semiconductor substrate, wherein the first semiconductor substrate includes a first surface and a second surface opposite the first surface;
a plurality of photoelectric conversion elements, wherein each photoelectric conversion element of the plurality of photoelectric conversion elements includes a photoelectric conversion region disposed in the first semiconductor substrate;
a plurality of element isolation portions, wherein the element isolation portions are disposed in a grid-shaped first trench penetrating the first semiconductor substrate from a first surface of the first semiconductor substrate, wherein the element isolation portions define a plurality of element regions, and wherein each photoelectric conversion element is disposed in a corresponding one of the element regions; and
a plurality of first contacts,
wherein more than one first contact of the plurality of first contacts are disposed in each of the element regions,
wherein each of the photoelectric conversion elements includes a second contact, and,
wherein, for each of the photoelectric conversion elements, the plurality of first contacts are at a first distance from the second surface of the first semiconductor substrate and the second contact is at a second distance from the second surface of the first semiconductor substrate.

2. The light detecting device of claim 1, further comprising:
a plurality of first electrodes, wherein each of the first contacts is in contact with one of the first electrodes.

3. The light detecting device of claim 1, wherein each element isolation region includes four first contacts.

4. The light detecting device of claim 1, wherein each element isolation region is square, and wherein one first contact is disposed in each corner of each element isolation region.

5. The light detecting device of claim 1, wherein the element isolation portions include an insulating film covering side surfaces of the first trench and a light shielding film.

6. The light detecting device of claim 5, wherein the light shielding film is one of tungsten, aluminum, an aluminum alloy, or copper.

7. The light detecting device of claim 5, wherein the light shielding film and the first contacts are made of a same conductive material.

8. The light detecting device of claim 2, wherein each of the photoelectric conversion elements further includes:
a first semiconductor region that surrounds the photoelectric conversion region;
a second semiconductor region that is provided in a region of the photoelectric conversion region making contact with the first semiconductor region, wherein the second semiconductor region has a same conductivity type as a conductivity type of the first semiconductor region; and
a third semiconductor region that makes contact with the second semiconductor region, is provided between the second semiconductor region and the first surface, and has a second conductivity type that is opposite the first conductivity type.

9. The light detecting device of claim 1, further comprising:
a plurality of on-chip lenses, wherein one on-chip lens in the plurality of on-chip lenses is provided from each element region.

10. A light detecting device, comprising:
a first semiconductor substrate, wherein the first semiconductor substrate includes a first surface and a second surface opposite the first surface;
a plurality of photoelectric conversion elements, wherein each photoelectric conversion element of the plurality of photoelectric conversion elements includes a photoelectric conversion region disposed in the first semiconductor substrate;

a plurality of element isolation portions, wherein the element isolation portions are disposed in a grid-shaped first trench penetrating the first semiconductor substrate from a first surface of the first semiconductor substrate, wherein the element isolation portions define a plurality of element regions, and wherein each photoelectric conversion element is disposed in a corresponding one of the element regions; and a plurality of first contacts, wherein more than one first contact of the plurality of first contacts are disposed in each of the element regions, wherein each element isolation region is square, wherein one first contact is disposed in each corner of each element isolation region, and wherein first contacts in a first element isolation region are electrically connected to first contacts in a second element isolation region.

11. The light detecting device of claim 10, wherein each of the photoelectric conversion elements includes:

a second contact.

12. The light detecting device of claim 11, wherein, for each of the photoelectric conversion elements, the plurality of first contacts are at a first distance from the second surface of the first semiconductor substrate and the second contact is at a second distance from the second surface of the first semiconductor substrate.

13. The light detecting device of claim 12, wherein the first distance is less than the second distance.

14. The light detecting device of claim 10, further comprising:

a wiring, wherein the wiring is electrically connected to at least some of the first contacts.

15. A light detecting device, comprising:

a first semiconductor substrate, wherein the first semiconductor substrate includes a first surface and a second surface opposite the first surface;

a plurality of photoelectric conversion elements, wherein each photoelectric conversion element of the plurality of photoelectric conversion elements includes a photoelectric conversion region disposed in the first semiconductor substrate;

a plurality of element isolation portions, wherein the element isolation portions are disposed in a grid-shaped first trench penetrating the first semiconductor substrate from a first surface of the first semiconductor substrate, wherein the element isolation portions define a plurality of element regions, and wherein each photoelectric conversion element is disposed in a corresponding one of the element regions; and a plurality of first contacts, wherein more than one first contact of the plurality of first contacts are disposed in each of the element regions, wherein the element isolation portions include an insulating film covering side surfaces of the first trench and a light shielding film, and wherein the light shielding film is in contact with the first contacts.

16. The light detecting device of claim 15, wherein each first contact in any one of the element regions is electrically connected to every other first contact in that one element region.

17. The light detecting device of claim 15, wherein each first contact in the light detecting device is electrically connected to every other first contact in the light detecting device.

18. The light detecting device of claim 15, wherein each of the photoelectric conversion elements includes a second contact.

19. The light detecting device of claim 18, wherein, for each of the photoelectric conversion elements, the plurality of first contacts are at a first distance from the second surface of the first semiconductor substrate and the second contact is at a second distance from the second surface of the first semiconductor substrate.

20. The light detecting device of claim 19, wherein the first distance is less than the second distance.

* * * * *